United States Patent
Arizono

(10) Patent No.: US 12,229,005 B2
(45) Date of Patent: Feb. 18, 2025

(54) MEMORY SYSTEM AND NONVOLATILE MEMORY

(71) Applicant: Kioxia Corporation, Tokyo (JP)

(72) Inventor: Daisuke Arizono, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 18/463,535

(22) Filed: Sep. 8, 2023

(65) Prior Publication Data

US 2024/0320089 A1 Sep. 26, 2024

(30) Foreign Application Priority Data

Mar. 14, 2023 (JP) ................. 2023-039895

(51) Int. Cl.
  *G06F 11/10* (2006.01)
  *H03M 13/45* (2006.01)
(52) U.S. Cl.
  CPC ......... *G06F 11/1044* (2013.01); *H03M 13/45* (2013.01)
(58) Field of Classification Search
  CPC .................. G06F 11/1044; H03M 13/45
  See application file for complete search history.

(56) References Cited

U.S. PATENT DOCUMENTS

| | | | | |
|---|---|---|---|---|
| 9,214,965 B2 * | 12/2015 | Fitzpatrick | ......... | G06F 11/1012 |
| 9,318,194 B1 * | 4/2016 | Siau | ......... | G11C 16/28 |
| 9,946,468 B2 * | 4/2018 | Conley | ......... | G06F 11/1012 |
| 2013/0077400 A1 * | 3/2013 | Sakurada | ......... | G11C 16/06 |
| | | | | 365/185.03 |
| 2013/0135927 A1 * | 5/2013 | Jeon | ......... | G11C 11/5642 |
| | | | | 365/185.03 |
| 2017/0046220 A1 | 2/2017 | Sharon et al. | | |
| 2018/0253353 A1 * | 9/2018 | Takase | ......... | H03M 13/2906 |
| 2019/0294367 A1 | 9/2019 | Takada et al. | | |
| 2020/0090761 A1 | 3/2020 | Ando et al. | | |

(Continued)

FOREIGN PATENT DOCUMENTS

| JP | 2019164865 A | 9/2019 |
|---|---|---|
| JP | 2020047312 A | 3/2020 |
| JP | 2023078545 A | 6/2023 |

OTHER PUBLICATIONS

Y. Li, G. Han, C. Liu, M. Zhang and F. Wu, "Exploiting the Single-Symbol LLR Variation to Accelerate LDPC Decoding for 3-D nand Flash Memory," in IEEE Transactions on Computer-Aided Design of Integrated Circuits and Systems, vol. 42, No. 12, pp. 5146-5150, Dec. 2023 (Year: 2023).*

*Primary Examiner* — Cynthia Britt
(74) *Attorney, Agent, or Firm* — Maier & Maier, PLLC

(57) ABSTRACT

According to one embodiment, a memory system includes a nonvolatile memory that includes memory cells. The nonvolatile memory outputs, to a memory controller, first hard bit data of the first bit, second hard bit data of the second bit, third hard bit data of the third bit, and fourth soft bit data related to the first bit, the second bit, and the third bit, in response to a first command set. The nonvolatile memory outputs, to the memory controller, the first hard bit data, the second hard bit data, the third hard bit data, first soft bit data related to the first bit, second soft bit data related to the second bit, and third soft bit data related to the third bit, in response to a second command set.

15 Claims, 35 Drawing Sheets

(56) References Cited

U.S. PATENT DOCUMENTS

2023/0096401 A1* 3/2023 Kiyooka ................ G11C 29/52
714/758
2023/0170004 A1 6/2023 Azuma et al.

* cited by examiner

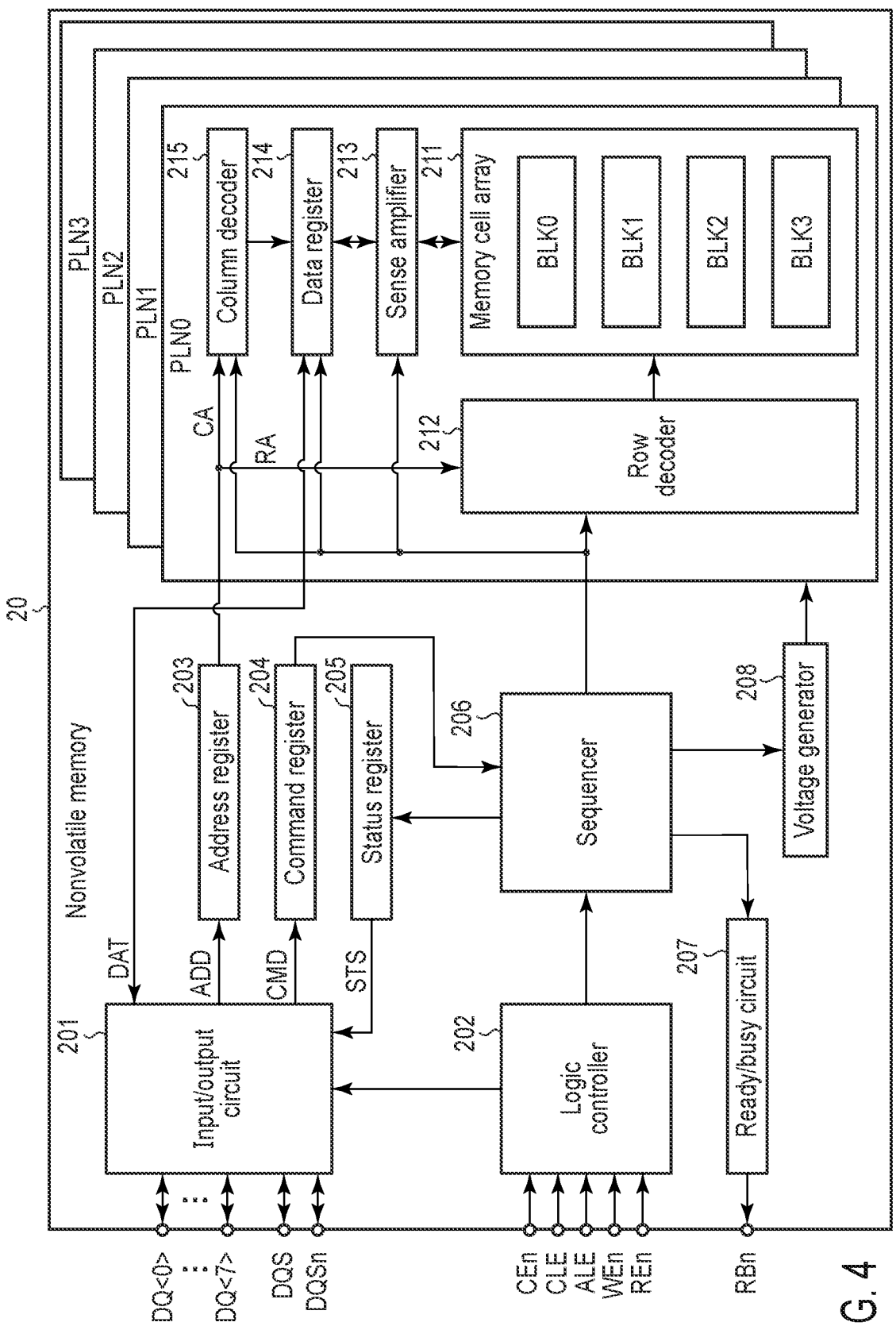
F I G. 4

(a) BDL=1, CDL=1

| Step | Operation | BDL | CDL | SEN | LBUS | SDL |
|---|---|---|---|---|---|---|
| 0 | SEN=1(pre-charge) | 1 | 1 | 1 | — | — |
| 1 | BDL → LBUS | 1 | 1 | 1 | 1 | — |
| 2 | LBUS → /SEN | 1 | 1 | 0 | 1 | — |
| 3 | CDL → LBUS | 1 | 1 | 0 | 1 | — |
| 4 | CDL drive stop | 1 | 1 | 0 | 1 | — |
| 5 | SEN=1 → LBUS=0 | 1 | 1 | 0 | 1 | — |
| 6 | LBUS → SDL | 1 | 1 | 0 | 1 | 1 |

(b) BDL=1, CDL=0

| Step | Operation | BDL | CDL | SEN | LBUS | SDL |
|---|---|---|---|---|---|---|
| 0 | SEN=1(pre-charge) | 1 | 0 | 1 | — | — |
| 1 | BDL → LBUS | 1 | 0 | 1 | 1 | — |
| 2 | LBUS → /SEN | 1 | 0 | 0 | 1 | — |
| 3 | CDL → LBUS | 1 | 0 | 0 | 0 | — |
| 4 | CDL drive stop | 1 | 0 | 0 | 0 | — |
| 5 | SEN=1 → LBUS=0 | 1 | 0 | 0 | 0 | — |
| 6 | LBUS → SDL | 1 | 0 | 0 | 0 | 0 |

(c) BDL=0, CDL=1

| Step | Operation | BDL | CDL | SEN | LBUS | SDL |
|---|---|---|---|---|---|---|
| 0 | SEN=1(pre-charge) | 0 | 1 | 1 | — | — |
| 1 | BDL → LBUS | 0 | 1 | 1 | 0 | — |
| 2 | LBUS → /SEN | 0 | 1 | 1 | 0 | — |
| 3 | CDL → LBUS | 0 | 1 | 1 | 1 | — |
| 4 | CDL drive stop | 0 | 1 | 1 | 1 | — |
| 5 | SEN=1 → LBUS=0 | 0 | 1 | 1 | 0 | — |
| 6 | LBUS → SDL | 0 | 1 | 1 | 0 | 0 |

(d) BDL=0, CDL=0

| Step | Operation | BDL | CDL | SEN | LBUS | SDL |
|---|---|---|---|---|---|---|
| 0 | SEN=1(pre-charge) | 0 | 0 | 1 | — | — |
| 1 | BDL → LBUS | 0 | 0 | 1 | 0 | — |
| 2 | LBUS → /SEN | 0 | 0 | 1 | 0 | — |
| 3 | CDL → LBUS | 0 | 0 | 1 | 0 | — |
| 4 | CDL drive stop | 0 | 0 | 1 | 0 | — |
| 5 | SEN=1 → LBUS=0 | 0 | 0 | 1 | 0 | — |
| 6 | LBUS → SDL | 0 | 0 | 1 | 0 | 0 |

FIG. 8

(a) BDL=1, CDL=1

| Step | Operation | BDL | CDL | SEN | LBUS | SDL |
|---|---|---|---|---|---|---|
| 0 | SEN=1(pre-charge) | 1 | 1 | 1 | — | — |
| 1 | BDL → /LBUS | 1 | 1 | 1 | 0 | — |
| 2 | LBUS → /SEN | 1 | 1 | 1 | 0 | — |
| 3 | CDL → /LBUS | 1 | 1 | 1 | 0 | — |
| 4 | CDL drive stop | 1 | 1 | 1 | 0 | — |
| 5 | SEN=1 → LBUS=0 | 1 | 1 | 1 | 0 | — |
| 6 | LBUS → /SDL | 1 | 1 | 1 | 0 | 1 |

(b) BDL=1, CDL=0

| Step | Operation | BDL | CDL | SEN | LBUS | SDL |
|---|---|---|---|---|---|---|
| 0 | SEN=1(pre-charge) | 1 | 0 | 1 | — | — |
| 1 | BDL → /LBUS | 1 | 0 | 1 | 0 | — |
| 2 | LBUS → /SEN | 1 | 0 | 1 | 0 | — |
| 3 | CDL → /LBUS | 1 | 0 | 1 | 1 | — |
| 4 | CDL drive stop | 1 | 0 | 1 | 1 | — |
| 5 | SEN=1 → LBUS=0 | 1 | 0 | 1 | 0 | — |
| 6 | LBUS → /SDL | 1 | 0 | 0 | 0 | 1 |

(c) BDL=0, CDL=1

| Step | Operation | BDL | CDL | SEN | LBUS | SDL |
|---|---|---|---|---|---|---|
| 0 | SEN=1(pre-charge) | 0 | 1 | 1 | — | — |
| 1 | BDL → /LBUS | 0 | 1 | 1 | 1 | — |
| 2 | LBUS → /SEN | 0 | 1 | 0 | 1 | — |
| 3 | CDL → /LBUS | 0 | 1 | 0 | 0 | — |
| 4 | CDL drive stop | 0 | 1 | 0 | 0 | — |
| 5 | SEN=1 → LBUS=0 | 0 | 1 | 0 | 0 | — |
| 6 | LBUS → /SDL | 0 | 1 | 0 | 0 | 1 |

(d) BDL=0, CDL=0

| Step | Operation | BDL | CDL | SEN | LBUS | SDL |
|---|---|---|---|---|---|---|
| 0 | SEN=1(pre-charge) | 0 | 0 | 1 | — | — |
| 1 | BDL → /LBUS | 0 | 0 | 1 | 1 | — |
| 2 | LBUS → /SEN | 0 | 0 | 0 | 1 | — |
| 3 | CDL → /LBUS | 0 | 0 | 0 | 1 | — |
| 4 | CDL drive stop | 0 | 0 | 0 | 1 | — |
| 5 | SEN=1 → LBUS=0 | 0 | 0 | 0 | 1 | — |
| 6 | LBUS → /SDL | 0 | 0 | 0 | 1 | 0 |

F I G. 9

(a) BDL=1, CDL=1

| Step | Operation | BDL | CDL | SEN | SDL |
|---|---|---|---|---|---|
| 0 | SEN=1(pre-charge) | 1 | 1 | 1 | — |
| 1 | SEN=BDL&SEN | 1 | 1 | 1 | — |
| 2 | SDL=/CDL | 1 | 1 | 1 | 0 |
| 3 | /SDL=/SDL\|SEN (SDL=SDL&/SEN) | 1 | 1 | 1 | 0 |
| 4 | SEN=CDL&SEN | 1 | 1 | 1 | 0 |
| 5 | SDL=SDL\|SEN | 1 | 1 | 1 | 1 |
| 6 | SDL=/SDL | 1 | 1 | 1 | 0 |

(b) BDL=1, CDL=0

| Step | Operation | BDL | CDL | SEN | SDL |
|---|---|---|---|---|---|
| 0 | SEN=1(pre-charge) | 1 | 0 | 1 | — |
| 1 | SEN=BDL&SEN | 1 | 0 | 1 | — |
| 2 | SDL=/CDL | 1 | 0 | 1 | 1 |
| 3 | /SDL=/SDL\|SEN (SDL=SDL&/SEN) | 1 | 0 | 1 | 0 |
| 4 | SEN=CDL&SEN | 1 | 0 | 0 | 0 |
| 5 | SDL=SDL\|SEN | 1 | 0 | 0 | 0 |
| 6 | SDL=/SDL | 1 | 0 | 0 | 1 |

FIG. 10

(c) BDL=0, CDL=1

| Step | Operation | BDL | CDL | SEN | SDL |
|---|---|---|---|---|---|
| 0 | SEN=1(pre-charge) | 0 | 1 | 1 | — |
| 1 | SEN=BDL&SEN | 0 | 1 | 0 | — |
| 2 | SDL=/CDL | 0 | 1 | 0 | 0 |
| 3 | /SDL=/SDL\|SEN (SDL=SDL&/SEN) | 0 | 1 | 0 | 0 |
| 4 | SEN=CDL&SEN | 0 | 1 | 0 | 0 |
| 5 | SDL=SDL\|SEN | 0 | 1 | 0 | 0 |
| 6 | SDL=/SDL | 0 | 1 | 0 | 1 |

(d) BDL=0, CDL=0

| Step | Operation | BDL | CDL | SEN | SDL |
|---|---|---|---|---|---|
| 0 | SEN=1(pre-charge) | 0 | 0 | 1 | — |
| 1 | SEN=BDL&SEN | 0 | 0 | 0 | — |
| 2 | SDL=/CDL | 0 | 0 | 0 | 1 |
| 3 | /SDL=/SDL\|SEN (SDL=SDL&/SEN) | 0 | 0 | 0 | 1 |
| 4 | SEN=CDL&SEN | 0 | 0 | 0 | 1 |
| 5 | SDL=SDL\|SEN | 0 | 0 | 0 | 1 |
| 6 | SDL=/SDL | 0 | 0 | 0 | 0 |

F I G. 11

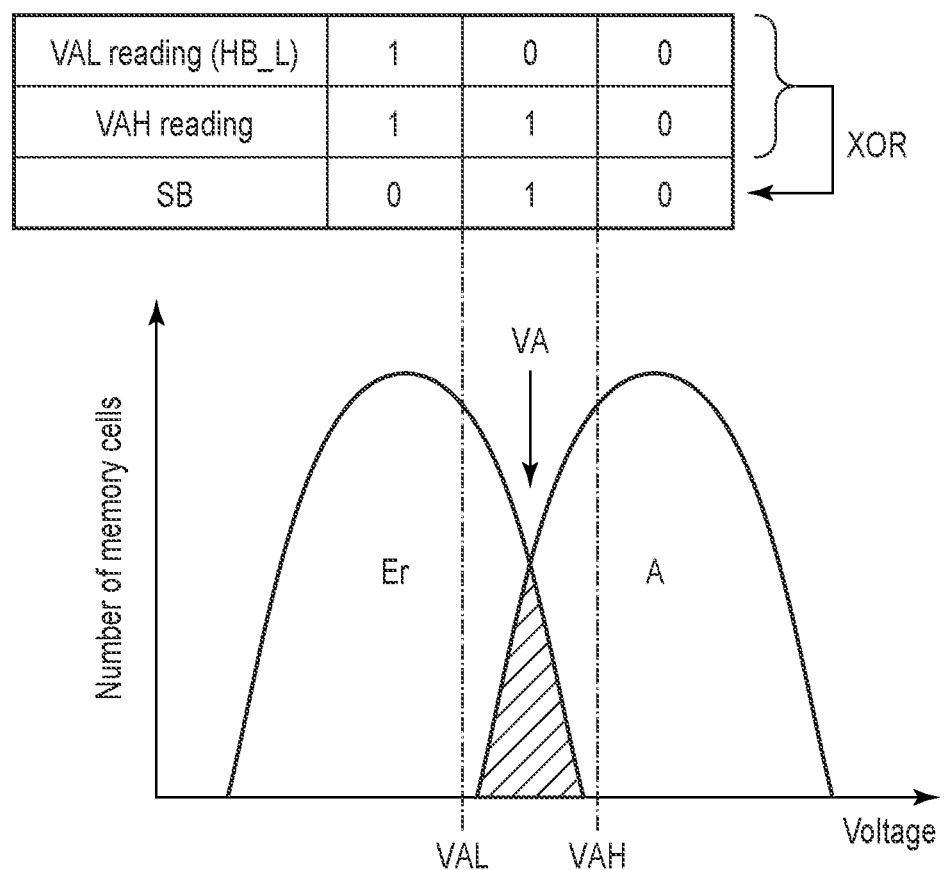
F I G. 13

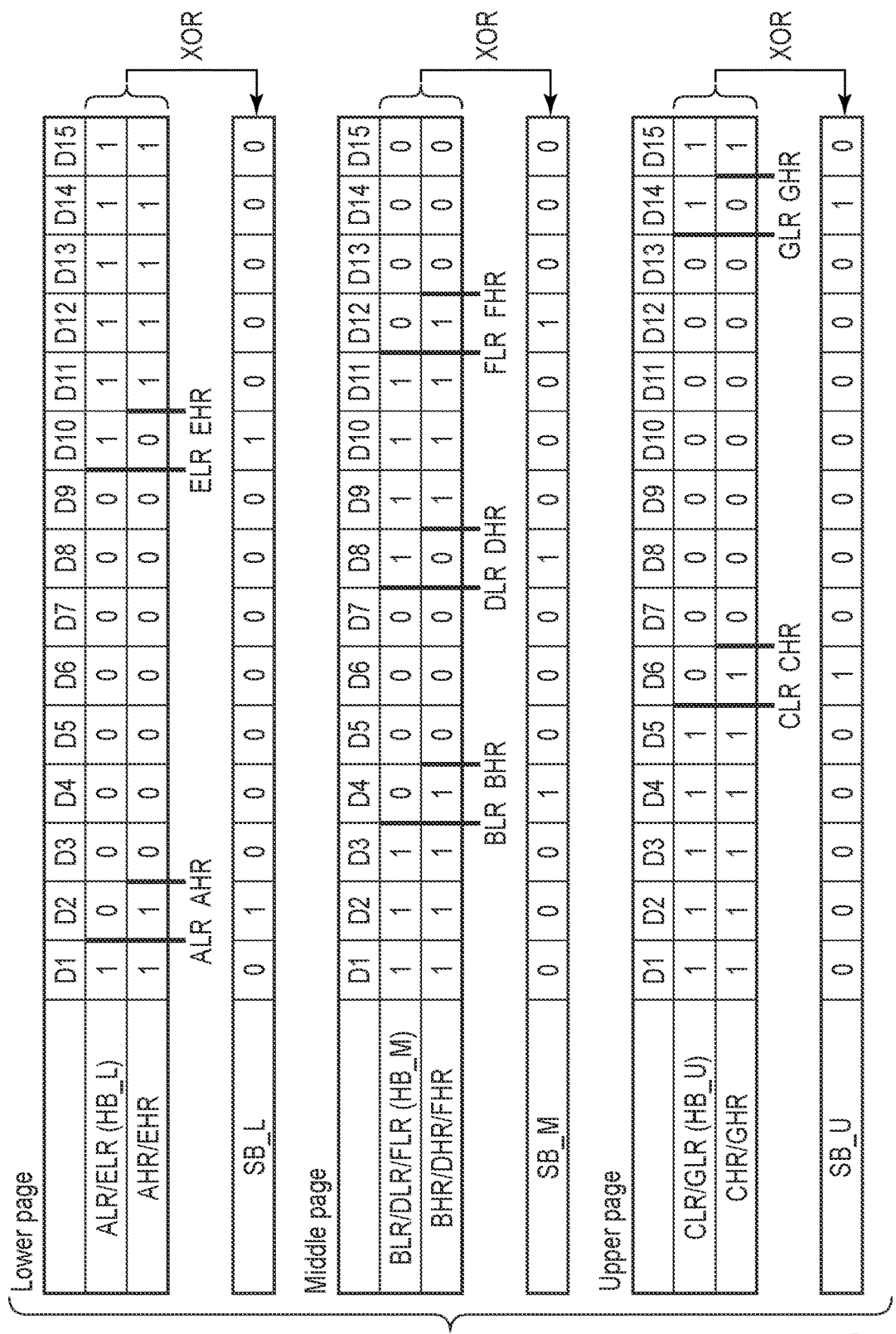
F I G. 15

|  | Er | A | B | C | D | E | F | G |
|---|---|---|---|---|---|---|---|---|
| HB_L | 1 | 0 | 0 | 0 | 0 | 1 | 1 | 1 |
| HB_M | 1 | 1 | 0 | 0 | 1 | 1 | 0 | 0 |
| HB_U | 1 | 1 | 1 | 0 | 0 | 0 | 0 | 1 |
| Compressed SB | 0 | 1 | 0 | 1 | 0 | 0 | 1 | 0 |

SB_L = ((~L&M&~U)|(L&M&~U))&SB

|  | Er | A | B | C | D | E | F | G |
|---|---|---|---|---|---|---|---|---|
| SB_L | 0 | 1 | 0 | 0 | 0 | 1 | 0 | 0 |

SB_M = ((~L&~M&U)|(~L&M&~U)|(L&~M&~U))&SB

|  | Er | A | B | C | D | E | F | G |
|---|---|---|---|---|---|---|---|---|
| SB_M | 0 | 0 | 1 | 0 | 0 | 0 | 1 | 0 |

SB_U = ((~L&~M&U)|(L&~M&U))&SB

|  | Er | A | B | C | D | E | F | G |
|---|---|---|---|---|---|---|---|---|
| SB_U | 0 | 0 | 0 | 1 | 0 | 0 | 0 | 1 |

F I G. 17

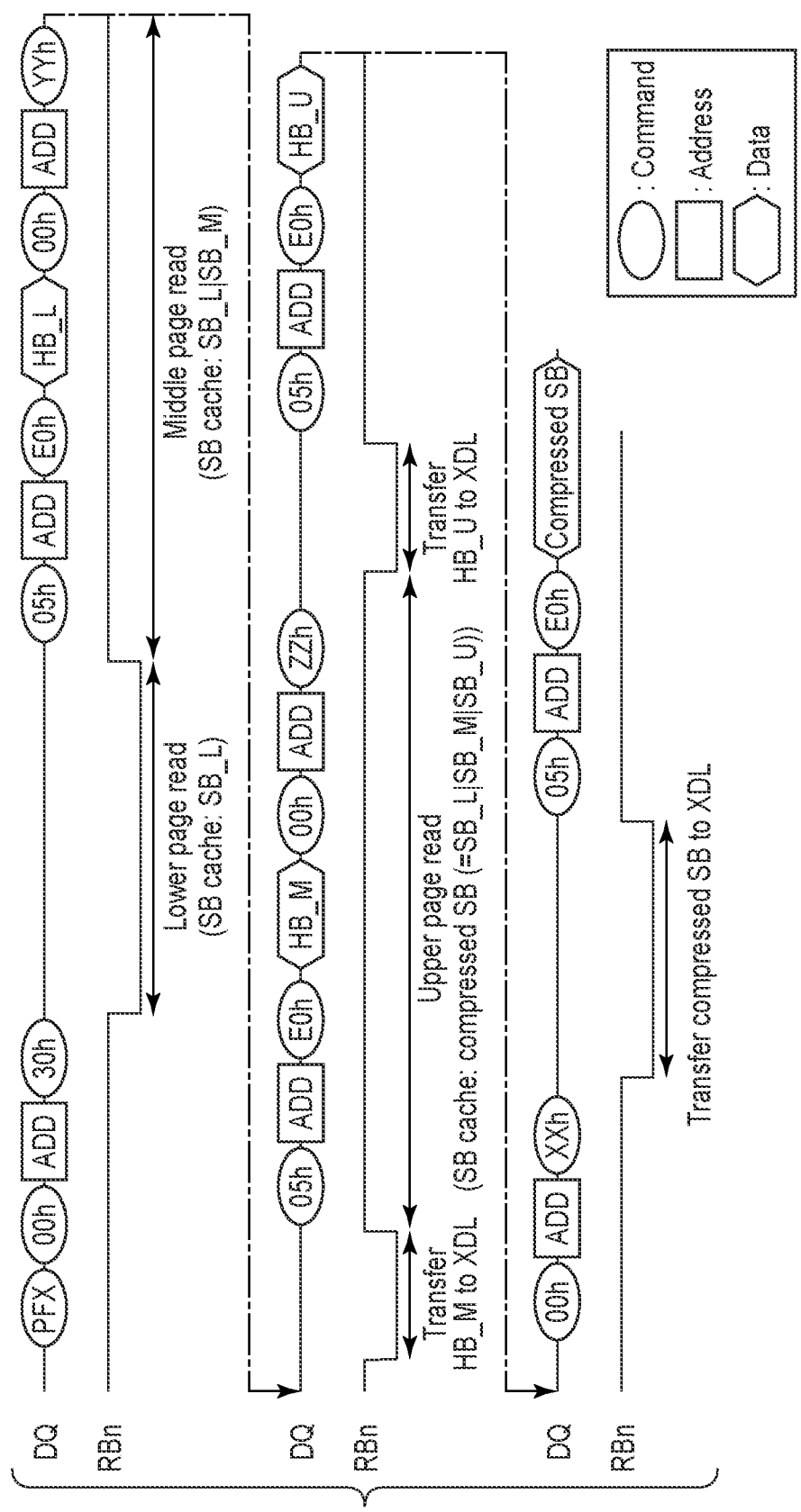
F I G. 20

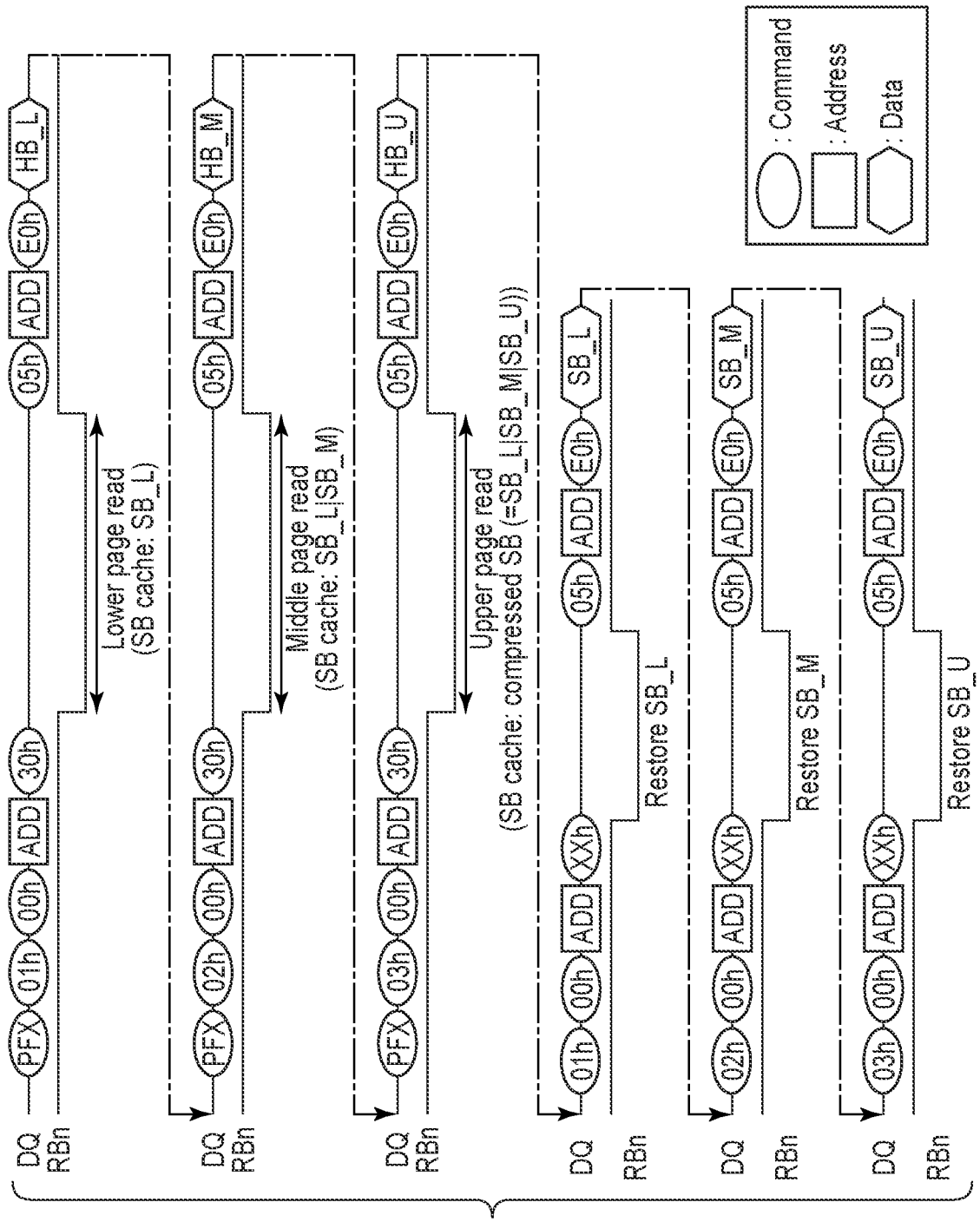
F I G. 21

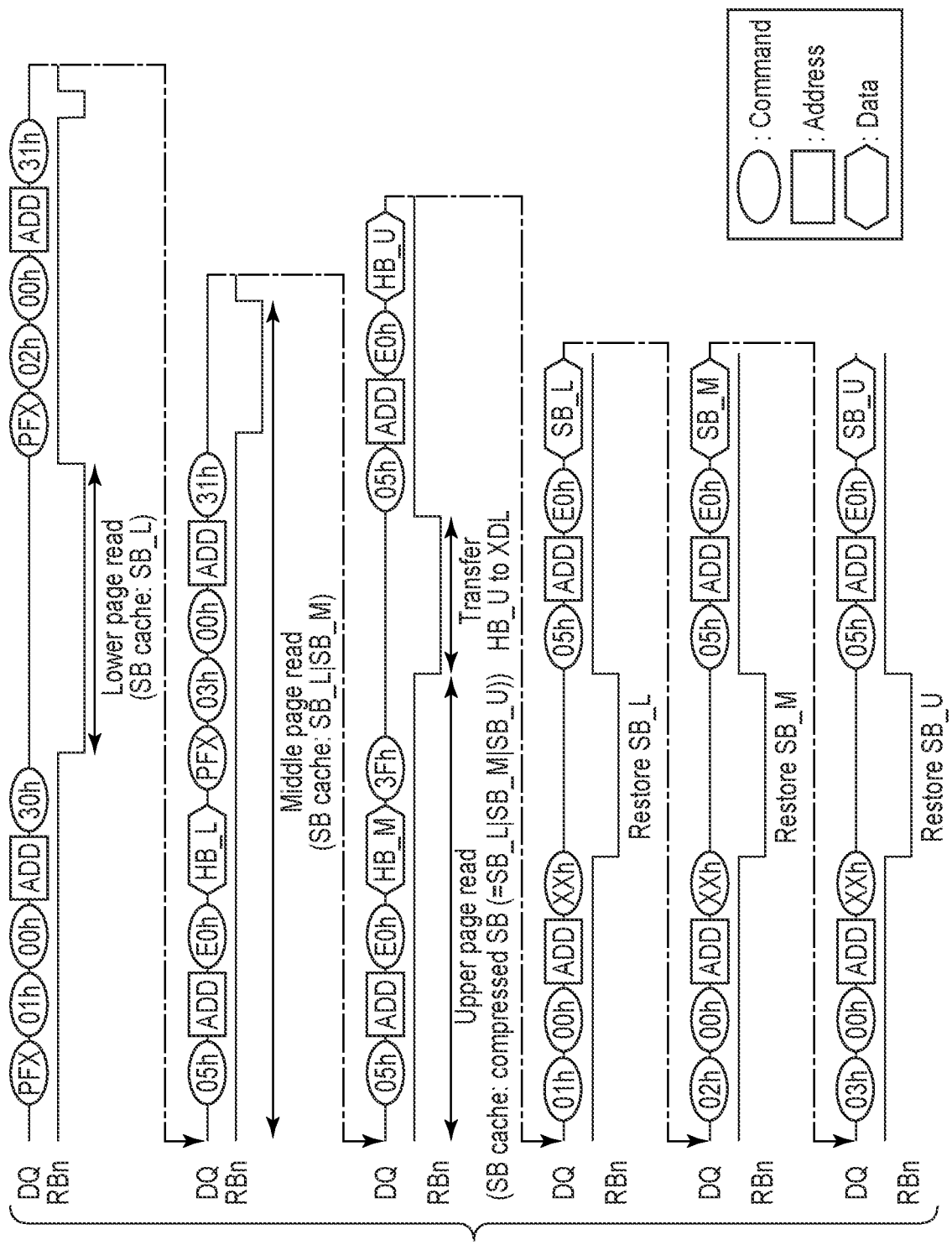
F I G. 22

| Block/WL | | Shift amount | | | |
|---|---|---|---|---|---|
| | | AR | BR | ... | GR |
| BLK0 | WL0 | ΔVA1 | ΔVB1 | .... | ΔVG1 |
| | WL1 | ΔVA4 | ΔVB4 | .... | ΔVG4 |
| | WL2 | ΔVA7 | ΔVB7 | .... | ΔVG7 |
| | ... | ... | ... | ... | ... |
| | WL7 | ΔVA5 | ΔVB5 | .... | ΔVG5 |
| .... | .... | .... | .... | .... | .... |
| BLK3 | WL0 | ΔVA2 | ΔVB2 | .... | ΔVG2 |
| | WL1 | ΔVA3 | ΔVB3 | .... | ΔVG3 |
| | WL2 | ΔVA1 | ΔVB1 | .... | ΔVG1 |
| | ... | ... | ... | ... | ... |
| | WL7 | ΔVA6 | ΔVB6 | .... | ΔVG6 |

FIG. 26

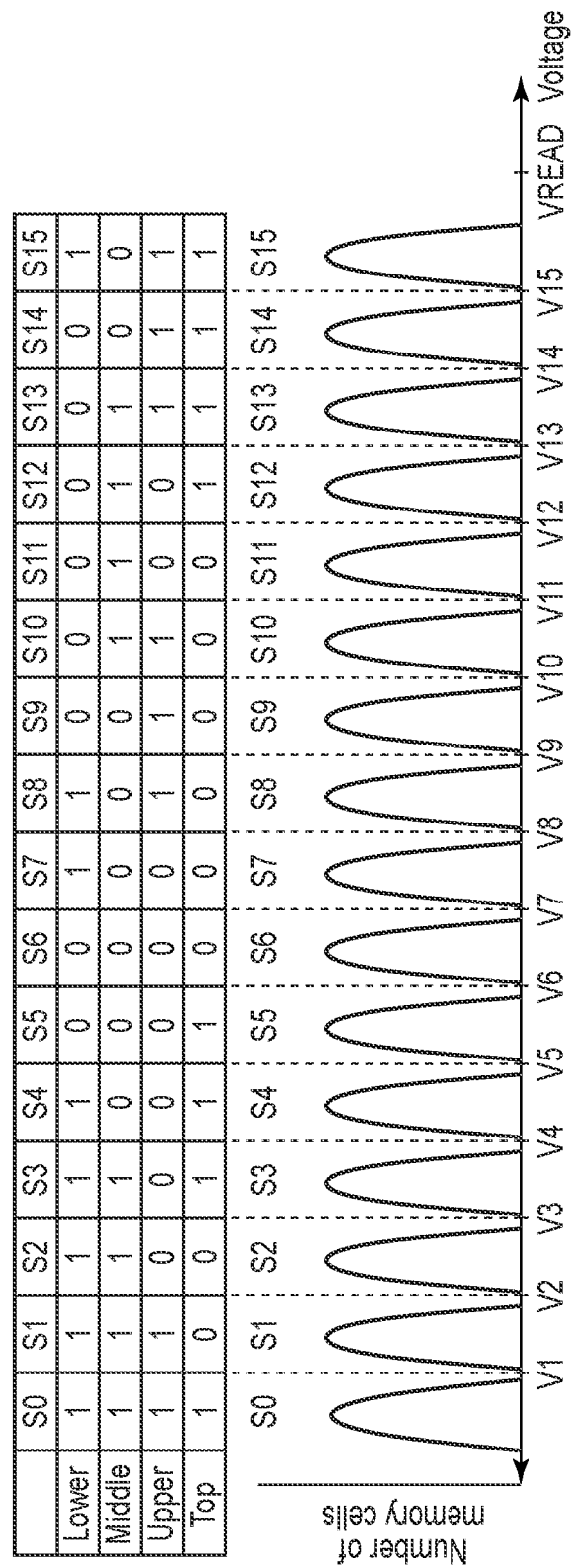
F I G. 33

F I G. 35

MEMORY SYSTEM AND NONVOLATILE MEMORY

CROSS-REFERENCE TO RELATED APPLICATIONS

This application is based upon and claims the benefit of priority from Japanese Patent Application No. 2023-039895, filed Mar. 14, 2023, the entire contents of which are incorporated herein by reference.

FIELD

Embodiments described herein relate generally to a technique for controlling nonvolatile memory.

BACKGROUND

A memory system equipped with a nonvolatile memory such as a NAND flash memory is known.

BRIEF DESCRIPTION OF THE DRAWINGS

FIG. 4 is a block diagram illustrating a basic configuration of a nonvolatile memory according to the first embodiment.

FIG. 8 is a flowchart of an AND operation in the sense amplifier unit included in the nonvolatile memory according to the first embodiment.

FIG. 9 is a flowchart of an OR operation in the sense amplifier unit included in the nonvolatile memory according to the first embodiment.

FIG. 10 is a flowchart of an XOR operation in the sense amplifier unit included in the nonvolatile memory according to the first embodiment.

FIG. 11 is a flowchart of the XOR operation in the sense amplifier unit included in the nonvolatile memory according to the first embodiment.

FIG. 13 is a diagram illustrating an example of relationships between threshold voltage distributions of an "Er" state and an "A" state, and hard bit data and soft bit data in the memory system according to the first embodiment.

FIG. 15 is a diagram illustrating an operation process of calculating soft bit data SB_L, SB_M, and SB_U from results of read operations of a lower page, a middle page, and an upper page in the memory system according to the first embodiment.

FIG. 17 is a diagram illustrating restoration processes of the soft bit data SB_L, SB_M, and SB_U in the memory system according to the first embodiment.

FIG. 20 is a command sequence of a third read mode based on the first command set in the memory system according to the first embodiment.

FIG. 21 is a command sequence of a first read mode based on a second command set in the memory system according to the first embodiment.

FIG. 22 is a command sequence of a second read mode based on the second command set in the memory system according to the first embodiment.

FIG. 26 is a diagram illustrating an example of a shift table used in the memory system according to the first embodiment.

FIG. 33 is a diagram illustrating relationships between data allocation and threshold voltage distributions of QLC included in a nonvolatile memory according to a fourth embodiment.

FIG. 35 is a diagram illustrating restoration processes of soft bit data SB_L, SB_M, SB_U, and SB_T in the memory system according to the fourth embodiment.

DETAILED DESCRIPTION

Figure 1:
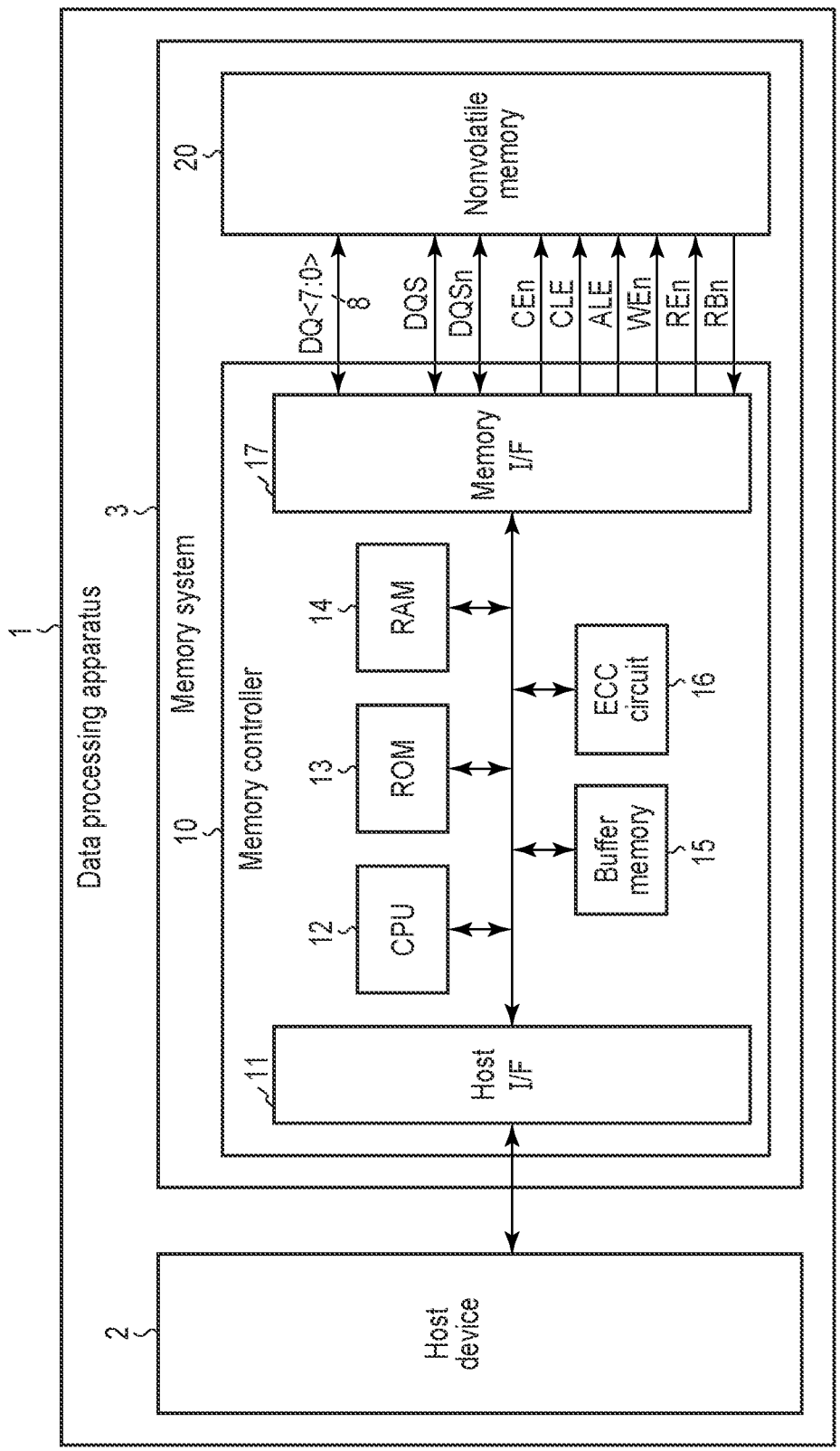
FIG. 1 is a block diagram illustrating an overall configuration of a data processing apparatus including a memory system according to a first embodiment.

In general, according to one embodiment, a memory system comprises a nonvolatile memory that includes a plurality of memory cells each capable of storing at least a first bit, a second bit, and a third bit, and a memory controller configured to control the nonvolatile memory. The nonvolatile memory outputs, to the memory controller, first hard bit data of the first bit, second hard bit data of the second bit, third hard bit data of the third bit, and fourth soft bit data related to the first bit, the second bit, and the third bit, in response to a first command set received from the memory controller. The nonvolatile memory outputs, to the memory controller, the first hard bit data, the second hard bit data, the third hard bit data, first soft bit data related to the first bit, second soft bit data related to the second bit, and third soft bit data related to the third bit, in response to a second command set received from the memory controller. In a case where the first command set is transmitted to the nonvolatile memory, the memory controller performs an error correction process by using the first hard bit data, the second hard bit data, the third hard bit data, and the fourth soft bit data. In a case where the second command set is transmitted to the nonvolatile memory, the memory controller performs the error correction process by using the first hard bit data, the second hard bit data, the third hard bit data, the first soft bit data, the second soft bit data, and the third soft bit data.

Embodiments are described below with reference to the drawings. The drawings are schematic. In the following description, components having substantially the same functions and configurations are denoted by the same reference numerals. Numbers after characters configuring reference numerals are used to distinguish elements having similar configurations.

First Embodiment

Configuration
Configuration of Data Processing Device

First, an example of a configuration of a data processing apparatus 1 including a memory system is described with reference to FIG. 1. FIG. 1 is a block diagram illustrating an overall configuration of the data processing apparatus 1. In the example of FIG. 1, some connections between each of components are indicated by arrow lines, but the each of connection between components is not limited thereto.

As illustrated in FIG. 1, the data processing apparatus 1 includes a host device 2 and a memory system 3. Note that the plurality of memory systems 3 may be connected to the host device 2.

The host device 2 is an information processing apparatus (computing device) that accesses the memory system 3. The host device 2 controls the memory system 3. More specifically, for example, the host device 2 requests (instructs) the memory system 3 to perform a write operation or a read operation of data (hereinafter, referred to as "user data").

The memory system 3 is, for example, a solid state drive (SSD). The memory system 3 is connected to the host device 2.

Configuration of Memory System

Subsequently, an example of a configuration of the memory system 3 will be described with reference to FIG. 1.

As illustrated in FIG. 1, the memory system 3 includes a memory controller 10 and a nonvolatile memory 20.

In response to a request (instruction) from the host device 2, the memory controller 10 instructs the nonvolatile memory 20 to perform a read operation, a write operation, an erase operation, and the like. In addition, the memory controller 10 manages a memory space of the nonvolatile memory 20.

The nonvolatile memory 20 is, for example, a NAND flash memory. The NAND flash memory includes a plurality of blocks. The block is, for example, a unit of data erase operation, and data in the same block is collectively erased. Each of blocks includes a plurality of memory cell transistors (hereinafter, also referred to as "memory cells") that stores data in a nonvolatile manner. Note that the memory system 3 can include a plurality of nonvolatile memories 20.

Next, an internal configuration of the memory controller 10 is described. The memory controller 10 includes a host interface circuit (host I/F) 11, a central processing unit (CPU) 12, a read only memory (ROM) 13, a random access memory (RAM) 14, a buffer memory 15, an error check and correction (ECC) circuit 16, and a memory interface circuit (memory I/F) 17. These circuits are connected to each other, for example, through a bus. Each function of the memory controller 10 may be realized by a dedicated circuit or may be realized by the CPU 12 performing firmware.

The host interface circuit 11 is a hardware interface circuit connected to the host device 2. The host interface circuit 11 performs communication according to an interface standard between the host device 2 and the memory controller 10. The host interface circuit 11 transmits the request and the user data received from the host device 2 to the CPU 12 and the buffer memory 15, respectively. In addition, the host interface circuit 11 transmits the user data in the buffer memory 15 to the host device 2 in response to a command from the CPU 12.

The CPU 12 is a processor. The CPU 12 controls the entire operation of the memory controller 10. For example, the CPU 12 instructs the nonvolatile memory 20 to perform a write operation, a read operation, and an erase operation based on a request received from the host device 2.

In addition, the CPU 12 performs various processes for managing the nonvolatile memory 20 such as garbage collection, refresh, wear leveling, and patrol read in the background in addition to the process of instructing the nonvolatile memory 20 to perform a predetermined operation based on the request received from the host device 2. Further, the CPU 12 performs various operations such as a data encryption process and a randomization process.

The garbage collection is also referred to as compaction. In the nonvolatile memory 20, since a unit of data erase operation and a unit of data read/write operation are different, blocks are fragmented due to invalid data as rewriting of the nonvolatile memory 20 progresses, and the number of usable blocks decreases as the number of such fragmented blocks increases. The garbage collection is a process for increasing the number of usable blocks and means, for example, a process of collecting valid data from a plurality of active blocks including valid data and invalid data, rewriting the valid data into another block, and securing a free block.

The active block indicates a block in which valid data is stored. The free block indicates a block in which valid data is not stored. The free block can be reused as an erased block after being erased. In the present embodiment, the free block includes both a block before erasure in which valid data is not stored and an erased block. The valid data is data associated with a logical address, and the invalid data is data not associated with a logical address. The erased block becomes an active block when data is written.

The refresh is, for example, a process of rewriting data in a certain block into another block in a case where deterioration of the data in the block is detected, such as a case where the number of correction bits in the error correction process by the ECC circuit 16 increases.

The wear leveling is, for example, a process of leveling the number of times of writing the blocks of the nonvolatile memory 20 by exchanging data stored in a block having a relatively large number of times of write and erase with data stored in a block having a relatively small number of times of write and erase.

The patrol read is, for example, a process of reading data stored in the nonvolatile memory 20 by a predetermined unit and testing the read data based on an error correction result in the ECC circuit 16 in order to detect a block with an increased error. In this test process, for example, the number of error bits of the read data is compared with a threshold, and data in which the number of error bits exceeds the threshold is set as a refreshing target.

The ROM 13 is a nonvolatile memory. For example, the ROM 13 is an electrically erasable programmable read-only memory (EEPROM™). The ROM 13 is a non-transitory storage medium that stores firmware, programs, and the like. For example, the operation of the memory controller 10 described later is realized by the CPU 12 performing firmware of the ROM 13.

The RAM 14 is a volatile memory. The RAM 14 is a dynamic random access memory (DRAM), a static random access memory (SRAM), or the like. The RAM 14 is used as a work area of the CPU 12. The RAM 14 stores firmware for managing the nonvolatile memory 20, various management tables, and the like.

The buffer memory 15 is a volatile memory. The buffer memory 15 is a DRAM, an SRAM, or the like. The buffer memory 15 temporarily stores data read from the nonvolatile memory 20 by the memory controller 10, user data received from the host device 2, and the like.

The ECC circuit 16 is a circuit that performs an ECC process. The ECC process includes encoding and decoding of data. The ECC circuit 16 encodes data to be written to the nonvolatile memory 20. An encoding method is a Bose-Chaudhuri-Hocquenghem (BCH) code, a Reed-Solomon (RS) code, a Low-Density Parity-Check (LDPC) code, or the like. The ECC circuit 16 decodes data read from the nonvolatile memory 20. That is, the ECC circuit 16 performs error correction of data. The configuration of the ECC circuit 16 is described later.

The memory interface circuit 17 is a hardware interface circuit connected to the nonvolatile memory 20. The memory interface circuit 17 performs communication according to an interface standard between the memory controller 10 and the nonvolatile memory 20. The memory interface circuit 17 transmits and receives data and various signals to and from the nonvolatile memory 20 based on the control of the CPU 12.

More specifically, the memory interface circuit 17 transmits and receives, for example, 8-bit signals DQ<7:0> and clock signals DOS and DQSn to and from the nonvolatile memory 20. The signal DQ<7:0> is, for example, data, an address, and a command. Hereinafter, in a case where any of the signals DQ <7:0> is not limited, it is referred to as a signal DQ. The clock signals DOS and DQSn are clock signals used at the time of inputting and outputting data. The clock signal DOSn is an inverted signal of the clock signal DQS.

In addition, the memory interface circuit 17 transmits a chip enable signal CEn, a command latch enable signal CLE, an address latch enable signal ALE, a write enable signal WEn, and a read enable signal REn to the nonvolatile memory 20. Then, the memory interface circuit 17 receives a ready/busy signal RBn from the nonvolatile memory 20.

The chip enable signal CEn is a signal for enabling the nonvolatile memory 20 and is asserted at, for example, the Low ("L") level. The command latch enable signal CLE is a signal indicating that a signal DQ is a command, and is asserted, for example, at a high ("H") level. The address latch enable signal ALE is a signal indicating that the signal DQ is an address, and is asserted, for example, at the "H" level.

The write enable signal WEn is a signal for fetching the received signal into the nonvolatile memory 20. At the timing when the nonvolatile memory 20 fetches the command and the address, the signal WEn is asserted at, for example, the "L" level. Therefore, every time the signal WEn is toggled, the command and the address are fetched into the nonvolatile memory 20.

The read enable signal REn is a signal for the memory controller 10 to read data from the nonvolatile memory 20. The signal REn is asserted, for example, at the "L" level. For example, the nonvolatile memory 20 generates the signals DQS and DQSn based on the signal REn when data is output.

The ready/busy signal RBn is a signal indicating whether the nonvolatile memory 20 is in a state of being incapable of receiving the signal DQ from the memory controller 10 or in a state of being capable of receiving the signal DQ. For example, the ready/busy signal RBn is set to the "L" level when the nonvolatile memory 20 is in the busy state.

Configuration of ECC Circuit

Figure 2:
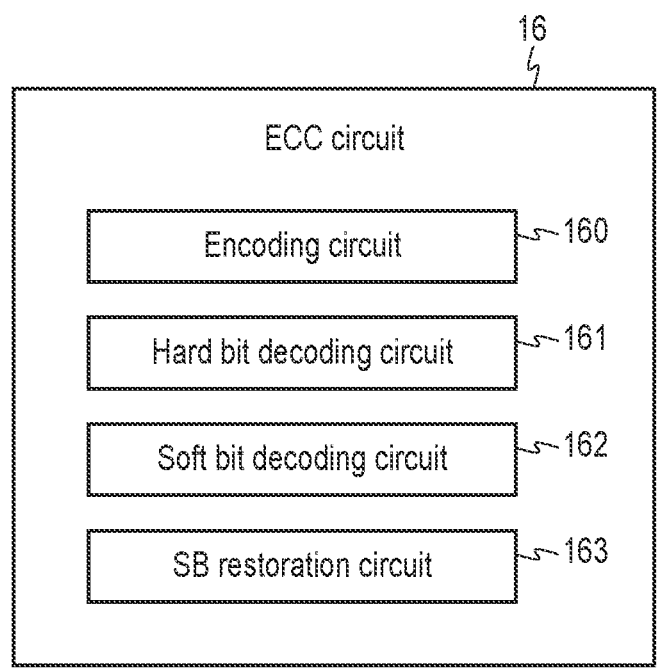
FIG. 2 is a block diagram illustrating a configuration of an ECC circuit included in the memory system according to the first embodiment.

Next, an example of a configuration of the ECC circuit 16 is described with reference to FIG. 2. FIG. 2 is a block diagram illustrating a configuration of the ECC circuit 16.

As illustrated in FIG. 2, the ECC circuit 16 includes an encoding circuit 160, a hard bit decoding circuit 161, a soft bit decoding circuit 162, and an SB restoration circuit 163.

The encoding circuit 160 is a circuit that encodes data. For example, in response to receiving a write request from the host device 2, the encoding circuit 160 generates an error correction code (parity) used for the ECC process from the user data. The encoding circuit 160 adds parity to the user data. This is also referred to as encoding. Therefore, the write data includes user data and a parity.

The hard bit decoding circuit 161 is a circuit that performs hard bit decoding (hard decision decoding) on read data. The hard bit decoding is an ECC process using a hard bit value received (read) from the nonvolatile memory 20. Hereinafter, the hard bit value is also referred to as a hard bit. The hard bit is described later. Hard bit data is input to the hard bit decoding circuit 161. The hard bit decoding circuit 161 decodes the user data based on the hard bit data.

The soft bit decoding circuit 162 is a circuit that performs soft bit decoding (soft decision decoding) on read data. The soft bit decoding is an ECC process using a soft bit value received (read) from the nonvolatile memory 20. Hereinafter, the soft bit value is also referred to as a soft bit. The soft bit is described later. Hard bit data and soft bit data are input to the soft bit decoding circuit 162. The soft bit decoding circuit 162 decodes the user data based on the hard bit data and the soft bit data. In decoding, the soft bit decoding circuit 162 uses a log-likelihood ratio (LLR) table. The LLR table is a table indicating a correspondence between a soft bit and a log-likelihood ratio. The LLR table includes log-likelihood ratio values (LLR values). The LLR value is information representing the likelihood when the data is "O"

and the likelihood when the data is "1" as a logarithmic ratio. The LLR value indicates reliability (likelihood) of data read by a certain read voltage. For example, the LLR table is read, at the time of activation of the memory system 3, from the nonvolatile memory 20 to the memory controller 10 and stored in the RAM 14.

The SB restoration circuit 163 is a circuit that restores soft bit data. The nonvolatile memory 20 of the present embodiment transmits the compressed soft bit data to the memory controller 10. The compressed soft bit data is data obtained by compressing a plurality of pieces of soft bit data. The compressed soft bit data is described later. The SB restoration circuit 163 restores a plurality of pieces of soft bit data by using the hard bit data and the compressed soft bit data.

An example of the restoration of soft bit data is described. For example, the memory cell transistor of the nonvolatile memory 20 is a triple level cell (TLC) that stores 3-bit data including a lower bit, a middle bit, and an upper bit. In this case, the nonvolatile memory 20 compresses (integrates) 3-bit soft bit data corresponding to the lower bit, the middle bit, and the upper bit to calculate 1-bit compressed soft bit data. The SB restoration circuit 163 restores the soft bit data of the lower bit, the middle bit, and the upper bit from the hard bit data of the lower bit, the middle bit, and the upper bit and the compressed soft bit data read from the nonvolatile memory 20.

Configuration of SB Restoration Circuit

Figure 3:
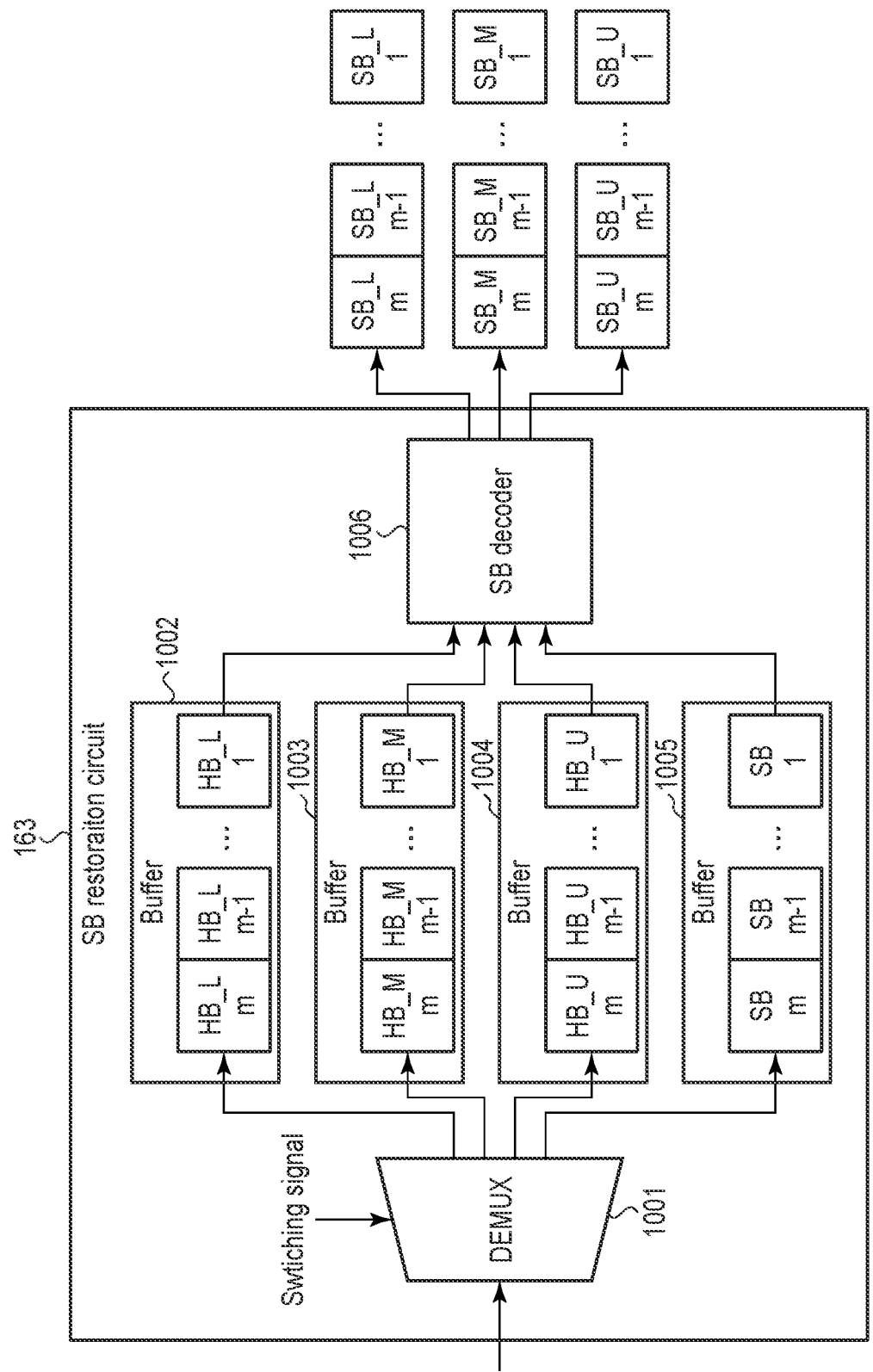
FIG. 3 is a block diagram illustrating a configuration of an SB restoration circuit included in the memory system according to the first embodiment.

Next, an example of a configuration of the SB restoration circuit 163 is described with reference to FIG. 3. FIG. 3 is a block diagram illustrating a configuration of the SB restoration circuit 163. The SB restoration circuit 163 illustrated in FIG. 3 corresponds to a case where the memory cell transistor is a TLC.

As illustrated in FIG. 3, the SB restoration circuit 163 includes a demultiplexer (DEMUX: DeMultiplexer) 1001, four buffers 1002 to 1005, and an SB decoder 1006. The number of buffers is arbitrarily set based on the number of bits that can be stored in the memory cell transistor. For example, in a case where the number of bits that can be stored in the memory cell transistor is k bits (k is an integer of 2 or more), the SB restoration circuit 163 may include k+1 buffers.

The DEMUX 1001 is a connection circuit. The DEMUX 1001 electrically connects an input terminal and any one of four output terminals connected respectively to the buffers 1002 to 1005 based on a switching signal received from the CPU 12.

The buffer 1002 is a buffer that temporarily stores hard bit data HB_L of a lower bit. The buffer 1002 receives the hard bit data HB_L from the DEMUX 1001. The buffer 1002 stores, for example, hard bit data HB_L having a data length of m bits (m is an integer of 1 or more). Note that the data length that the buffer 1002 can store may be the same as or different from a data length that is collectively subjected to the ECC process (hereinafter, referred to as an "ECC frame").

The buffer 1003 is a buffer that temporarily stores hard bit data HB_M of a middle bit. The buffer 1003 receives the hard bit data HB_M from the DEMUX 1001. For example, similarly to the buffer 1002, the buffer 1003 stores, for example, hard bit data HB_M having a data length of m bits.

The buffer 1004 is a buffer that temporarily stores hard bit data HB_U of an upper bit. The buffer 1004 receives the hard bit data HB_U from the DEMUX 1001. For example, similarly to the buffer 1002, the buffer 1004 stores, for example, hard bit data HB_U having a data length of m bits.

The buffer 1005 is a buffer that temporarily stores compressed soft bit data SB. The buffer 1005 receives the compressed soft bit data SB from the DEMUX 1001. For example, similarly to the buffer 1002, the buffer 1005 stores, for example, the compressed soft bit data SB having a data length of m bits.

The SB decoder 1006 is a restoration circuit of the soft bit data SB. The SB decoder 1006 receives the hard bit data HB_L, HB_M, and HB_U, and the compressed soft bit data SB. The SB decoder 1006 restores soft bit data SB_L of the lower bit, soft bit data SB_M of the middle bit, and soft bit data SB_U of the upper bit based on the hard bit data HB_L, HB_M, and HB_U and the compressed soft bit data SB. For example, the SB decoder 1006 transmits the soft bit data SB_L, SB_M, and SB_U to the soft bit decoding circuit 162.

Configuration of Nonvolatile Memory

Next, an example of a configuration of the nonvolatile memory 20 is described with reference to FIG. 4. FIG. 4 is a block diagram illustrating a basic configuration of the nonvolatile memory 20. In the example of FIG. 4, some connections between components are indicated by arrow lines. However, the connection between components is not limited thereto.

As illustrated in FIG. 4, the nonvolatile memory 20 is, for example, a NAND flash memory. The nonvolatile memory 20 is connected to the memory controller 10. The nonvolatile memory 20 operates based on an instruction from the memory controller 10.

The nonvolatile memory 20 includes an input/output circuit 201, a logic control circuit 202, an address register 203, a command register 204, a status register 205, a sequencer 206, a ready/busy circuit 207, a voltage generation circuit 208, and a plurality of planes PLN.

The input/output circuit 201 is a circuit that inputs and outputs a signal DQ. The input/output circuit 201 is connected to the memory controller 10. In addition, the input/output circuit 201 is connected to the address register 203, the command register 204, the status register 205, and a data register 214 of each plane PLN. In a case where the input signal DQ is data DAT, the input/output circuit 201 receives the input signal DQ based on the clock signals DQS and DQSn. Then, the input/output circuit 201 transmits the data DAT to the data register 214 of the corresponding plane PLN. In addition, the input/output circuit 201 outputs the data DAT and status information STS to the memory controller 10 together with the clock signals DQS and DQSn. When the input signal DQ is address ADD, the input/output circuit 201 transmits the address ADD to the address register 203. When the input signal DQ is a command CMD, the input/output circuit 201 transmits the command CMD to the command register 204.

The logic control circuit 202 is a circuit that performs logic control based on a control signal. The logic control circuit 202 is connected to the memory controller 10. In addition, the logic control circuit 202 is connected to the input/output circuit 201 and the sequencer 206. The logic control circuit 202 receives various control signals from the memory controller 10. The logic control circuit 202 controls the input/output circuit 201 and the sequencer 206 based on the received control signal.

The address register 203 is a register that temporarily stores the address ADD. The address register 203 is connected to a row decoder 212 and a column decoder 215 of each plane PLN. The address ADD includes a row address RA and a column address CA. The address register 203 transmits the row address RA to the row decoder 212.

Further, the address register 203 transmits the column address CA to the column decoder 215.

The command register 204 is a register that temporarily stores the command CMD. The command register 204 is connected to the sequencer 206. The command register 204 transmits the command CMD to the sequencer 206.

The status register 205 is a register that temporarily stores the status information STS. The status register 205 is connected to the sequencer 206. The status register 205 temporarily stores the status information STS in the write operation, the read operation, the erase operation, and the like. The status information STS is transmitted to the memory controller 10 by the input/output circuit 201.

The sequencer 206 controls the entire operation of the nonvolatile memory 20. More specifically, the sequencer 206 controls the ready/busy circuit 207, the voltage generation circuit 208, the row decoder 212, a sense amplifier 213, the data register 214, the column decoder 215, and the like. The sequencer 206 performs the write operation, the read operation, and the erase operation based on the command CMD. The sequencer 206 transmits the status information STS to the status register 205.

The ready/busy circuit 207 is a circuit that transmits a ready/busy signal RBn. The ready/busy circuit 207 transmits a ready/busy signal RBn to the memory controller 10 according to the operation status of the sequencer 206.

The voltage generation circuit 208 generates various voltages used for the write operation, the read operation, and the erase operation based on the control of the sequencer 206. The voltage generation circuit 208 supplies a voltage to a memory cell array 211, the row decoder 212, the sense amplifier 213, the data register 214, the column decoder 215, and the like of each plane PLN.

The plane PLN is a unit that performs a data write operation and a data read operation. In the example of FIG. 4, the nonvolatile memory 20 includes four planes PLN0, PLN1, PLN2, and PLN3. Note that the number of planes PLN is not limited to four. One plane PLN may be provided, or a plurality of planes PLN other than four planes may be provided. The planes PLN0 to PLN3 can operate independently of each other. In addition, the planes PLN0 to PLN3 can also operate in parallel.

Next, an internal configuration of the plane PLN is described. Hereinafter, a case where the planes PLN0 to PLN3 have the same configuration are described. Note that the configuration of each plane PLN may be different. Hereinafter, when any one of the planes PLN0 to PLN3 is not limited, it is referred to as the "plane PLN". The plane PLN includes the memory cell array 211, the row decoder 212, the sense amplifier 213, the data register 214, and the column decoder 215.

The memory cell array 211 is a set of a plurality of arranged memory cell transistors. The memory cell array 211 includes a plurality of blocks BLK. In the example of FIG. 4, the memory cell array 211 includes four blocks BLK0, BLK1, BLK2, and BLK3. Note that the number of blocks BLK in the memory cell array 211 is arbitrary. The block BLK is, for example, a set of a plurality of memory cell transistors in which data is collectively erased. Details of the configuration of the block BLK is described later.

The row decoder 212 is a decoding circuit of the row address RA. The row decoder 212 selects any one of the blocks BLK in the memory cell array 211 based on the decoding result. The row decoder 212 applies a voltage to wiring (a word line and a selection gate line described later) in a row direction of the selected block BLK.

The sense amplifier 213 is a circuit that writes and reads the data DAT. The sense amplifier 213 is connected to the memory cell array 211. The sense amplifier 213 reads the data DAT from the memory cell array 211 during the read operation. In addition, the sense amplifier 213 supplies a voltage corresponding to the write data DAT to the memory cell array 211 during the write operation. The sense amplifier 213 calculates the soft bit data SB based on the read data. In addition, the sense amplifier 213 calculates the compressed soft bit data SB from the plurality of pieces of soft bit data SB. In other words, the sequencer 206 is a control circuit that controls the sense amplifier 213 to calculate the compressed soft bit data SB.

The data register 214 is a register that temporarily stores the data DAT. The data register 214 is connected to the sense amplifier 213. The data register 214 includes a plurality of latch circuits. Each latch circuit temporarily stores write data or read data.

The column decoder 215 is a circuit that decodes the column address CA. The column decoder 215 receives the column address CA from the address register 203. The column decoder 215 selects the latch circuit in the data register 214 based on the decoding result of the column address CA.

Note that some elements of the input/output circuit 201, the logic control circuit 202, the address register 203, the command register 204, the status register 205, the sequencer 206, the ready/busy circuit 207, the voltage generation circuit 208, and the row decoder 212, the sense amplifier 213, the data register 214, and the column decoder 215 included in each of the plurality of planes PLN may be referred to as control circuits.

Circuit Configuration of Memory Cell Array

Figure 5:
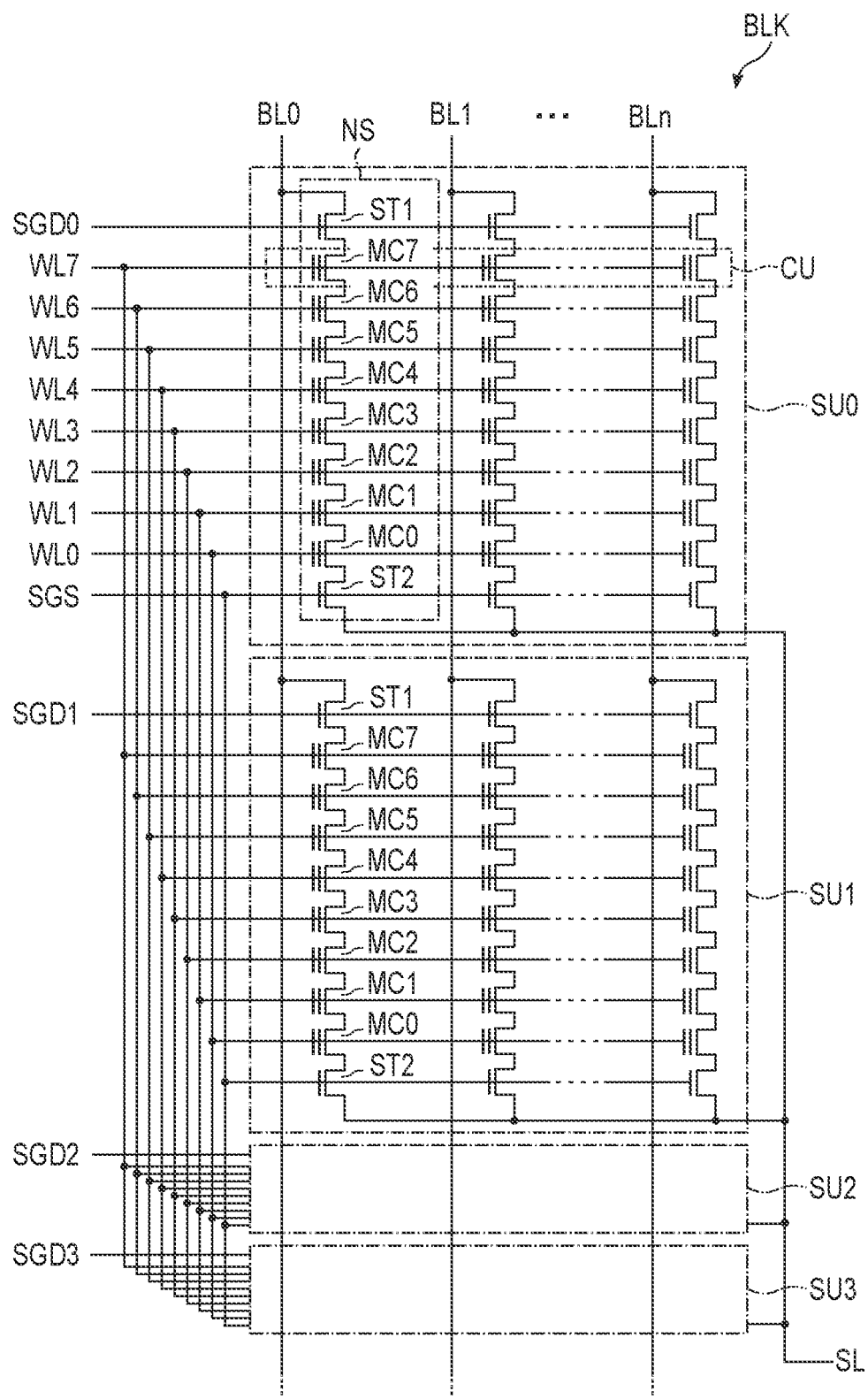
FIG. 5 is a circuit diagram of a memory cell array included in the nonvolatile memory according to the first embodiment.

Next, an example of a circuit configuration of the memory cell array 211 is described with reference to FIG. 5. FIG. 5 is a circuit diagram of the memory cell array 211. Note that the example of FIG. 5 illustrates a circuit configuration of one block BLK.

The block BLK includes, for example, four string units SU0 to SU3. Note that the number of string units SU included in the block BLK is arbitrary. The string unit SU is, for example, a set of a plurality of NAND strings NS collectively selected in the write operation or the read operation. The string unit SU includes a plurality of NAND strings NS.

The NAND string NS is a set of a plurality of memory cell transistors MC connected in series. The plurality of NAND strings NS in the string unit SU are connected to any of the bit lines BL0 to BLn (n is an integer of 1 or more). The NAND string NS includes a plurality of memory cell transistors MC and select transistors ST1 and ST2. In the example of FIG. 5, the NAND string NS includes eight memory cell transistors MC0 to MC7.

The memory cell transistor MC is a memory element that stores data in a nonvolatile manner. The memory cell transistor MC includes a control gate and a charge storage layer. The memory cell transistor MC may be a metal-oxide-nitride-oxide-silicon (MONOS) type or a floating gate (FG) type. In the MONOS type, an insulating layer is used as the charge storage layer. In the FG type, a conductor layer is used as a charge storage layer.

The select transistors ST1 and ST2 are switching elements. The select transistors ST1 and ST2 are used to select the string units SU during various operations, respectively.

The current paths of the select transistor ST2, the memory cell transistors MC0 to MC7, and the select transistor ST1 in the NAND string NS are connected in series. A drain of the select transistor ST1 is connected to the bit line BL. A source of the select transistor ST2 is connected to a source line SL.

The control gates of the memory cell transistors MC0 to MC7 in the same block BLK are commonly connected to word lines WL0 to WL7, respectively. More specifically, for example, the block BLK includes four string units SU0 to SU3. Each string unit SU includes the plurality of memory cell transistors MC0 to MC7. The control gates of the plurality of memory cell transistors MC0 in the block BLK are commonly connected to one word line WL0. The same is applied to the memory cell transistors MC1 to MC7.

Gates of the plurality of select transistors ST1 in the string unit SU are commonly connected to one select gate line SGD. More specifically, the gates of the plurality of select transistors ST1 in the string unit SU0 are commonly connected to a select gate line SGD0. Gates of the plurality of select transistors ST1 in the string unit SU1 are commonly connected to a select gate line SGD1. Gates of the plurality of select transistors ST1 in the string unit SU2 are commonly connected to a select gate line SGD2. Gates of the plurality of select transistors ST1 in the string unit SU3 are commonly connected to a select gate line SGD3.

Gates of the plurality of select transistors ST2 in the block BLK are commonly connected to a select gate line SGS. Similarly to the select gate line SGD, the different select gate line SGS may be provided for each string unit SU.

The word lines WL0 to WL7, the select gate lines SGD0 to SGD3, and the select gate line SGS are connected to the row decoder 212 in the plane PLN.

The bit line BL is commonly connected to one NAND string NS in each string unit SU of each block BLK. The same column address is assigned to the plurality of NAND strings NS connected to one bit line BL. Each bit line BL is connected to the sense amplifier 213 in the plane PLN.

The source line SL is shared, for example, among the plurality of blocks BLK.

A set of the plurality of memory cell transistors MC connected to the common word line WL in one string unit SU is referred to as, for example, a "cell unit CU". For example, in a case where the memory cell transistor MC stores 1-bit data, the storage capacity of the cell unit CU is defined as "1-page data". The data length of the 1-page data can be an arbitrary bit length.

The cell unit CU may have a storage capacity of 2-page data or more based on the number of bits of data stored in the memory cell transistor MC. For example, in a case where the memory cell transistor MC is a TLC, 3-page data is stored in the cell unit CU. The data length of the 1-page data may be the same as the data length of the ECC frame, or the 1-page data may include a plurality of ECC frames.

Configuration of Data Register and Sense Amplifier

Figure 6:
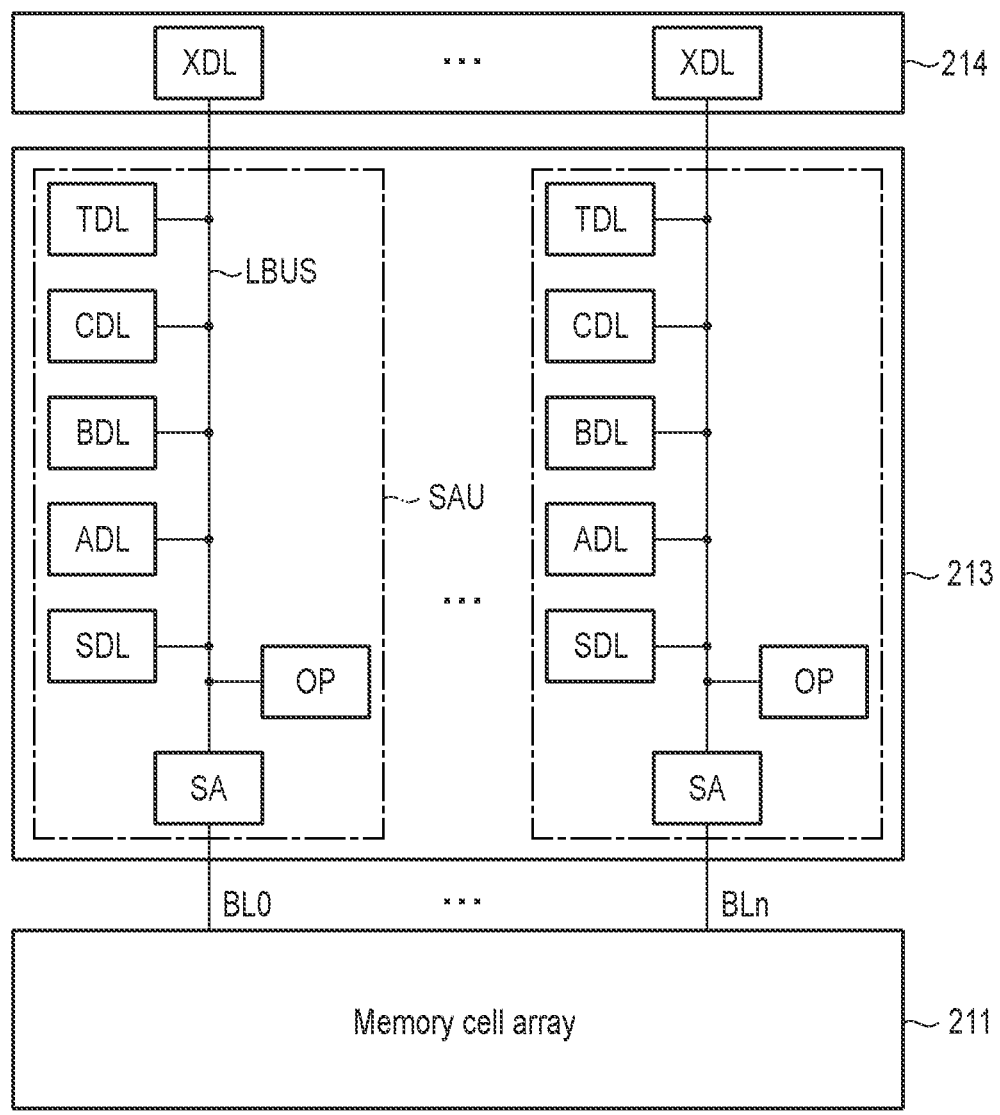
FIG. 6 is a block diagram of a data register and a sense amplifier included in the nonvolatile memory according to the first embodiment.

Next, an example of a configuration of the data register 214 and the sense amplifier 213 will be described with reference to FIG. 6. FIG. 6 is a block diagram of the data register 214 and the sense amplifier 213.

As illustrated in FIG. 6, the sense amplifier 213 includes a plurality of sense amplifier units SAU provided for each bit line BL. The data register 214 includes a plurality of latch circuits XDL provided for each sense amplifier unit SAU.

For example, the sense amplifier unit SAU includes a sense circuit SA, an operation unit OP, and latch circuits SDL, ADL, BDL, CDL, and TDL. The sense circuit SA and the latch circuits SDL, ADL, BDL, CDL, and TDL are commonly connected to the corresponding latch circuit XDL through a bus LBUS. In other words, the latch circuit XDL, the sense circuit SA, and the latch circuits SDL, ADL, BDL, CDL, and TDL are connected so as to be able to transmit and receive data to and from each other through the bus LBUS. The number of latch circuits included in the sense amplifier unit SAU can be designed based on the number of bits of data that can be stored in one memory cell transistor MC.

The sense circuit SA senses the data read to the corresponding bit line BL at the time of the read operation and determines whether the read data is "0" or "1". The sense circuit SA applies, during the write operation, a voltage to the bit line BL based on the write data.

The operation unit OP performs various logical operations by using data stored in the latch circuits XDL, SDL, ADL, BDL, CDL, and TDL. Note that the sense amplifier 213 may separately include an operation circuit that performs various logical operations instead of the operation unit OP.

The latch circuits SDL, ADL, BDL, CDL, and TDL temporarily store read data or write data. For example, in the case of the read operation, the read data is stored in any one of the latch circuits SDL, ADL, BDL, CDL, and TDL. In addition, for example, in the case of the write operation, the write data of the latch circuit XDL is stored in any one of the latch circuits SDL, ADL, BDL, CDL, and TDL.

The latch circuit XDL is used as a cache memory for inputting and outputting data between the sense amplifier unit SAU and the input/output circuit 201. More specifically, the write data received from the memory controller 10 is transmitted to the latch circuits SDL, ADL, BDL, CDL, and TDL or the sense circuit SA via the latch circuit XDL. In addition, the read data stored in the latch circuits SDL, ADL, BDL, CDL, and TDL or the sense circuit SA is transmitted to the memory controller 10 via the latch circuit XDL.

Logical Operation by Sense Amplifier

Next, a logical operation by the sense amplifier 213 is described. Here, a case where a logical operation is performed in the sense circuit SA of the sense amplifier 213 is described. In the present embodiment, the operation unit OP of the sense amplifier 213 can be omitted.

Circuit Configuration of Sense Amplifier Unit

Figure 7:
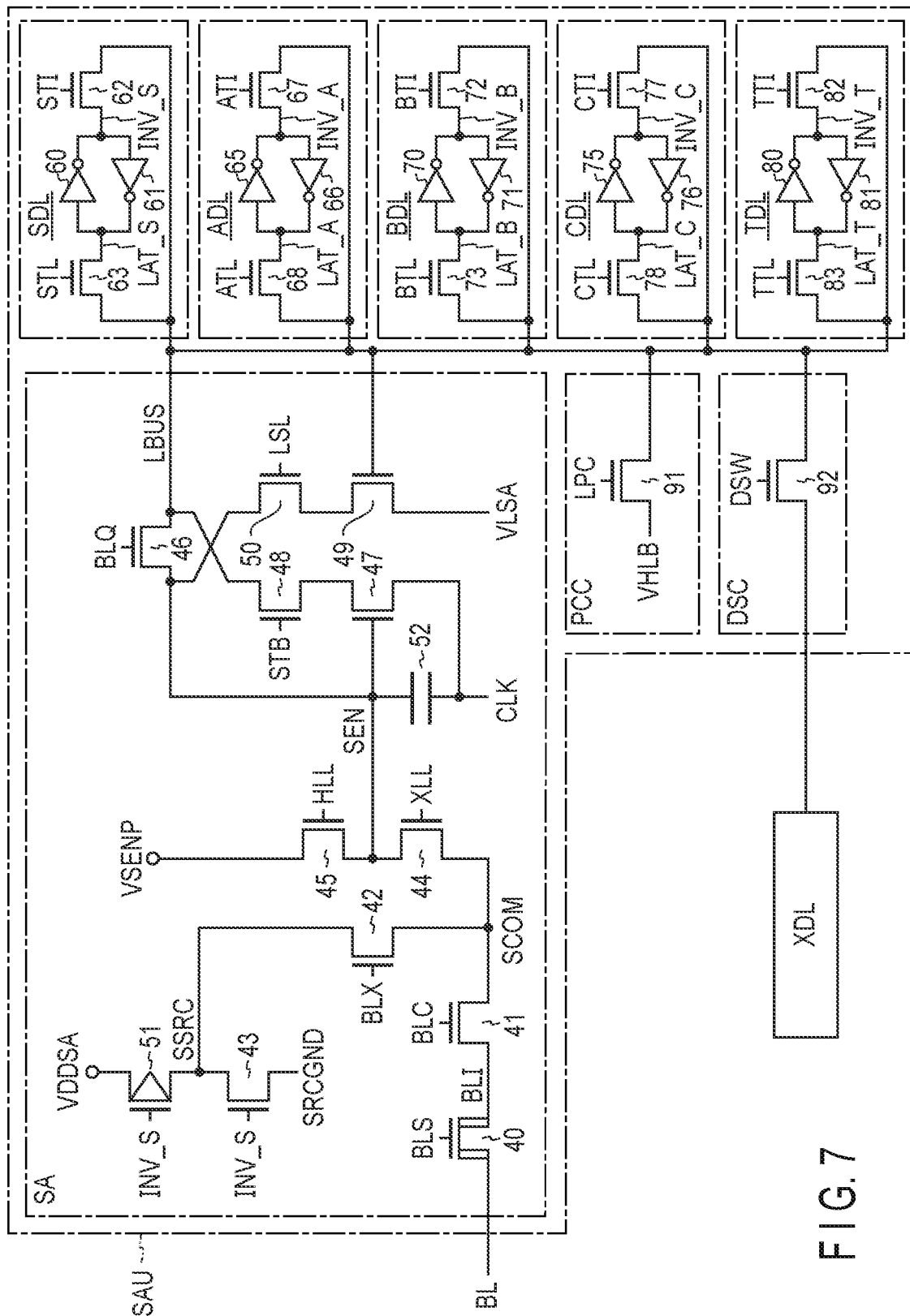
FIG. 7 is a circuit diagram of a sense amplifier unit included in the nonvolatile memory according to the first embodiment.

First, an example of a circuit configuration of the sense amplifier unit SAU is described with reference to FIG. 7. FIG. 7 is a circuit diagram of the sense amplifier unit SAU. In the following description, one of the source and the drain of the transistor is referred to as "one end of the transistor", and the other of the source and the drain is referred to as "the other end of the transistor".

As illustrated in FIG. 7, the sense amplifier unit SAU includes the sense circuit SA, five latch circuits (SDL, ADL, BDL, CDL, and TDL), a precharge circuit PCC, and a DBUS switch circuit DSC.

First, details of the circuit of the sense circuit SA are described. The sense circuit SA, at the time of the read operation, senses the data read to the corresponding bit line BL and determines whether the read data is "0" or "1". The sense circuit SA, during the write operation, applies a voltage to the bit line BL based on the write data. Furthermore, the sense circuit SA of the present embodiment can perform, for example, a logical product operation (AND operation), a logical sum operation (OR operation), or an exclusive logical sum operation (XOR operation) by using the data stored in the latch circuits XDL, SDL, ADL, BDL, CDL, and TDL.

As illustrated, the sense circuit SA includes a high withstand voltage n-channel MOS transistor 40, low withstand voltage n-channel MOS transistors 41 to 50, a low withstand voltage p-channel MOS transistor 51, and a capacitor element 52.

In the transistor 40, a signal BLS is input to the gate, one end of the current path is connected to the corresponding bit line BL, and the other end of the current path is connected to a node BLI.

In the transistor 41, a signal BLC is input to the gate, one end of the current path is connected to the node BLI, and the other end of the current path is connected to a node SCOM. The transistor 41 is a transistor for clamping the corresponding bit line BL to a potential corresponding to the signal BLC.

In the transistor 42, a signal BLX is input to the gate, one end of the current path is connected to the node SCOM, and the other end of the current path is connected to a node SSRC.

In the transistor 43, the gate is connected to the node INV_S, one end of the current path is connected to the node SSRC, and the other end of the current path is connected to a node SRCGND. For example, a ground voltage VSS is applied to the node SRCGND.

In the transistor 51, the gate is connected to the node INV_S, a power supply voltage VDDSA is applied to one end of the current path, and the other end of the current path is connected to the node SSRC.

In the transistor 44, a signal XXL is input to the gate of, one end of the current path is connected to the node SCOM, and the other end of the current path is connected to a node SEN.

In the transistor 45, a signal HLL is input to a gate, a voltage VSENP is applied to one end of the current path, and the other end of the current path is connected to the node SEN.

In the transistor 46, a signal BLQ is input to the gate, one end of the current path is connected to the node SEN, and the other end of the current path is connected to the bus LBUS.

In the transistor 47, the gate is connected to the node SEN, one end of the current path is connected to one end of the current path of the transistor 48, and a clock CLK is input to the other end of the current path.

In the transistor 48, a signal STB is input to the gate, and the other end of the current path is connected to the bus LBUS.

In the transistor 49, the gate is connected to the bus LBUS, one end of the current path connected to one end of the current path of the transistor 50, and a voltage VLSA is applied to the other end of the current path. The voltage VLSA may be, for example, the ground voltage VSS.

In the transistor 50, a signal LSL is input to the gate, and the other end of the current path is connected to the node SEN.

In the capacitor element 52, one electrode is connected to the node SEN, and the clock CLK is input to the other electrode.

Next, an internal configuration of the latch circuit SDL is described. The latch circuit SDL includes inverters 60 and 61 and low withstand voltage n-channel MOS transistors 62 and 63.

An input node of the inverter 60 is connected to a node LAT_S. An output node of the inverter 60 is connected to the node INV_S.

An input node of the inverter 61 is connected to the node INV_S. An output node of the inverter 61 is connected to the node LAT_S.

One end of the transistor 62 is connected to the bus LBUS. The other end of the transistor 62 is connected to the node INV_S. A signal STI is input to the gate of the transistor 62.

One end of the transistor 63 is connected to the bus LBUS. The other end of the transistor 63 is connected to the node LAT_S. A signal STL is input to the gate of the transistor 63.

The latch circuit SDL stores data at the node LAT_S. Meanwhile, the latch circuit SDL stores inverted data of the data stored in the node LAT_S in the node INV_S.

Next, an internal configuration of the latch circuit ADL is described. The latch circuit ADL includes inverters 65 and 66 and low withstand voltage n-channel MOS transistors 67 and 68.

An input node of the inverter 65 is connected to a node LAT_A. An output node of the inverter 65 is connected to a node INV_A.

An input node of the inverter 66 is connected to the node INV_A. An output node of the inverter 66 is connected to the node LAT_A.

One end of the transistor 67 is connected to the bus LBUS. The other end of the transistor 67 is connected to the node INV_A. A signal ATI is input to the gate of the transistor 67.

One end of the transistor 68 is connected to the bus LBUS. The other end of the transistor 68 is connected to the node LAT_A. A signal ATL is input to the gate of the transistor 68.

The latch circuit ADL stores data at the node LAT_A. Meanwhile, the latch circuit ADL stores inverted data of the data stored in the node LAT_A in the node INV_A.

Next, an internal configuration of the latch circuit BDL is described. The latch circuit BDL includes inverters 70 and 71 and low withstand voltage n-channel MOS transistors 72 and 73.

An input node of the inverter 70 is connected to a node LAT_B. An output node of the inverter 70 is connected to a node INV_B.

An input node of the inverter 71 is connected to the node INV_B. An output node of the inverter 71 is connected to the node LAT_B.

One end of the transistor 72 is connected to the bus LBUS. The other end of the transistor 72 is connected to the node INV_B. A signal BTI is input to the gate of the transistor 72.

One end of the transistor 73 is connected to the bus LBUS. The other end of the transistor 73 is connected to the node LAT_B. A signal BTL is input to the gate of the transistor 73.

The latch circuit BDL stores data at the node LAT_B. Meanwhile, the latch circuit BDL stores inverted data of the data stored in the node LAT_B in the node INV_B.

Next, an internal configuration of the latch circuit CDL is described. The latch circuit CDL includes inverters 75 and 76 and low withstand voltage n-channel MOS transistors 77 and 78.

An input node of the inverter 75 is connected to a node LAT_C. An output node of the inverter 75 is connected to a node INV_C.

An input node of the inverter 76 is connected to the node INV_C. An output node of the inverter 76 is connected to the node LAT_C.

One end of the transistor 77 is connected to the bus LBUS. The other end of the transistor 77 is connected to the node INV_C. A signal CTI is input to the gate of the transistor 77.

One end of the transistor 78 is connected to the bus LBUS. The other end of the transistor 78 is connected to the node LAT_C. A signal CTL is input to the gate of the transistor 78.

The latch circuit CDL stores data at the node LAT_C. Meanwhile, the latch circuit CDL stores inverted data of the data stored in the node LAT_C in the node INV_C.

Next, an internal configuration of the latch circuit TDL is described. The latch circuit TDL includes inverters 80 and 81 and low withstand voltage n-channel MOS transistors 82 and 83.

An input node of the inverter 80 is connected to a node LAT_T. An output node of the inverter 80 is connected to a node INV_T.

An input node of the inverter 81 is connected to the node INV_T. An output node of the inverter 81 is connected to the node LAT_T.

One end of the transistor 82 is connected to the bus LBUS. The other end of the transistor 82 is connected to the node INV_T. A signal TTI is input to the gate of the transistor 82.

One end of the transistor 83 is connected to the bus LBUS. The other end of the transistor 83 is connected to the node LAT_T. A signal TTL is input to the gate of the transistor 83.

The latch circuit TDL stores data at the node LAT_T. Meanwhile, the latch circuit TDL stores inverted data of the data stored in the node LAT_T in the node INV_T.

Next, the precharge circuit PCC is described. The precharge circuit PCC is a precharge circuit of the bus LBUS. The precharge circuit PCC includes a low withstand voltage n-channel MOS transistor 91. A voltage VHLB is applied to one end of the transistor 91. The voltage VHLB is a precharge voltage. The other end of the transistor 91 is connected to the bus LBUS. A signal LPC is input to the gate of the transistor 91. For example, when the transistor 91 is in an on state, the precharge circuit PCC charges the bus LBUS with the voltage at the "H" level.

Next, the DBUS switch circuit DSC is described. The DBUS switch circuit DSC is a circuit that connects the sense amplifier unit SAU and a bus DBUS. In other words, the DBUS switch circuit DSC connects the sense amplifier unit SAU and the latch circuit XDL. The DBUS switch circuit DSC includes a low withstand voltage n-channel MOS transistor 92. One end of the transistor 92 is connected to the bus LBUS. The other end of the transistor 92 is connected to the bus DBUS. A signal DSW is input to the gate of the transistor 92. For example, when the transistor 92 is in an on state, the sense amplifier unit SAU and the latch circuit XDL are electrically connected.

Note that various signals in the sense amplifier unit SAU having the above configuration are controlled, for example, by the sequencer 206.

Operation Process Using Sense Circuit SA

Next, an example of an AND operation, an OR operation, and an XOR operation using the sense circuit SA is described.

AND Operation Process

First, the AND operation is described. Hereinafter, as an example of the AND operation, a case where an AND operation of the data stored in the latch circuit BDL and the data stored in the latch circuit CDL is performed, and the result thereof is stored in the latch circuit SDL is described. FIG. 8 illustrates data stored by the latch circuits BDL, CDL, and SDL, the node SEN, and the bus LBUS for each process of the AND operation. Table (a) in FIG. 8 illustrates a process of operation in a case where the latch circuits BDL and CDL store data of "1". Table (b) illustrates a process of operation in a case where the latch circuit BDL stores data of "1" and the latch circuit CDL stores data of "0". Table (c) illustrates a process of operation in a case where the latch circuit BDL stores data of "0" and the latch circuit CDL stores data of "1". Table (d) illustrates a process of operation in a case where the latch circuits BDL and CDL store data of "O". In FIG. 8, the notation "1" indicates a signal (voltage) at the "H" level, and the notation "0" indicates a signal (voltage) at the "L" level. In the table of FIG. 8, hatched fields indicate operation results in each step. Further, "/" indicates inverted data.

First, the sequencer 206 sets the signals LPC and BLQ to the "H" level and turns on the transistors 91 and 46 (step 0). As a result, the bus LBUS and the node SEN are precharged to the "H" level (data of "1"). After the precharging, the sequencer 206 sets the signals LPC and BLQ to the "L" level.

Next, the sequencer 206 sets the signal BTL to the "H" level and turns on the transistor 73 (step 1). As a result, when the node LAT_B stores data of "1" (the latch circuit BDL stores data of "1"), the bus LBUS stores data of "1" ((a) and (b) in FIG. 8). Meanwhile, when the node LAT_B stores data of "0" (the latch circuit BDL stores data of "0"), the bus LBUS stores data of "0" ((c) and (d) in FIG. 8).

Next, the sequencer 206 sets the signal LSL to the "H" level and turns on the transistor 50 (step 2). Then, in a case where the bus LBUS stores data of "1", the transistor 49 is turned on, and thus the node SEN stores data of "0" ((a) and (b) in FIG. 8). Meanwhile, in a case where the bus LBUS stores data of "0", the transistor 49 is turned off, and the node SEN stores data of "1" ((c) and (d) in FIG. 8). That is, when the latch circuit BDL stores data of "1", the node SEN stores data of "0", and when the latch circuit BDL stores data of "0", the node SEN stores data of "1".

Next, after precharging the bus LBUS, the sequencer 206 sets the signal CTL to the "H" level and turns on the transistor 78 (step 3). As a result, when the node LAT_C stores data of "1" (the latch circuit CDL stores data of "1"), the bus LBUS stores data of "1" ((a) and (c) in FIG. 8). Meanwhile, when the node LAT_C stores data of "0" (the latch circuit CDL stores data of "0"), the bus LBUS stores data of "0" ((b) and (d) in FIG. 8).

Next, the sequencer 206 stops the supply of the power supply voltage to the inverter 75 of the latch circuit CDL (step 4). That is, the sequencer 206 stops the voltage supply to the node LAT_C.

Next, the sequencer 206 sets the signal STB to the "H" level and turns on the transistor 48 (step 5). Then, in a case where the node SEN stores data of "1" ((c) and (d) in FIG. 8), the transistor 47 is turned on, and thus the bus LBUS stores data of "0". Meanwhile, in a case where the node SEN stores data of "O" ((a) and (b) in FIG. 8), the transistor 47 is turned off, and the bus LBUS maintains the state of data of "0" or "1". Therefore, in a case where the node SEN stores "0" and the bus LBUS stores data of "1" (in a case where both the latch circuits BDL and CDL stores data of "1" ((a) in FIG. 8)), the bus LBUS stores data of "1", and in other cases ((b) to (d) in FIG. 8), the bus LBUS stores data of "0". That is, the bus LBUS stores the result of the AND operation of the data of the latch circuits BDL and CDL.

Next, the sequencer 206 sets the signal STL to the "H" level to turn on the transistor 63 and stores the data of the bus LBUS in the latch circuit SDL (step 6).

Regarding of OR Operation Process

Next, the OR operation is described with reference to FIG. 9. Table (a) in FIG. 9 illustrates a process of operation in a case where the latch circuits BDL and CDL store data of "1". Table (b) illustrates a process of operation in a case where the latch circuit BDL stores data of "1" and the latch circuit CDL stores data of "0". Table (c) illustrates a process of operation in a case where the latch circuit BDL stores data of "0" and the latch circuit CDL stores data of "1". Table (d) illustrates a process of operation in a case where the latch circuits BDL and CDL store data of "0". Hereinafter, only differences from the AND operation are described.

First, similarly to the case of the AND operation, the sequencer 206 precharges the bus LBUS and the node SEN to the "H" level (data of "1") (step 0).

Next, the sequencer 206 sets the signal BTI to the "H" level and turns on the transistor 72 (step 1). Accordingly, when the node INV_B stores data of "0", the bus LBUS stores data of "0". Meanwhile, in a case where the node INV_B stores data of "1", the bus LBUS stores data of "1". That is, in a case where the data of the latch circuit BDL is "1" ((a) and (b) in FIG. 9), the bus LBUS stores data of "0", and in a case where the data of the latch circuit BDL is "0" ((c) and (d) in FIG. 9), the bus LBUS stores data of "1".

Next, similarly to the case of the AND operation, the sequencer 206 sets the signal LSL to the "H" level and turns on the transistor 50 (step 2). In the OR operation, in a case where the data of the latch circuit BDL is "1" ((a) and (b) in FIG. 9), the node SEN stores data of "1". Meanwhile, in a case where the data of the latch circuit BDL is "0" ((c) and (d) in FIG. 9), the node SEN stores data of "0".

Next, after precharging the bus LBUS, the sequencer 206 sets the signal CTI to the "H" level and turns on the transistor 77 (step 3). Accordingly, in a case where the node INV_C stores data of "0", the bus LBUS stores data of "0". Meanwhile, in a case where the node INV_C stores data of "1", the bus LBUS stores data of "1". That is, in a case where the data of the latch circuit CDL is "1" ((a) and (c) in FIG. 9), the bus LBUS stores data of "0", and in a case where the data of the latch circuit CDL is "0" ((b) and (d) in FIG. 9), the bus LBUS stores data of "1".

Next, the sequencer 206 stops the supply of the power supply voltage to the inverter 75 of the latch circuit CDL (step 4). That is, the sequencer 206 stops the voltage supply to the node INV_C.

Next, similarly to the case of the AND operation, the sequencer 206 sets the signal STB to the "H" level and turns on the transistor 48 (step 5). In a case where the node SEN stores data of "1" ((a) and (b) in FIG. 9), the transistor 47 is turned on, and thus the bus LBUS stores data of "0". Meanwhile, in a case where the node SEN stores data of "0" ((c) and (d) in FIG. 9), the transistor 47 is turned off, and the bus LBUS maintains the state of data of "0" or "1". Therefore, in the bus LBUS, in a case where the node SEN stores data of "0" and the bus LBUS stores data of "1", that is, in a case where both the latch circuits BDL and CDL store data of "0" ((d) in FIG. 9), data of "1" is stored, and in other cases ((a) to (c) in FIG. 9), data of "0" is stored. That is, the bus LBUS stores the inverted data of the OR operation of the data of the latch circuits BDL and CDL.

Next, the sequencer 206 sets the signal STI to the "H" level to turn on the transistor 62 and stores the inverted data of the bus LBUS in the latch circuit SDL (step 6).

Regarding XOR Operation Process

Next, the XOR operation is described with reference to FIGS. 10 and 11. Table (a) in FIG. 10 illustrates a process of operation in a case where the latch circuits BDL and CDL store data of "1". Table (b) illustrates a process of operation in a case where the latch circuit BDL stores data of "1" and the latch circuit CDL stores data of "0". Table (c) in FIG. 11 illustrates a process of operation in a case where the latch circuit BDL stores data of "0" and the latch circuit CDL stores data of "1". Table (d) illustrates a process of operation in a case where the latch circuits BDL and CDL store data of "0". Hereinafter, only differences from the AND operation and the OR operation are described. In the examples of FIGS. 10 and 11, the bus LBUS is omitted to simplify the description.

First, similarly to the case of the AND operation and the OR operation, the sequencer 206 precharges the bus LBUS and the node SEN to the "H" level (data of "1") (step 0).

Next, the sequencer 206 sets the signal BTI to the "H" level and turns on the transistor 72. As a result, the inverted data of the latch circuit BDL (data of the node INV_B) is transferred to the bus LBUS. For example, in a case where the node INV_B stores data of "1" (data of "H" level), the transistor 49 is turned on. Meanwhile, in a case where the node INV_B stores data of "0" (data of "L" level), the transistor 49 is turned off. Next, the sequencer 206 sets the signal LSL to the "H" level and turns on the transistor 50. As a result, the node SEN stores AND data of the latch circuit BDL and the node SEN (SEN=BDL & SEN) (step 1). For example, when the data of the latch circuit BDL is "1", that is, when the node INV_B stores data of "0", the node SEN stores data of "1" ((a) and (b) in FIG. 10). Meanwhile, when the data of the latch circuit BDL is "0", that is, when the node LAT_B stores data of "0", the node SEN stores data of "0" ((c) and (d) in FIG. 11).

Next, the sequencer 206 sets the signal CTI to the "H" level and turns on the transistor 77. As a result, the inverted data of the latch circuit CDL (data of the node INV_C) is transferred to the bus LBUS. Next, the sequencer 206 sets the signal STL to the "H" level and turns on the transistor 63. As a result, the inverted data of the latch circuit CDL is stored in the latch circuit SDL (SDL=/CDL) (step 2). When the data of the latch circuit CDL is "1", the latch circuit SDL stores data of "0" ((a) in FIG. 10 and (c) in FIG. 11). Meanwhile, in a case where the data of the latch circuit CDL is "1", the latch circuit SDL stores data of "1" ((b) in FIG. 10 and (d) in FIG. 11).

Next, the sequencer 206 sets the signal STB to the "H" level and turns on the transistor 48. As a result, the inverted data of the node SEN is transferred to the bus LBUS. Next, the sequencer 206 sets the signal STL to the "H" level and turns on the transistor 63. As a result, the latch circuit SDL stores OR data of the inverted data of the latch circuit SDL and the node SEN as the inverted data (/SDL=/SDL|SEN) (step 3). In other words, the latch circuit SDL stores AND data of the latch circuit SDL and inverted data of the node SEN (SDL=SDL &/SEN). For example, in a case where the node SEN stores data of "0", and the data of the latch circuit SDL is "1", the latch circuit SDL stores data of "1" ((d) in FIG. 11). In the other cases, the latch circuit SDL stores data of "0" ((a), (b), and (c) in FIG. 11).

Next, the sequencer 206 sets the signal CTI to the "H" level and turns on the transistor 77. As a result, the inverted data of the latch circuit CDL (data of the node INV_C) is transferred to the bus LBUS. Next, the sequencer 206 sets the signal LSL to the "H" level and turns on the transistor 50. As a result, the node SEN stores AND data of the latch circuit CDL and the node SEN (SEN=CDL & SEN) (step 4). For example, in a case where the node SEN stores data of "1" and the data of the latch circuit CDL is "1", the node SEN stores data of "1" ((a) in FIG. 10). In the other cases, the node SEN stores data of "0" ((b) in FIG. 10, and (c) and (d) in FIG. 11).

Next, the sequencer 206 sets the signal STB to the "H" level and turns on the transistor 48. As a result, the inverted data of the node SEN is transferred to the bus LBUS. Next, the sequencer 206 sets the signal STI to the "H" level and turns on the transistor 62. As a result, the latch circuit SDL stores OR data of the latch circuit SDL and the node SEN (SDL=SDL|SEN) (step 5). For example, in a case where the node SEN stores data of "1" ((a) in FIG. 10) or in a case where the data of the latch circuit SDL is "1" ((d) in FIG. 11), the latch circuit SDL stores data of "1". In the other cases, the latch circuit SDL stores data of "0" ((b) in FIG. 10 and (c) in FIG. 11).

Next, the sequencer 206 temporarily transfers the data of the latch circuit SDL to the node SEN and stores inverted data thereof (SDL=/SDL) (step 6). More specifically, for example, the sequencer 206 sets the signal STI to the "H" level and turns on the transistor 62 in a state where the node SEN is precharged. As a result, the inverted data of the latch circuit SDL (data of the node INV_S) is transferred to the bus LBUS. Next, the sequencer 206 sets the signal LSL to the "H" level and turns on the transistor 50. As a result, the node SEN stores the data of the latch circuit SDL. Next, the sequencer 206 sets the signal STB to the "H" level and turns on the transistor 48. As a result, the inverted data of the node SEN is transferred to the bus LBUS. Next, the sequencer 206 sets the signal STL to the "H" level and turns on the transistor 63. As a result, the latch circuit SDL stores inverted data of the node SEN. That is, the latch circuit SDL stores the results of the XOR operation of the data of the latch circuits BDL and CDL.

Threshold Voltage Distribution of Memory Cell Transistor

Next, a threshold voltage distribution that can be taken by the memory cell transistor MC is described. Hereinafter, a case where the memory cell transistor MC is a TLC is described, but the present embodiment can be applied as long as the memory cell transistor MC can store data of two bits or more.

Figure 12:
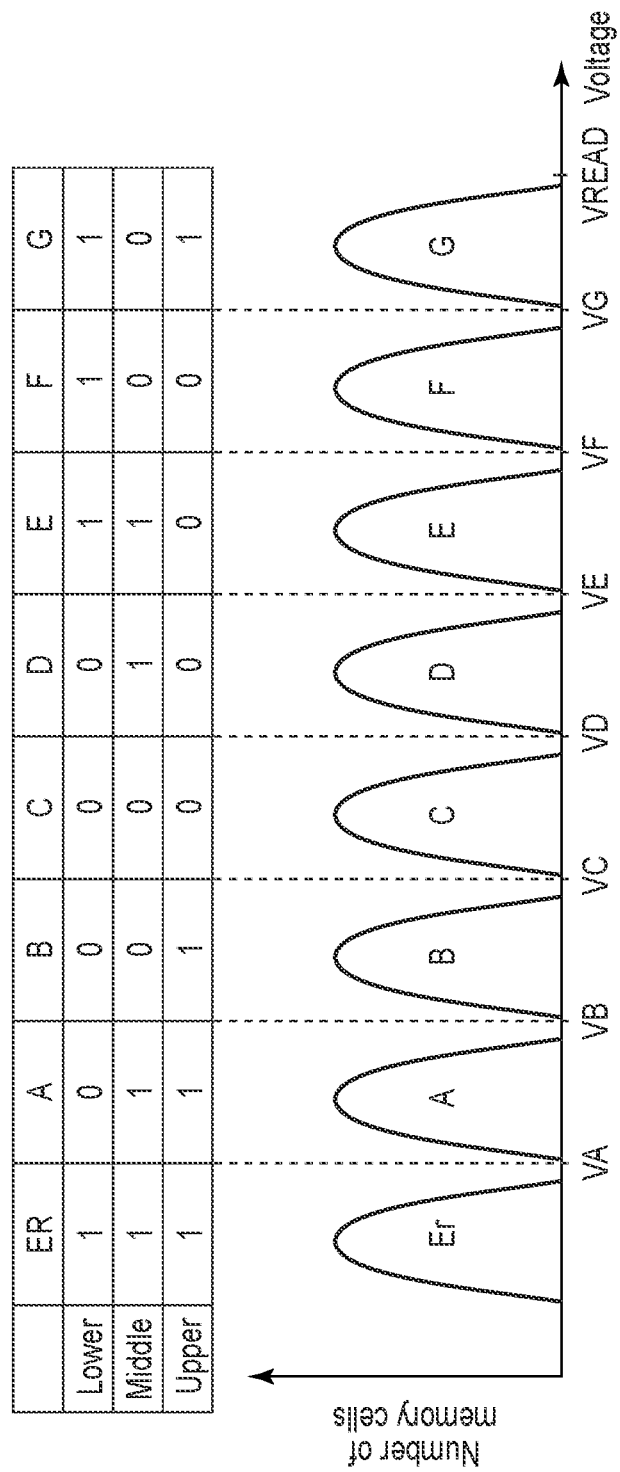
FIG. 12 is a diagram illustrating relationships between data allocation and threshold voltage distributions of TLC included in the nonvolatile memory according to the first embodiment.

Relationship Between Threshold Voltage Distribution of Memory Cell Transistor and Data Allocation First, an example of the relationship between the data allocation and the threshold voltage distribution of the memory cell transistor MC is described with reference to FIG. 12. FIG. 12 is a diagram illustrating a relationship between the threshold voltage distribution of the TLC and the data allocation.

As illustrated in FIG. 12, for example, the threshold voltage of each memory cell transistor MC takes a value included in any of eight discrete distributions. Hereinafter, the eight distributions are referred to as an "Er" state, an "A" state, a "B" state, a "C" state, a "D" state, an "E" state, an "F" state, and a "G" state in ascending order of the threshold voltage.

The "Er" state corresponds, for example, to a data erase state. Then, the "A" to "G" states correspond to a state in which charges are injected into the charge storage layer and data is written. In the write operation, verification voltages corresponding to the threshold voltage distributions are VA to VG. Then, these voltage values have a relationship of VA<VB<VC<VD<VE<VF<VG<VREAD. The voltage VREAD is a voltage applied to the word line WL connected to the cell unit CU not to be read during the read operation. When the voltage VREAD is applied to the gate of the memory cell transistor MC, the memory cell transistor MC is turned on regardless of the stored data.

In the write operation, the verification voltages corresponding to the threshold voltage distributions are set to VA to VG, but the method of determining the voltages VA to VG is not limited thereto. For example, the voltages VA to VG are written in the ROM fuse of the nonvolatile memory 20 (this is referred to as a default voltage). After shipment of the memory system 3, the CPU 12 may read the voltages VA to VG from the ROM fuse. In addition, the CPU 12 may update the voltages VA to VG read from the ROM fuse of the nonvolatile memory 20 and store the updated voltages in any block BLK of the nonvolatile memory 20. In addition, the CPU 12 can update the voltages VA to VG along with the performing of the shift reading and the tracking operation. For example, the CPU 12 performs the shift reading and the tracking operation in patrol read.

The shift reading means that the CPU 12 shifts the read voltage and attempts to read data from the nonvolatile memory 20 again. At this time, the CPU 12 may update the voltages VA to VG by storing information on the shift amount from the default voltage.

In the tracking operation, in a case where the adjacent threshold voltage distributions overlap each other, the CPU 12 obtains the intersection of the overlapped threshold voltage distributions and calculates an appropriate read voltage, that is, a shift amount from the obtained intersection.

Alternatively, the tracking operation is a process of searching for a voltage at which the number of fail bits in the ECC circuit 16 is minimized or a voltage that enables error correction by the ECC circuit 16 when the read voltage is changed instead of the intersection.

The relationship between each state and the voltages VA to VG is described in detail. The threshold voltage included in the "Er" state is less than the voltage VA. The threshold voltage included in the "A" state is the voltage VA or more and less than the voltage VB. The threshold voltage included in the "B" state is the voltage VB or more and less than the voltage VC. The threshold voltage included in the "C" state is the voltage VC or more and less than the voltage VD. The threshold voltage included in the "D" state is the voltage VD or more and less than the voltage VE. The threshold voltage included in the "E" state is the voltage VE or more and less than the voltage VF. The threshold voltage included in the "F" state is the voltage VF or more and less than the voltage VG. Also, the threshold voltage included in the "G" state is the voltage VG or more and less than the voltage VREAD.

As described above, each memory cell transistor MC has any one of the eight threshold voltage distributions and thus can take eight types of states. By assigning these states to "000" to "111" in binary notation, each memory cell transistor MC can store the 3-bit data. Hereinafter, the 3-bit data are referred to as a lower bit, a middle bit, and an upper bit, respectively. Further, a set of lower bits collectively written to (or read from) the cell unit CU is referred to as a lower page. A set of middle bits is referred to as a middle page. A set of upper bits is referred to as an upper page. When any of the lower page, the middle page, and the upper page is not limited, it is simply referred to as a "page".

For example, in the case of the read operation of the lower page, data read by the read voltage VA is stored in, for example, the latch circuit ADL. Subsequently, the data read at the read voltage VE is logically operated with the data in the latch circuit ADL in the operation unit OP, and the result is stored in the latch circuit ADL. The stored data is transmitted to the memory controller 10 via the latch circuit XDL as read data of the lower page.

In the case of the read operation of the middle page, data read by the read voltage VB is stored, for example, in the latch circuit BDL. Subsequently, the data read at the read voltage VD is logically operated with the data in the latch circuit BDL in the operation unit OP, and the result is stored in the latch circuit BDL. Further, the data read at the read voltage VF is logically operated with the data in the latch circuit BDL in the operation unit OP, and the result is stored in the latch circuit BDL. The stored data is transmitted to the memory controller 10 via the latch circuit XDL as read data of the middle page.

In the case of the read operation of the upper page, data read by the read voltage VC is stored, for example, in the latch circuit CDL. Subsequently, the data read at the read voltage VG is logically operated with the data in the latch circuit CDL in the operation unit OP, and the result is stored in the latch circuit CDL. The stored data is transmitted to the memory controller 10 via the latch circuit XDL as read data of the upper page.

In the example of FIG. 12, data is allocated to the memory cell transistors MC included in each threshold voltage distribution as follows in "upper bit/middle bit/lower bit".

"Er" State: data of "111"
"A" State: data of "110"
"B" State: data of "100"
"C" State: data of "000"
"D" State: data of "010"
"E" State: data of "011"
"F" State: data of "001"
"G" State: data of "101"

In a case where the data allocated as described above is read, the lower bit is determined by the read operation corresponding to the "A" state and the "E" state. The middle bit is determined by the read operation corresponding to the "B" state, the "D" state, and the "F" state. The upper bit is determined by the read operation corresponding to the "C" state and the "G" state. That is, the values of the lower bit, the middle bit, and the upper bit are determined by read operations corresponding to two states, three states, and two states, respectively. Hereinafter, such data allocation is referred to as a "2-3-2 code". Note that the data allocation to the "Er" to "G" states is not limited to the 2-3-2 code.

Specific Examples of Hard Bit Data and Soft Bit Data

Next, specific examples of the hard bit data HB and the soft bit data SB are described with reference to FIG. 13. FIG. 13 is a diagram illustrating an example of relationships between threshold voltage distributions of an "Er" state and an "A" state, and the hard bit data HB and the soft bit data SB.

As illustrated in FIG. 13, due to the influence of read disturb, data retention, or the like, the width of the threshold voltage distribution of each state may be expanded, and parts of the tails may overlap each other between adjacent threshold voltage distributions (shaded region in FIG. 13). In such a case, when the read operation is performed, the memory cell transistor MC corresponding to the overlapping region of the tails is highly likely to be a fail bit. More specifically, for example, when the read operation corresponding to the "A" state is performed with the voltage VA, the memory cell transistor MC of the "Er" state having a threshold voltage equal to or higher than the voltage VA and the memory cell transistor MC of the "A" state having a threshold voltage lower than the voltage VA become fail bits. If the number of generated fail bits exceeds the number of error correctable bits of the ECC circuit 16, it is difficult to correctly read data.

Therefore, in the present embodiment, in the read operation of one state, two read voltages sandwiching the overlapping region of the tails of the threshold voltage distributions are set. More specifically, two read voltages VAL and VAH are set for the "A" state. The voltage VAL is a voltage less than the voltage VA. The voltage VAH is a voltage higher than the voltage VA. A region where the "Er" state and the "A" state overlap is located between the voltage VAL and the voltage VAH. The magnitude of the voltage difference between the voltage VAL and the voltage VA may be the same as or different from the magnitude of the voltage difference between the voltage VA and the voltage VAH.

When the voltage VA is shifted by the memory controller 10, the voltage VAL and the voltage VAH are also shifted based on the shift amount of the voltage VA. Thus, the voltage VAL and the voltage VAH are determined based on the voltage VA. Therefore, the voltage VAL is given by (VA−α). The voltage VAH is given by (VA+β). α and β are predetermined values. B may be the same value as a or may be a value different from a.

For example, in the read operation using the voltage VAL, the data of the memory cell transistor MC having the threshold voltage less than the voltage VAL is "1". Data of the memory cell transistor MC having the threshold voltage equal to or higher than the voltage VAL is "0".

Also, in the read operation using the voltage VAH, the data of the memory cell transistor MC having the threshold voltage less than the voltage VAH is "1". Data of the memory cell transistor MC having the threshold voltage equal to or higher than the voltage VAH is "0".

In the present embodiment, in the two read voltages corresponding to one state, read data based on the lower read voltage is defined as the hard bit data HB.

The soft bit data SB is calculated by an exclusive OR (XOR) operation of two pieces of read data. In the example of FIG. 13, the soft bit data SB of the memory cell transistor MC having the threshold voltage lower than the voltage VAL is "0". The soft bit data SB of the memory cell transistor MC having the threshold voltage equal to or higher than the voltage VAL and lower than the voltage VAH is "1". The soft bit data SB of the memory cell transistor MC having the threshold voltage equal to or higher than the voltage VAH is "0". The operation of the soft bit data SB is not limited to the XOR operation. The operation of the soft bit data SB can be set based on the definition of the soft bit data SB. For example, in a case where the soft bit data SB of the memory cell transistor MC having the threshold voltage equal to or higher than the voltage VAL and lower than the voltage VAH is defined as "0", an exclusive NOR (XNOR) operation may be used for the calculation of the soft bit data SB.

Therefore, the soft bit data SB indicates whether the threshold voltage of the memory cell transistor MC is located near the boundary between two adjacent threshold voltage distributions. By referring to the hard bit data HB and the soft bit data SB, information on whether the threshold voltage of the memory cell transistor MC is located at the tail of the threshold voltage distribution of the target state can be acquired.

Hard Bits and Compressed Soft Bits of Each State

Figure 14:
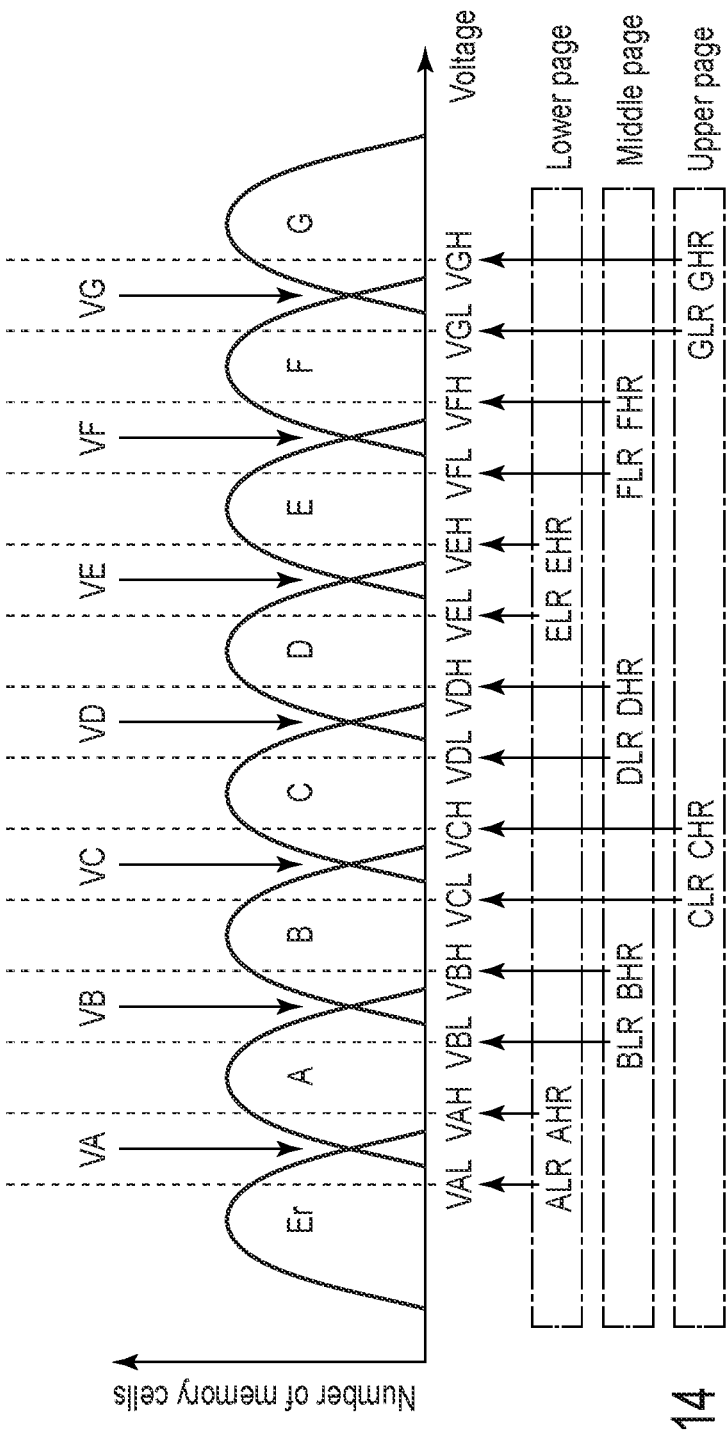
FIG. 14 is a diagram illustrating relationships between the threshold voltage distributions of the TLC and the hard bit data and compressed soft bit data in the memory system according to the first embodiment.

Next, the hard bit data HB and the compressed soft bit data SB of each state are described with reference to FIG. 14. FIG. 14 is a diagram illustrating a relationship between the threshold voltage distribution of the TLC and the hard bit data HB and the compressed soft bit data SB.

As illustrated in FIG. 14, the two read voltages corresponding to the "A" state are the voltage VAL and the voltage VAH. Two read voltages corresponding to the "B" state are set as a voltage VBL and a voltage VBH. Two read voltages corresponding to the "C" state are set as a voltage VCL and a voltage VCH. Two read voltages corresponding to the "D" state are set as a voltage VDL and a voltage VDH. Two read voltages corresponding to the "E" state are set as a voltage VEL and a voltage VEH. Two read voltages corresponding to the "F" state are set as a voltage VFL and a voltage VFH. Two read voltages corresponding to the "G" state are set as a voltage VGL and a voltage VGH. These voltages are in a relationship of VAL<VA<VAH<VBL<VB<VBH<VCL<VC<VCH<VDL<VD<VDH<VEL<VE<VEH<VFL<VF<VFH<VGL<VG<VGH<VREAD. The read operations using the voltage VAL, the voltage VAH, the voltage VBL, the voltage VBH, the voltage VCL, the voltage VCH, the voltage VDL, the voltage VDH, the voltage VEL, the voltage VEH, the voltage VFL, the voltage VFH, the voltage VGL, and the voltage VGH are referred to as ALR reading, AHR reading, BLR reading, BHR reading, CLR reading, CHR reading, DLR reading, DHR reading, ELR reading, EHR reading, FLR reading, FHR reading, GLR reading, and GHR reading, respectively.

In the read operation of the lower page, four read operations of the ALR reading, the AHR reading, the ELR reading, and the EHR reading are performed. The hard bit data HB_L is data determined by the ALR reading and the ELR reading. The soft bit data SB_L is based on the hard bit data HB_L and data determined by the AHR reading and the EHR reading.

For example, in the case of the read operation of the hard bit data of the lower page, data read by the read voltage VAL is stored in, for example, the latch circuit ADL. Subsequently, the data read at the read voltage VEL is logically operated with the data in the latch circuit ADL in the operation unit OP, and the result is stored in the latch circuit ADL as the hard bit data HB_L.

Also, for example, in the case of the read operation of the soft bit data of the lower page, data read by the read voltage VAH is stored, for example, in the latch circuit TDL. Subsequently, the data read at the read voltage VEH is logically operated with the data in the latch circuit TDL in the operation unit OP, and the result is stored in the latch circuit TDL. Thereafter, the operation unit OP performs an XOR operation on the data stored in the latch circuit ADL and the data stored in the latch circuit TDL and stores the operation result, for example, in the latch circuit TDL as the soft bit data SB_L.

In the read operation of the middle page, six read operation of the BLR reading, the BHR reading, the DLR reading, the DHR reading, the FLR reading, and the FHR reading are performed. The hard bit data HB_M is data determined by the BLR reading, the DLR reading, and the FLR reading. The soft bit data SB_M is based on the hard bit data HB_M and data determined by the BHR reading, the DHR reading, and the FHR reading.

For example, in the case of the read operation of the hard bit data of the middle page, data read by the read voltage VBL is stored in, for example, the latch circuit BDL. Subsequently, the data read at the read voltage VDL is logically operated with the data in the latch circuit BDL in the operation unit OP, and the result is stored in the latch circuit BDL. Further, the data read at the read voltage VFL is logically operated with the data in the latch circuit BDL in the operation unit OP, and the result is stored in the latch circuit BDL as the hard bit data HB_M. Also, for example, in the case of the read operation of the soft bit data of the middle page, data read by the read voltage VBH is stored, for example, in the latch circuit SDL. Subsequently, the data read at the read voltage VDH is logically operated with the data in the latch circuit SDL in the operation unit OP, and the result is stored in the latch circuit SDL. Further, the data read at the read voltage VFH is logically operated with the data in the latch circuit SDL in the operation unit OP, and the result is stored in the latch circuit SDL. Thereafter, the operation unit OP performs an XOR operation on the hard bit data HB_M stored in the latch circuit BDL and the data stored in the latch circuit SDL, thereby calculating the soft bit data SB_M.

When the compressed soft bit is calculated, the calculated soft bit data SB_M is subjected to an OR operation with the soft bit data SB_L stored in the latch circuit TDL in the operation unit OP, and the result of the OR operation is stored in the latch circuit TDL.

In the read operation of the upper page, four read operations of the CLR reading, the CHR reading, the GLR reading, and the GHR reading are performed. The hard bit data HB_U is data determined by the CLR reading and the GLR reading. The soft bit data SB_U is based on the hard bit data HB_U and data determined by the CHR reading and the GHR reading.

For example, in the case of the read operation of the hard bit data of the upper page, data read by the read voltage VCL is stored in, for example, the latch circuit CDL. Subsequently, the data read at the read voltage VGL is logically operated with the data in the latch circuit CDL in the operation unit OP, and the result is stored in the latch circuit CDL as the hard bit data HB_U.

Also, for example, in the case of the read operation of the soft bit data of the upper page, data read by the read voltage VCH is stored, for example, in the latch circuit SDL. Subsequently, the data read at the read voltage VGH is logically operated with the data in the latch circuit SDL in the operation unit OP, and the result is stored in the latch circuit SDL. Thereafter, the operation unit OP performs an XOR operation on the data stored in the latch circuit CDL and the data stored in the latch circuit SDL and calculates the operation result as the soft bit data SB_U.

When the compressed soft bit is calculated, the calculated soft bit data SB_U is subjected to an OR operation with an OR operation result of the soft bit data SB_L and the soft bit data SB_M stored in the latch circuit TDL in the operation unit OP, and a result of the OR operation of the soft bit data SB_L, the soft bit data SB_M, and the soft bit data SB_U is stored in the latch circuit TDL as the compressed soft bit data SB.

As described above, the compressed soft bit data SB is data calculated from the soft bit data SB_L, SB_M, and SB_U.

In the example of FIG. 14, the threshold voltage of the memory cell transistor MC is divided into 15 sections corresponding to 14 read voltages. More specifically, the threshold voltage of a section D1 is less than voltage VAL. The threshold voltage of a section D2 is equal to or more than the voltage VAL and less than voltage VAH. The threshold voltage of a section D3 is equal to or more than the voltage VAH and less than voltage VBL. The threshold voltage of a section D4 is equal to or more than the voltage VBL and less than voltage VBH. The threshold voltage of a section D5 is equal to or more than the voltage VBH and less than voltage VCL. The threshold voltage of a section D6 is equal to or more than the voltage VCL and less than voltage VCH. The threshold voltage of a section D7 is equal to or more than the voltage VCH and less than voltage VDL. The threshold voltage of a section D8 is equal to or more than the voltage VDL and less than voltage VDH. The threshold voltage of a section D9 is equal to or more than the voltage VDH and less than voltage VEL. The threshold voltage of a section D10 is equal to or more than the voltage VEL and less than voltage VEH. The threshold voltage of a section D11 is equal to or more than the voltage VEH and less than voltage VFL. The threshold voltage of a section D12 is equal to or more than the voltage VFL and less than voltage VFH. The threshold voltage of a section D13 is equal to or more than the voltage VFH and less than voltage VGL. The threshold voltage of a section D14 is equal to or more than the voltage VGL and less than voltage VGH. The threshold voltage of a section D15 is equal to or more than the voltage VGH and less than voltage VREAD.

The combination of the "hard bit data HB_U/HB_M/HB_L" and the "compressed soft bit data SB" in each section is as follows.
Section D1 ("Er" state): "111", "0"
Section D2 ("A" state): "110", "1"
Section D3 ("A" state): "110", "0"
Section D4 ("B" state): "100", "1"
Section D5 ("B" state): "100", "0"
Section D6 ("C" state): "000", "1"
Section D7 ("C" state): "000", "0"
Section D8 ("D" state): "010", "1"
Section D9 ("D" state): "010", "0"
Section D10 ("E" state): "011", "1"
Section D11 ("E" state): "011", "O"
Section D12 ("F" state): "001", "1"
Section D13 ("F" state): "001", "0"
Section D14 ("G" state): "101", "1"
Section D15 ("G" state): "101", "0"

Method for Compressing Soft Bit Data

Figure 16:
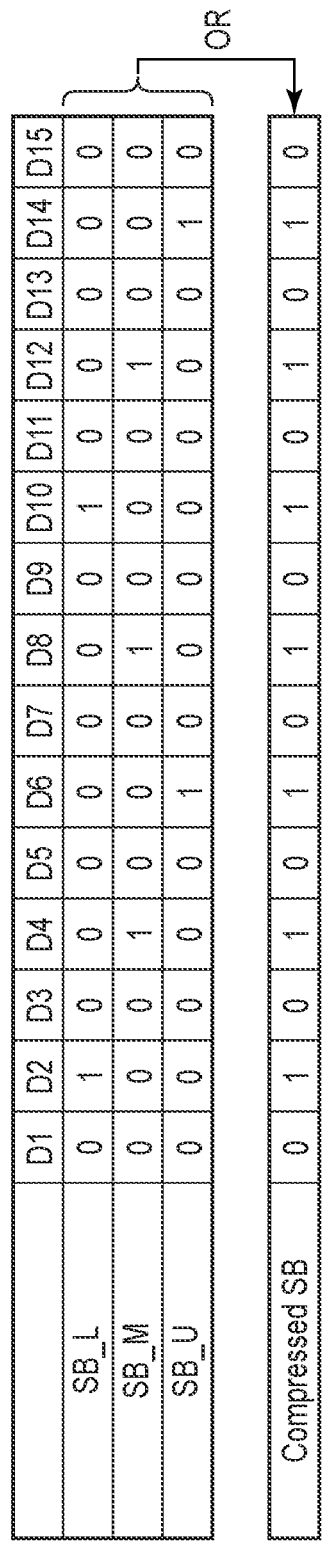
FIG. 16 is a diagram illustrating operation processes of calculating the compressed soft bit data from the soft bit data SB_L, SB_M, and SB_U in the memory system according to the first embodiment.

Next, an example of a method of compressing the soft bit data SB is described with reference to FIGS. 15 and 16. FIG. 15 is a diagram illustrating an operation process of calculating soft bit data SB_L, SB_M, and SB_U from results of read operations of a lower page, a middle page, and an upper page. FIG. 16 is a diagram illustrating operation processes of calculating the compressed soft bit data SB from the soft bit data SB_L, SB_M, and SB_U.

As illustrated in FIG. 15, for example, after the read operation of the lower page, the sense amplifier 213 performs an XOR operation of the hard bit data HB_L (ALR/ELR) determined by the ALR reading and the ELR reading and the data (AHR/EHR) determined by the AHR reading and the EHR reading. As a result, the soft bit data SB_L is calculated. In this case, the sections D2 and D10 of the soft bit data SB_L are data of "1", and the other sections D of the soft bit data SB_L are data of "0".

Therefore, first logic level data (here, data of "1") of the soft bit data SB_L indicates that the data of "1" or "0" at the corresponding bit position in the hard bit data HB_L is data read from either the memory cell transistor MC having the threshold voltage belonging to the region in which the threshold voltage distribution of the "Er" state and the threshold voltage distribution of the "A" state overlap or the memory cell transistor MC having the threshold voltage belonging to the region in which the threshold voltage distribution of the "D" state and the threshold voltage distribution of the "E" state overlap. In other words, the data of "1" of the soft bit data SB_L indicates that the reliability of the data at the corresponding bit position in the hard bit data HB_L is low.

Next, after the read operation of the middle page, the sense amplifier 213 performs an XOR operation of the hard bit data HB_M (BLR/DLR/FLR) determined by the BLR reading, the DLR reading, and the FLR reading and the data (BHR/DHR/FHR) determined by the BHR reading, the DHR reading, and the FHR reading. As a result, the soft bit data SB_M is calculated. In this case, the sections D4, D8, and D12 of the soft bit data SB_M are data of "1", and the other sections D of the soft bit data SB_M are data of "0".

Therefore, first logic level data (here, data of "1") of the soft bit data SB_M indicates that the data of "1" or "0" at the corresponding bit position in the hard bit data HB_M is data read from any of the memory cell transistors MC having the threshold voltage belonging to the region in which the threshold voltage distribution of the "A" state and the threshold voltage distribution of the "B" state overlap, the memory cell transistors MC having the threshold voltage belonging to the region in which the threshold voltage distribution of the "C" state and the threshold voltage distribution of the "D" state overlap, and the memory cell transistors MC having the threshold voltage belonging to the region in which the threshold voltage distribution of the "E" state and the threshold voltage distribution of the "F" state overlap. In other words, the data of "1" of the soft bit data SB_M indicates that the reliability of the data at the corresponding bit position in the hard bit data HB_M is low.

Next, after the read operation of the upper page, the sense amplifier 213 performs an XOR operation of the hard bit data HB_U (CLR/GLR) determined by the CLR reading and the GLR reading and the data (CHR/GHR) determined by the CHR reading and the GHR reading. As a result, the soft bit data SB_U is calculated. The sections D6 and D14 of the soft bit data SB_U are data of "1", and the other sections D of the soft bit data SB_U are data of "0".

Therefore, first logic level data (here, data of "1") of the soft bit data SB_U indicates that the data of "1" or "0" at the corresponding bit position in the hard bit data HB_U is data read from either the memory cell transistor MC having the threshold voltage belonging to the region in which the threshold voltage distribution of the "B" state and the threshold voltage distribution of the "C" state overlap or the memory cell transistor MC having the threshold voltage belonging to the region in which the threshold voltage distribution of the "F" state and the threshold voltage distribution of the "G" state overlap. In other words, the data of "1" of the soft bit data SB_U indicates that the reliability of the data at the corresponding bit position in the hard bit data HB_U is low.

As illustrated in FIG. 16, in the data of "1" of the soft bit data SB_L, SB_M, and SB_U, threshold voltage distributions (states) serving as targets of the data of "1" are different from each other. Therefore, the sections D in which data of "1" of the soft bit data SB_L, SB_M, and SB_U exists are different from each other. Therefore, the sense amplifier 213 performs an OR (logical sum) operation of the soft bit data SB_L, SB_M, and SB_U. As a result, the compressed soft bit data SB is calculated. That is, the 3-page data is compressed into 1-page data by the OR operation. Therefore, the data size of the hard bit data HB_L, the data size of the hard bit data HB_M, the data size of the hard bit data HB_U, the data size of the soft bit data SB_L, the data size of the soft bit data SB_M, the data size of the soft bit data SB_U, and the data size of the compressed soft bit data SB are the same.

As described above, in the present embodiment, the sense amplifier 213 performs the logical operation of the soft bit data SB_L, SB_M, and SB_U such that the first logical level data included in the soft bit data SB_L, the first logical level data included in the soft bit data SB_M, and the first logical level data included in the soft bit data SB_U are merged, thereby calculating the compressed soft bit data SB.

For example, in a case where the soft bit data SB_L is stored in the latch circuit TDL, and the soft bit data SB_M is stored in the latch circuit SDL, the operation unit OP performs an OR operation between the data stored in the latch circuit TDL and the data stored in the latch circuit SDL and stores the OR operation result (SB_L|SB_M), for example, in the latch circuit TDL. Then, in a case where the OR operation result (SB_L|SB_M) is stored in the latch circuit TDL, and the soft bit data SB_U is stored in the latch circuit SDL, the operation unit OP performs an OR operation of the OR operation result (SB_L|SB_M) stored in the latch circuit TDL and the soft bit data SB_U stored in the latch circuit SDL and stores the OR operation result (SB_L|SB_M|SB_U), for example, in the latch circuit TDL as the compressed soft bit data SB. The compressed soft bit data SB is transmitted to the memory controller 10 via the latch circuit XDL. At this time, the hard bit data HB_L is stored in the latch circuit ADL, the hard bit data HB_M is stored in the latch circuit BDL, the hard bit data HB_U is stored in the latch circuit CDL, and the compressed soft bit data SB is stored in the latch circuit TDL. Here, the case where the logical sum operation is performed to calculate the compressed soft bit data SB is described. However, in a case where the XNOR (negative exclusive OR) operation is used to calculate the soft bit data SB, the compressed soft bit data SB may be calculated by a logical product operation or the like.

Method of Restoring Compressed Soft Bit

Next, an example of a method of restoring the compressed soft bit data SB is described with reference to FIG. 17. FIG. 17 is a diagram illustrating a restoration process of the soft bit data SB_L, SB_M, and SB_U.

Locations (states) at which the data of "1" of the soft bit data SB_L, SB_M, and SB_U can be generated are mutually exclusive. In the present embodiment, since the read data based on the low read voltage of the two read voltages corresponding to each state is used as the hard bit data HB, a combination of the hard bit data HB_L, HB_M, and HB_U and a combination of the soft bit data SB_L, SB_M, and SB_U can be defined on a one-to-one basis. By using these, the soft bit data SB of each page is restored from the hard bit data HB_L, HB_M, and HB_U and the compressed soft bit data SB.

As illustrated in FIG. 17, the SB restoration circuit 163 receives the hard bit data HB_L, HB_M, and HB_U and the compressed soft bit data SB from the nonvolatile memory 20. In a case of restoring the soft bit data SB_L, SB_M, and SB_U, the SB decoder 1006 performs the following calculation. In the following arithmetic expression, "|" represents an OR operation, and "~" represents inverted data. In the following arithmetic expression, the hard bit data HB_L, HB_M, and HB_U are simply expressed as "L", "M", and "U".

$$SB\_L = ((\sim L \& M \& U)|(L \& M \& \sim U)) \& SB$$

$$SB\_M = ((\sim L \& \sim M \& U)|(\sim L \& M \& \sim U)|(L \& \sim M \& \sim U)) \& SB$$

$$SB\_U = ((\sim L \& \sim M \& \sim U)|(L \& \sim M \& U)) \& SB$$

The soft bit data SB_L, SB_M, and SB_U described with reference to FIG. 15 are restored by the above arithmetic expression. Note that the arithmetic expression can be appropriately changed based on data allocation in the memory cell transistor MC.

As described above, in the present embodiment, the SB restoration circuit 163 restores the soft bit data SB_L based on the hard bit data HB_L, the hard bit data HB_M, the hard bit data HB_U, and the compressed soft bit data SB. Similarly, the SB restoration circuit 163 restores the soft bit data SB_M based on the hard bit data HB_L, the hard bit data HB_M, the hard bit data HB_U, and the compressed soft bit data SB, and restores the soft bit data SB_U based on the hard bit data HB_L, the hard bit data HB_M, the hard bit data HB_U, and the compressed soft bit data SB.

Read Operation in Nonvolatile Memory

Next, a read operation in the nonvolatile memory 20 is described. The read operation in the nonvolatile memory 20 roughly includes a cell read operation and a cache read operation. The cell read operation is an operation of reading data from the memory cell array 211 to the data register 214, that is, the latch circuit XDL, and the cache read operation is an operation of reading (externally outputting) data from the data register 214 to the memory controller 10 by the input/output circuit 201.

For example, the nonvolatile memory 20 has at least one of a first read mode, a second read mode, and a third read mode in the read operation. The nonvolatile memory 20 performs any read mode based on the command set received from the memory controller 10.

The first read mode and the second read mode are operation modes in which a command set is transmitted per one page and page data is read. The first read mode is an operation mode in which a page data read operation (a cell read operation and a cache read operation) is sequentially performed. In the case of the first read mode, while the cell read operation is being performed, the ready/busy signal RBn is set to the "L" level. Therefore, the cell read operation and the cache read operation cannot be performed in parallel.

The second read mode is an operation mode in which the cell read operation and the cache read operation of another page can be performed in parallel. In the case of the second read mode, when the cache read operation can be performed even when the cell read operation is performed, that is, when the data output of the latch circuit XDL can be performed, the ready/busy signal RBn is set to the "H" level.

The third read mode is an operation mode in which data of a plurality of pages stored in the cell unit CU is continuously read based on one command set.

The nonvolatile memory 20 can selectively output (i) the compressed soft bit data SB or (ii) the soft bit data SB_L, the soft bit data SB_M, and the soft bit data SB_U to the memory controller 10 based on whether the command set received from the memory controller 10 is the first command set or the second command set.

Command Sequence based on First Command Set

The first command set is a command set for requesting reading of the compressed soft bit data SB for one page corresponding to the hard bit data HB_L, HB_M, and HB_U for three pages. Hereinafter, a case where the nonvolatile memory 20 outputs the hard bit data HB_L, the hard bit data HB_M, the hard bit data HB_U, and the compressed soft bit data SB to the memory controller 10 based on the first command set is described. The first command set may be a command set for requesting reading of the hard bit data HB_L, HB_M, and HB_U for three pages and the compressed soft bit data SB for one page corresponding to the hard bit data for three pages. In this case, in response to receiving the first command set from the memory controller 10, the nonvolatile memory 20 outputs the hard bit data HB_L, the hard bit data HB_M, the hard bit data HB_U, and the compressed soft bit data SB to the memory controller 10. Hereinafter, a case where the first command set is a command set that requests reading of the compressed soft bit data SB is mainly described.

Command Sequence of First Read Mode

Figure 18:
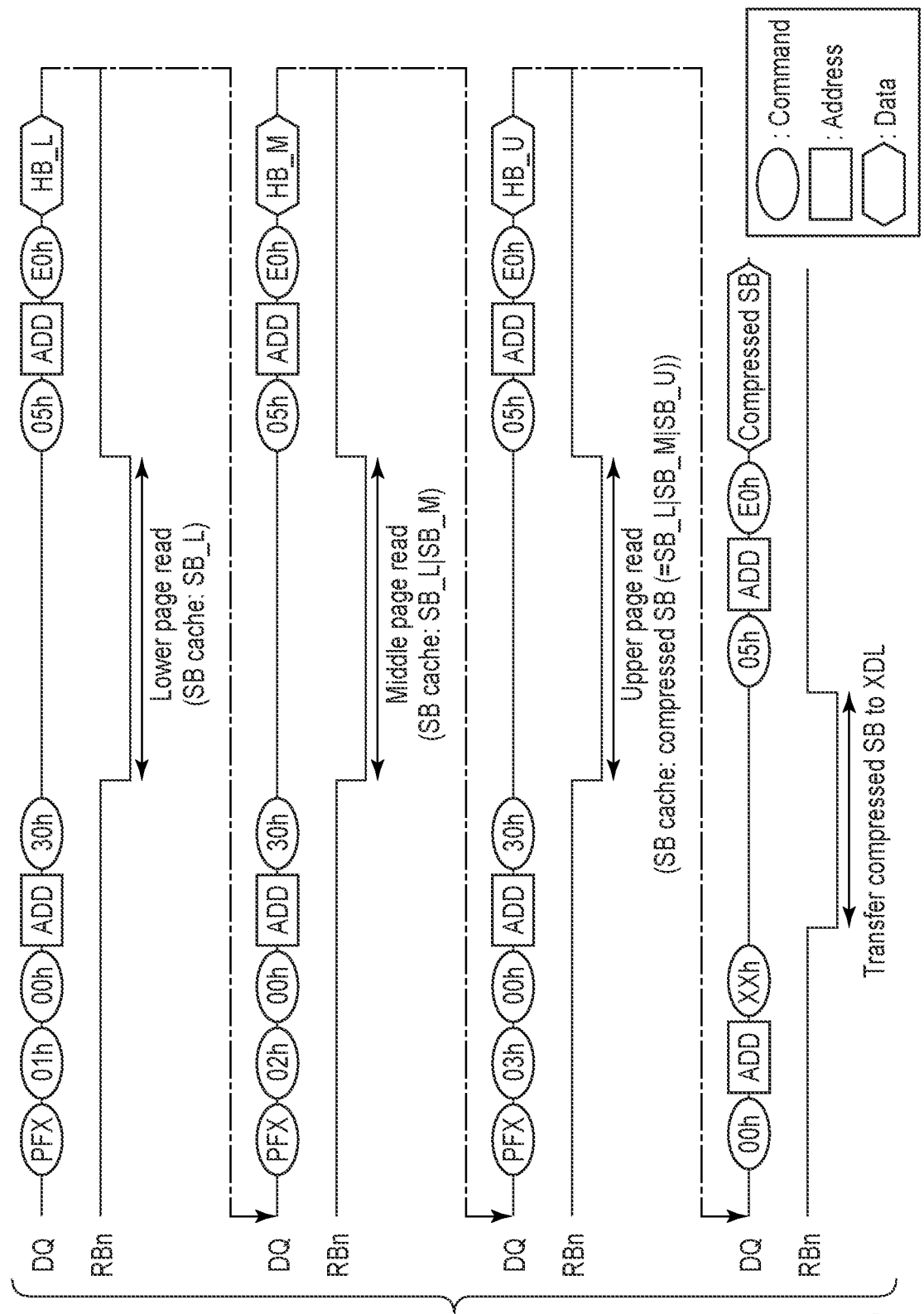
FIG. 18 is a command sequence of a first read mode based on a first command set in the memory system according to the first embodiment.

First, an example of a command sequence of the first read mode is described with reference to FIG. 18. FIG. 18 is a command sequence of the first read mode. In the example of FIG. 18, in order to simplify the description, the signals CEn, CLE, ALE, WEn, REn, DQS, and DQSn are omitted, and the signal DQ and the ready/busy signal RBn are illustrated. In the signal DQ, the command is written in a round frame, the address is written in a square frame, and the data is written in a hexagonal frame.

The example of FIG. 18 illustrates a case where the read operation of the lower page, the read operation of the middle page, and the read operation of the upper page of one cell unit CU are sequentially performed.

As illustrated in FIG. 18, first, the memory controller 10 transmits, to the nonvolatile memory 20, a command set of the cell read operation of the lower page. More specifically, first, the memory controller 10 transmits a command "PFX" to the nonvolatile memory 20. The command "PFX" is a prefix command for notifying performing of the read operation of the hard bit data HB and the calculation operation of the soft bit data SB. In other words, the command "PFX" is a command that notifies one state of performing of two read operations using two read voltages and performing of calculation of the soft bit data SB. Next, the memory controller 10 successively transmits commands "01h" and "00h", an address "ADD", and a command "30h" to the nonvolatile memory 20. The command "01h" is a command for specifying the lower page. The command "00h" is a command for notifying performing of the cell read operation. The address "ADD" corresponds to the cell unit CU to be subjected to the read operation. For example, the address "ADD" includes the row address RA, the column address CA, and the like. The command "30h" is a command for performing the cell read operation based on the previously transmitted address "ADD".

When receiving the command "30h", the nonvolatile memory 20 sets the ready/busy signal RBn to the "L" level and starts the cell read operation of the lower page. As a result of the cell read operation, for example, the hard bit data HB_L is stored in the latch circuit XDL. For example, the soft bit data SB_L is stored in the latch circuit TDL as cache data (SB cache in FIG. 18) of the soft bit data SB.

When the hard bit data HB_L is stored in the latch circuit XDL, the sense amplifier 213 first stores the hard bit data HB_L, for example, in the latch circuit ADL and then transfers the hard bit data HB_L from the latch circuit ADL to the latch circuit XDL while leaving the hard bit data HB_L in the latch circuit ADL.

In response to the cell read operation of the lower page is ended, the nonvolatile memory 20 sets the ready/busy signal RBn to the "H" level.

In response to confirming the ready/busy signal RBn at the "H" level, the memory controller 10 transmits a command set of the cache read operation of the lower page (hard bit data HB_L) to the nonvolatile memory 20. More specifically, the memory controller 10 successively transmits a command "05h", the address "ADD", and a command "E0h" to the nonvolatile memory 20. The command "05h" is a command for notifying that the cache read operation is performed. The command "E0h" is a command for performing the cache read operation based on the previously transmitted address "ADD".

The nonvolatile memory 20 transmits the hard bit data HB_L of the data register 214 (latch circuit XDL) to the memory controller 10.

In this case, the nonvolatile memory 20 transmits the hard bit data HB_L of the latch circuit XDL to the memory controller 10 while leaving the hard bit data HB_L in the latch circuit ADL.

After reading the hard bit data HB_L from the nonvolatile memory 20, that is, after the cache read operation is ended, the memory controller 10 transmits the command set of the cell read operation of the middle page to the nonvolatile memory 20. More specifically, the memory controller 10 successively transmits the commands "PFX", "02h", and "00h", the address "ADD", and a command "30h" to the nonvolatile memory 20. The command "02h" is a command for designating the middle page.

In response to receiving the command "30h", the nonvolatile memory 20 sets the ready/busy signal RBn to the "L" level and starts the cell read operation of the middle page. As a result of the cell read operation, for example, the hard bit data HB_M is stored in the latch circuit XDL. The soft bit data SB_M is subjected to an OR operation, for example, with the soft bit data SB_L stored in the latch circuit TDL. For example, an OR operation result (SB_L|SB_M in FIG. 18) of the soft bit data SB_L and SB_M is stored in the latch circuit TDL as the SB cache.

When the hard bit data HB_M is stored in the latch circuit XDL, the sense amplifier 213 first stores the hard bit data HB_M, for example, in the latch circuit BDL and then transfers the hard bit data HB_M from the latch circuit BDL to the latch circuit XDL while leaving the hard bit data HB_M in the latch circuit BDL.

In response to the cell read operation of the middle page is ended, the nonvolatile memory 20 sets the ready/busy signal RBn to the "H" level.

In response to confirming the ready/busy signal RBn at the "H" level, the memory controller 10 transmits a command set of the cache read operation of the middle page (hard bit data HB_M) to the nonvolatile memory 20. More specifically, the memory controller 10 successively transmits a command "05h", the address "ADD", and a command "E0h" to the nonvolatile memory 20.

The nonvolatile memory 20 transmits the hard bit data HB_M of the data register 214 (latch circuit XDL) to the memory controller 10.

In this case, the nonvolatile memory 20 transmits the hard bit data HB_M of the latch circuit XDL to the memory controller 10 while leaving the hard bit data HB_M in the latch circuit BDL.

After reading the hard bit data HB_M from the nonvolatile memory 20, the memory controller 10 transmits the command set of the cell read operation of the upper page to the nonvolatile memory 20. More specifically, the memory controller 10 successively transmits the commands "PFX", "03h", and "00h", the address "ADD", and a command "30h" to the nonvolatile memory 20. The command "03h" is a command for designating the upper page.

In response to receiving the command "30h", the nonvolatile memory 20 sets the ready/busy signal RBn to the "L" level and starts the cell read operation of the upper page. As a result of the cell read operation, for example, the hard bit data HB_U is stored in the latch circuit XDL. The soft bit data SB H is subjected to an OR operation, for example, with the SB cache (SB_L|SB_M) stored in the latch circuit TDL. For example, an OR operation result of the soft bit data SB_L, SB_M, and SB_U (SB_L|SB_M|SB_U in FIG. 18) is stored in the latch circuit TDL as the SB cache. That is, the compressed soft bit data SB is stored in the latch circuit TDL.

When the hard bit data HB_U is stored in the latch circuit XDL, the sense amplifier 213 first stores the hard bit data HB_U, for example, in the latch circuit CDL and then transfers the hard bit data HB_U from the latch circuit CDL to the latch circuit XDL while leaving the hard bit data HB_U in the latch circuit CDL.

In response to the cell read operation of the upper page is ended, the nonvolatile memory 20 sets the ready/busy signal RBn to the "H" level.

In response to confirming the ready/busy signal RBn at the "H" level, the memory controller 10 transmits a command set of the cache read operation of the upper page (hard bit data HB_U) to the nonvolatile memory 20. More specifically, the memory controller 10 successively transmits a command "05h", the address "ADD", and a command "E0h" to the nonvolatile memory 20.

The nonvolatile memory 20 transmits the hard bit data HB_U of the data register 214 (latch circuit XDL) to the memory controller 10.

In this case, the nonvolatile memory 20 transmits the hard bit data HB_U of the latch circuit XDL to the memory controller 10 while leaving the hard bit data HB_U in the latch circuit ADL.

After reading the hard bit data HB_U from the nonvolatile memory 20, the memory controller 10 transmits, to the nonvolatile memory 20, a command set for reading (transferring) the compressed soft bit data SB to the latch circuit XDL. More specifically, the memory controller 10 successively transmits the command "00h", the address "ADD", and a command "XXh" to the nonvolatile memory 20. The command "XXh" is a command for transferring the compressed soft bit data SB to the latch circuit XDL.

In response to receiving the command "XXh", the nonvolatile memory 20 sets the ready/busy signal RBn to the "L" level and transfers the compressed soft bit data SB, for example, from the latch circuit TDL to the latch circuit XDL.

In response to the transfer of the compressed soft bit data SB to the latch circuit XDL is ended, the nonvolatile memory 20 sets the ready/busy signal RBn to the "H" level.

In response to confirming the ready/busy signal RBn at the "H" level, the memory controller 10 transmits a command set of the cache read operation of the compressed soft bit data SB to the nonvolatile memory 20. More specifically, the memory controller 10 successively transmits a command "05h", the address "ADD", and a command "E0h" to the nonvolatile memory 20.

The nonvolatile memory 20 transmits the compressed soft bit data SB of the data register 214 (latch circuit XDL) to the memory controller 10.

As described above, the command set (the command "00h", the address "ADD", and the command "XXh") is used as a command set for reading the compressed soft bit data SB from the nonvolatile memory 20.

Command Sequence of Second Read Mode

Figure 19:
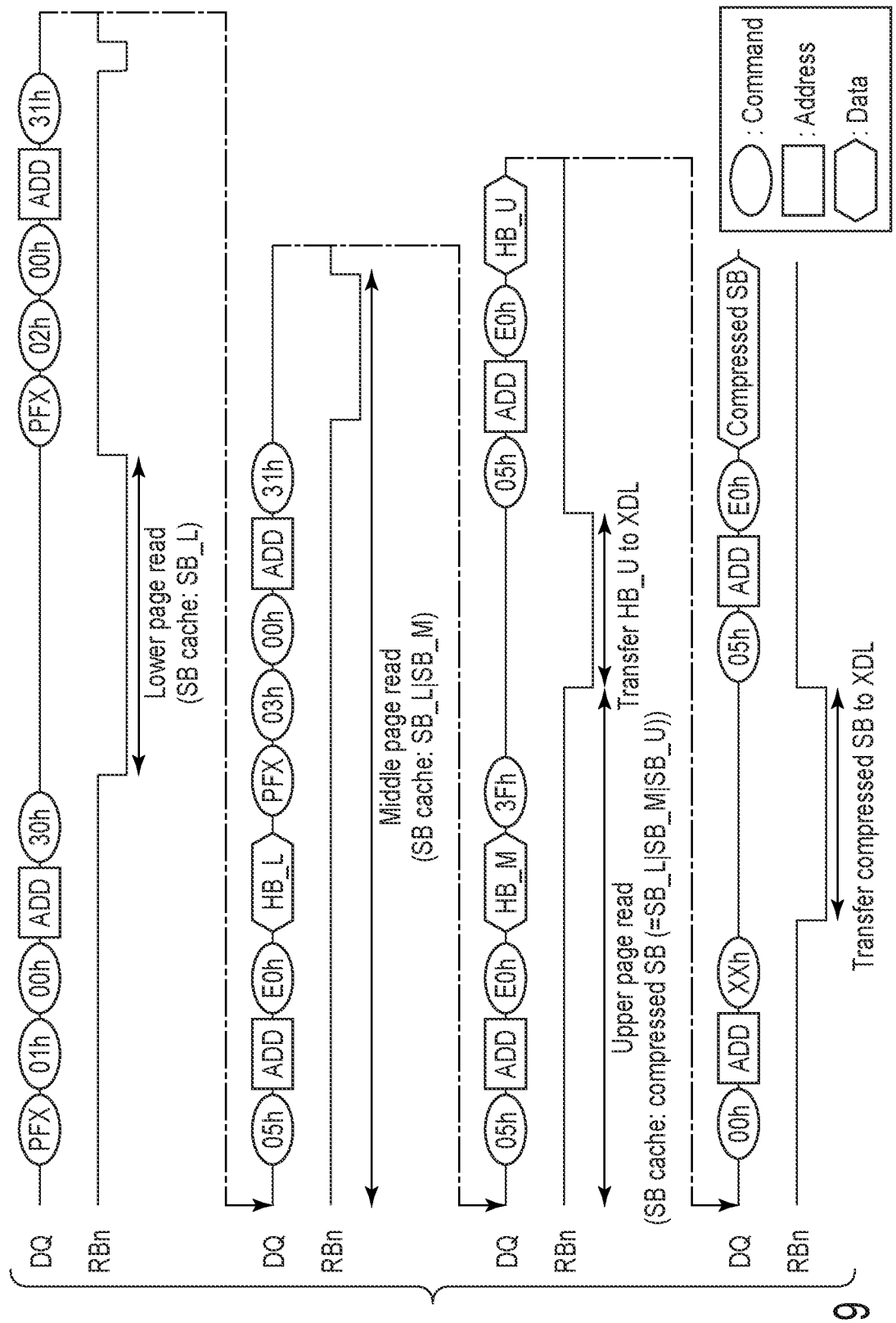
FIG. 19 is a command sequence of a second read mode based on the first command set in the memory system according to the first embodiment.

Next, an example of a command sequence of the second read mode is described with reference to FIG. 19. FIG. 19 is a command sequence of the second read mode. In the example of FIG. 19, in order to simplify the description, the signals CEn, CLE, ALE, WEn, REn, DQS, and DOSn are omitted, and the signal DQ and the ready/busy signal RBn are illustrated. In the signal DQ, the command is written in a round frame, the address is written in a square frame, and the data is written in a hexagonal frame.

The example of FIG. 19 illustrates a case where the read operation of the lower page, the read operation of the middle page, and the read operation of the upper page of one cell unit CU are sequentially performed.

As illustrated in FIG. 19, first, the memory controller 10 transmits a command set of the cell read operation of the lower page to the nonvolatile memory 20. More specifically, the memory controller 10 successively transmits the commands "PFX", "01h", and "00h", the address "ADD", and a command "30h" to the nonvolatile memory 20.

In response to receiving the command "30h", the nonvolatile memory 20 sets the ready/busy signal RBn to the "L" level and starts the cell read operation of the lower page. As a result of the cell read operation, for example, the hard bit data HB_L is stored in the latch circuit XDL. For example, the soft bit data SB_L is stored in the latch circuit TDL.

In response to the hard bit data HB_L is stored in the latch circuit XDL, the sense amplifier 213 first stores the hard bit data HB_L, for example, in the latch circuit ADL and then transfers the hard bit data HB_L from the latch circuit ADL to the latch circuit XDL while leaving the hard bit data HB_L in the latch circuit ADL.

In response to the cell read operation of the lower page is ended, the nonvolatile memory 20 sets the ready/busy signal RBn to the "H" level.

In response to confirming the ready/busy signal RBn at the "H" level, the memory controller 10 transmits a command set for reserving the cell read operation of the middle page to the nonvolatile memory 20. More specifically, the memory controller 10 successively transmits the commands "PFX", "02h", and "00h", the address "ADD", and a command "31h" to the nonvolatile memory 20. The command "31h" is a command for reserving the performing of the command set of the cell read operation including the command "31h" after the cell read operation being ended.

In response to receiving the command "31h", the nonvolatile memory 20 sets the ready/busy signal RBn to the "L" level and reserves the cell read operation of the middle page.

In response to the reservation is ended, the nonvolatile memory 20 sets the ready/busy signal RBn to the "H" level. Since the cell read operation of the lower page is ended, the nonvolatile memory 20 starts the cell read operation of the middle page while keeping the ready/busy signal RBn at the "H" level.

In response to confirming the ready/busy signal RBn at the "H" level, the memory controller 10 transmits a command set of the cache read operation of the lower page (hard bit data HB_L) to the nonvolatile memory 20. More specifically, the memory controller 10 successively transmits a command "05h", the address "ADD", and a command "E0h" to the nonvolatile memory 20.

The nonvolatile memory 20 transmits the hard bit data HB_L of the data register 214 (latch circuit XDL) to the memory controller 10 in parallel with the cell read operation of the middle page.

In this case, the nonvolatile memory 20 transmits the hard bit data HB_L of the latch circuit XDL to the memory controller 10 while leaving the hard bit data HB_L in the latch circuit ADL.

After reading the hard bit data HB_L from the nonvolatile memory 20, the memory controller 10 transmits the command set for reserving the cell read operation of the upper page to the nonvolatile memory 20. More specifically, the memory controller 10 successively transmits the commands "PFX", "03h", and "00h", the address "ADD", and the command "31h" to the nonvolatile memory 20.

In response to the reservation of the cell read operation of the upper page is ended, and the cell read operation of the middle page is not ended, the nonvolatile memory 20 sets the ready/busy signal RBn to the "L" level. For example, after the output of the hard bit data HB_L, the hard bit data HB_M is stored in the latch circuit XDL. An OR operation result (SB_L|SB_M) of the soft bit data SB_L and SB_M is stored in the latch circuit TDL as the SB cache. When the hard bit data HB_M is stored in the latch circuit XDL, the sense amplifier 213 first stores the hard bit data HB_M, for example, in the latch circuit BDL and then transfers the hard bit data HB_M from the latch circuit BDL to the latch circuit XDL while leaving the hard bit data HB_M in the latch circuit BDL.

In response to the cell read operation of the middle page is ended, the nonvolatile memory 20 sets the ready/busy signal RBn to the "H" level. Since the cell read operation of the middle page is ended, the nonvolatile memory 20 starts the cell read operation of the upper page while keeping the ready/busy signal RBn at the "H" level.

In response to confirming the ready/busy signal RBn at the "H" level, the memory controller 10 transmits a command set of the cache read operation of the middle page (hard bit data HB_M) to the nonvolatile memory 20. More specifically, the memory controller 10 successively transmits a command "05h", the address "ADD", and a command "E0h" to the nonvolatile memory 20.

The nonvolatile memory 20 transmits the hard bit data HB_M of the data register 214 (latch circuit XDL) to the memory controller 10 in parallel with the cell read operation of the upper page.

In this case, the nonvolatile memory 20 transmits the hard bit data HB_M of the latch circuit XDL to the memory controller 10 while leaving the hard bit data HB_M in the latch circuit BDL.

In response to the cache read operation of the middle page (hard bit data HB_M) is ended, the memory controller 10 transmits a command "3Fh" to the nonvolatile memory 20. After the cell read operation of the last page (the upper page in the example of FIG. 19) is ended, the command "3Fh" is a command for reserving transfer of the read data to the latch circuit XDL.

In response to the output of the hard bit data HB_M (cache read operation) is ended, and the data transfer to the latch circuit XDL becomes possible, the nonvolatile memory 20 sets the ready/busy signal RBn to the "L" level. Then, the nonvolatile memory 20 transfers the hard bit data HB_U from the latch circuit CDL to the latch circuit XDL. At this time, an OR operation result of the soft bit data SB_L, SB_M, and SB_U (SB_L|SB_M|SB_U) is stored in the latch circuit TDL as the SB cache. That is, the compressed soft bit data SB is stored in the latch circuit TDL.

When the hard bit data HB_U is transferred in the latch circuit XDL, the sense amplifier 213 transfers the hard bit data HB_U from the latch circuit CDL to the latch circuit XDL while leaving the hard bit data HB_U in the latch circuit CDL.

In response to the transfer of the hard bit data HB_U to the latch circuit XDL is ended, the nonvolatile memory 20 sets the ready/busy signal RBn to the "H" level.

In response to confirming the ready/busy signal RBn at the "H" level, the memory controller 10 transmits a command set of the cache read operation of the upper page (hard bit data HB_U) to the nonvolatile memory 20. More specifically, the memory controller 10 successively transmits a command "05h", the address "ADD", and a command "E0h" to the nonvolatile memory 20.

The nonvolatile memory 20 transmits the hard bit data HB_U of the data register 214 (latch circuit XDL) to the memory controller 10.

In this case, the nonvolatile memory 20 transmits the hard bit data HB_U of the latch circuit XDL to the memory controller 10 while leaving the hard bit data HB_U in the latch circuit CDL.

The read operation of the compressed soft bit data SB is similar to that in the first operation mode.

Command Sequence of Third Read Mode

Next, an example of a command sequence of the third read mode is described with reference to FIG. 20. FIG. 20 is a command sequence of the third read mode. In the example of FIG. 20, in order to simplify the description, the signals CEn, CLE, ALE, WEn, REn, DQS, and DOSn are omitted, and the signal DQ and the ready/busy signal RBn are illustrated. In the signal DQ, the command is written in a round frame, the address is written in a square frame, and the data is written in a hexagonal frame.

The example of FIG. 20 illustrates a case where the read operation of the lower page, the read operation of the middle page, and the read operation of the upper page of one cell unit CU are continuously performed based on one command set.

As illustrated in FIG. 20, first, the memory controller 10 transmits a command set of the read operation of the third read mode to the nonvolatile memory 20. More specifically, the memory controller 10 successively transmits the commands "PFX" and "00h", the address "ADD", and the command "30h" to the nonvolatile memory 20.

In response to receiving the command "30h", the nonvolatile memory 20 sets the ready/busy signal RBn to the "L" level and first starts the cell read operation of the lower page. As a result of the cell read operation, for example, the hard bit data HB_L is stored in the latch circuit XDL. For example, the soft bit data SB_L is stored in the latch circuit TDL.

When the hard bit data HB_L is stored in the latch circuit XDL, the sense amplifier 213 first stores the hard bit data HB_L, for example, in the latch circuit ADL and then transfers the hard bit data HB_L from the latch circuit ADL to the latch circuit XDL while leaving the hard bit data HB_L in the latch circuit ADL.

In response to the cell read operation of the lower page is ended, the nonvolatile memory 20 sets the ready/busy signal RBn to the "H" level. In addition, the nonvolatile memory 20 starts the cell read operation of the middle page while keeping the ready/busy signal RBn at the "H" level.

In response to confirming the ready/busy signal RBn at the "H" level, the memory controller 10 transmits a command set of the cache read operation of the lower page (hard bit data HB_L) to the nonvolatile memory 20. More specifically, the memory controller 10 successively transmits a command "05h", the address "ADD", and a command "E0h" to the nonvolatile memory 20.

The nonvolatile memory 20 transmits the hard bit data HB_L of the data register 214 (latch circuit XDL) to the memory controller 10 in parallel with the cell read operation of the middle page.

In this case, the nonvolatile memory 20 transmits the hard bit data HB_L of the latch circuit XDL to the memory controller 10 while leaving the hard bit data HB_L in the latch circuit ADL.

After reading the hard bit data HB_L from the nonvolatile memory 20, the memory controller 10 transmits, to the nonvolatile memory 20, a command set for reading (transferring) the hard bit data HB_M to the latch circuit XDL. More specifically, the memory controller 10 successively transmits the command "00h", the address "ADD", and a command "YYh" to the nonvolatile memory 20. The command "YYh" is a command for transferring the hard bit data HB_M to the latch circuit XDL.

In response to the cell read operation of the middle page is ended, and the data transfer to the latch circuit XDL becomes possible, the nonvolatile memory 20 sets the ready/busy signal RBn to the "L" level. Then, the nonvolatile memory 20 transfers the hard bit data HB_M from the latch circuit BDL to the latch circuit XDL. At this time, an OR operation result (SB_L|SB_M) of the soft bit data SB_L and SB_M is stored in the latch circuit TDL as the SB cache.

When the hard bit data HB_M is transferred in the latch circuit XDL, the sense amplifier 213 transfers the hard bit data HB_M from the latch circuit BDL to the latch circuit XDL while leaving the hard bit data HB_M in the latch circuit BDL.

In response to the transfer of the hard bit data HB_M to the latch circuit XDL is ended, the nonvolatile memory 20 sets the ready/busy signal RBn to the "H" level. The nonvolatile memory 20 starts the cell read operation of the upper page while keeping the ready/busy signal RBn at the "H" level.

In response to confirming the ready/busy signal RBn at the "H" level, the memory controller 10 transmits a command set of the cache read operation of the middle page (hard bit data HB_M) to the nonvolatile memory 20. More specifically, the memory controller 10 successively transmits a command "05h", the address "ADD", and a command "E0h" to the nonvolatile memory 20.

The nonvolatile memory 20 transmits the hard bit data HB_M of the data register 214 (latch circuit XDL) to the memory controller 10 in parallel with the cell read operation of the upper page.

In this case, the nonvolatile memory 20 transmits the hard bit data HB_M of the latch circuit XDL to the memory controller 10 while leaving the hard bit data HB_M in the latch circuit BDL.

After reading the hard bit data HB_M from the nonvolatile memory 20, the memory controller 10 transmits, to the nonvolatile memory 20, a command set for reading (transferring) the hard bit data HB_U to the latch circuit XDL. More specifically, the memory controller 10 successively transmits the command "00h", the address "ADD", and a command "ZZh" to the nonvolatile memory 20. The command "ZZh" is a command for transferring the hard bit data HB_U to the latch circuit XDL.

In response to the cell read operation of the upper page is ended, and the data transfer to the latch circuit XDL becomes possible, the nonvolatile memory 20 sets the ready/busy signal RBn to the "L" level. Then, the nonvolatile memory 20 transfers the hard bit data HB_U from the latch circuit CDL to the latch circuit XDL. At this time, an OR operation result of the soft bit data SB_L, SB_M, and SB_U (SB_L|SB_M|SB_U) is stored in the latch circuit TDL as the SB cache. That is, the compressed soft bit data SB is stored in the latch circuit TDL.

When the hard bit data HB_U is transferred in the latch circuit XDL, the sense amplifier 213 transfers the hard bit data HB_U from the latch circuit CDL to the latch circuit XDL while leaving the hard bit data HB_U in the latch circuit CDL.

In response to the transfer of the hard bit data HB_U to the latch circuit XDL is ended, the nonvolatile memory 20 sets the ready/busy signal RBn to the "H" level.

In response to confirming the ready/busy signal RBn at the "H" level, the memory controller 10 transmits a command set of the cache read operation of the upper page (hard bit data HB_U) to the nonvolatile memory 20. More specifically, the memory controller 10 successively transmits a command "05h", the address "ADD", and a command "E0h" to the nonvolatile memory 20.

The nonvolatile memory 20 transmits the hard bit data HB_U of the data register 214 (latch circuit XDL) to the memory controller 10.

In this case, the nonvolatile memory 20 transmits the hard bit data HB_U of the latch circuit XDL to the memory controller 10 while leaving the hard bit data HB_U in the latch circuit CDL.

The read operation of the compressed soft bit data SB is similar to that in the first operation mode.

Command Sequence Based on Second Command Set

The second command set is a command set for requesting reading of uncompressed soft bit data (that is, the soft bit data SB_L, SB_M, and SB_U) for three pages corresponding to the hard bit data HB_L, HB_M, and HB_U for three pages. Hereinafter, a case where the nonvolatile memory 20 outputs the hard bit data HB_L, the hard bit data HB_M, the hard bit data HB_U, the soft bit data SB_L, the soft bit data SB_M, and the soft bit data SB_U to the memory controller 10 based on the second command set is described. The second command set may be a command set for requesting reading of the hard bit data HB_L, HB_M, and HB_U for three pages and the uncompressed soft bit data SB_L, SB_M, and SB_U for three pages respectively corresponding to the hard bit data for three pages. In this case, in response to receiving the second command set from the memory controller 10, the nonvolatile memory 20 outputs the hard bit data HB_L, the hard bit data HB_M, the hard bit data HB_U, the soft bit data SB_L, the soft bit data SB_M, and the soft bit data SB_U to the memory controller 10. Hereinafter, a case where the second command set is a command set for requesting reading of the soft bit data SB_L, the soft bit data SB_M, and the soft bit data SB_U is mainly described.

Command Sequence of First Read Mode (Uncompressed SB Reading)

First, an example of a command sequence of the first read mode used when uncompressed SB is read is described with reference to FIG. 21.

The read operation of the lower page (hard bit data HB_L), the middle page (hard bit data HB_M), and the upper page (hard bit data HB_U) is performed in the same procedure as the read operation of the lower page (hard bit data HB_L), the middle page (hard bit data HB_M), and the upper page (hard bit data HB_U) of the command sequence of the first read mode described with reference to FIG. 18.

At the time when the read operation of the upper page (hard bit data HB_U) is ended, the hard bit data HB_L, the hard bit data HB_M, the hard bit data HB_U, and the compressed soft bit data SB (SB_L|SB_M|SB_U) are stored in the latch circuits ADL, BDL, CDL, and TDL, respectively.

After reading the hard bit data HB_U from the nonvolatile memory 20, the memory controller 10 transmits a command set for requesting the nonvolatile memory 20 to prepare the soft bit data SB_L to the latch circuit XDL. More specifically, the memory controller 10 successively transmits the command "01h", the command "00h", the address "ADD", and a command "XXh" to the nonvolatile memory 20. The command "01h" is a command for designating the lower page. The command "XXh" is a command for transferring the soft bit data SB_L to the latch circuit XDL.

In response to receiving the command "XXh", the nonvolatile memory 20 sets the ready/busy signal RBn to the "L" level and restores the soft bit data SB_L. In this case, the nonvolatile memory 20 restores the soft bit data SB_L based on the hard bit data HB_L stored in the latch circuit ADL, the hard bit data HB_M stored in the latch circuit BDL, the hard bit data HB_U stored in the latch circuit CDL, and the compressed soft bit data SB stored in the latch circuit TDL. That is, the sense amplifier 213 performs the logical operation described in FIG. 12, that is, ((~L&M&U)|(L&M&~U)) &SB, thereby restoring the soft bit data SB_L. Then, the nonvolatile memory 20 transfers the restored soft bit data SB_L to the latch circuit XDL.

In response to the transfer of the soft bit data SB_L to the latch circuit XDL is ended, the nonvolatile memory 20 sets the ready/busy signal RBn to the "H" level.

In response to confirming the ready/busy signal RBn at the "H" level, the memory controller 10 transmits a command set of the cache read operation of the soft bit data SB_L to the nonvolatile memory 20. More specifically, the memory controller 10 successively transmits a command "05h", the address "ADD", and a command "E0h" to the nonvolatile memory 20.

The nonvolatile memory 20 transmits the soft bit data SB_L of the data register 214 (latch circuit XDL) to the memory controller 10.

After reading the soft bit data SB_L from the nonvolatile memory 20, the memory controller 10 transmits a command set for requesting the nonvolatile memory 20 to prepare the soft bit data SB_M to the latch circuit XDL. More specifically, the memory controller 10 successively transmits the command "02h", the command "00h", the address "ADD", and a command "XXh" to the nonvolatile memory 20. The command "02h" is a command for designating the middle page. The command "XXh" is a command for transferring the soft bit data SB_M to the latch circuit XDL.

In response to receiving the command "XXh", the nonvolatile memory 20 sets the ready/busy signal RBn to the "L" level and restores the soft bit data SB_M. In this case, the nonvolatile memory 20 restores the soft bit data SB_M based on the hard bit data HB_L stored in the latch circuit ADL, the hard bit data HB_M stored in the latch circuit BDL, the hard bit data HB_U stored in the latch circuit CDL, and the compressed soft bit data SB stored in the latch circuit TDL. That is, the sense amplifier 213 performs the logical operation described in FIG. 12, that is, ((~L&~M&~U)|(~L&M&~U)|(L&~M&~U) &SB, thereby restoring the soft bit data SB_M. Then, the nonvolatile memory 20 transfers the restored soft bit data SB_M to the latch circuit XDL.

In response to the transfer of the soft bit data SB_M is ended, the nonvolatile memory 20 sets the ready/busy signal RBn to the "H" level.

In response to confirming the ready/busy signal RBn at the "H" level, the memory controller 10 transmits a command set of the cache read operation of the soft bit data SB_M to the nonvolatile memory 20. More specifically, the memory controller 10 successively transmits a command "05h", the address "ADD", and a command "E0h" to the nonvolatile memory 20.

The nonvolatile memory 20 transmits the soft bit data SB_M of the data register 214 (latch circuit XDL) to the memory controller 10.

After reading the soft bit data SB_M from the nonvolatile memory 20, the memory controller 10 transmits a command set for requesting the nonvolatile memory 20 to prepare the soft bit data SB_U to the latch circuit XDL. More specifically, the memory controller 10 successively transmits the command "03h", the command "00h", the address "ADD", and a command "XXh" to the nonvolatile memory 20. The command "03h" is a command for designating the upper page. The command "XXh" is a command for transferring the soft bit data SB_U to the latch circuit XDL.

In response to receiving the command "XXh", the nonvolatile memory 20 sets the ready/busy signal RBn to the "L" level and restores the soft bit data SB_U, for example. In this case, the nonvolatile memory 20 restores the soft bit data SB_U based on the hard bit data HB_L stored in the latch circuit ADL, the hard bit data HB_M stored in the latch circuit BDL, the hard bit data HB_U stored in the latch circuit CDL, and the compressed soft bit data SB stored in the latch circuit TDL. That is, the sense amplifier 213 performs the logical operation described in FIG. 12, that is, ((~L&~M&~U)|(L&~M&~U)) &SB, thereby restoring the soft bit data SB_U. Then, the nonvolatile memory 20 transfers the restored soft bit data SB_U to the latch circuit XDL.

In response to the transfer of the soft bit data SB_U is ended, the nonvolatile memory 20 sets the ready/busy signal RBn to the "H" level.

In response to confirming the ready/busy signal RBn at the "H" level, the memory controller 10 transmits a command set of the cache read operation of the soft bit data SB_U to the nonvolatile memory 20. More specifically, the memory controller 10 successively transmits a command "05h", the address "ADD", and a command "E0h" to the nonvolatile memory 20.

The nonvolatile memory 20 transmits the soft bit data SB_U of the data register 214 (latch circuit XDL) to the memory controller 10.

As described above, in the example of FIG. 21, "01h"-"00h"-"ADD"-"XXh" (Lower-SB preparation), "02h"-"00h"-"ADD"-"Xh" (Middle-SB preparation), and "03h"-"00h"-"ADD"-"XXh" (Upper-SB preparation) are used as the second command set.

Command Sequence of Second Read Mode (Uncompressed SB Reading)

Next, an example of a command sequence of the second read mode used when uncompressed SB is read is described with reference to FIG. 22. FIG. 22 is a command sequence of the second read mode.

The read operation of the lower page (hard bit data HB_L), the middle page (hard bit data HB_M), and the upper page (hard bit data HB_U) is performed in the same procedure as the read operation of the lower page (hard bit data HB_L), the middle page (hard bit data HB_M), and the upper page (hard bit data HB_U) of the command sequence of the second read mode described with reference to FIG. 19.

At the time when the read operation of the upper page (hard bit data HB_U) is ended, the hard bit data HB_L, the hard bit data HB_M, the hard bit data HB_U, and the compressed soft bit data SB (SB_L|SB_M|SB_U) are stored in the latch circuits ADL, BDL, CDL, and TDL, respectively.

After reading the hard bit data HB_U from the nonvolatile memory 20, the memory controller 10 successively transmits, to the nonvolatile memory 20, the command "01h", the command "00h", the address "ADD", and the command "XXh".

In response to receiving the command "XXh", the nonvolatile memory 20 sets the ready/busy signal RBn to the "L" level and performs the logical operation described in FIG. 12, that is, ((~L&M&U)|(L&M&~U)) &SB, thereby restoring the soft bit data SB_L. Then, the nonvolatile memory 20 transfers the restored soft bit data SB_L to the latch circuit XDL.

In response to the transfer of the soft bit data SB_L to the latch circuit XDL is ended, the nonvolatile memory 20 sets the ready/busy signal RBn to the "H" level.

In response to confirming the ready/busy signal RBn at the "H" level, the memory controller 10 successively transmits, to the nonvolatile memory 20, the command "05h", the address "ADD", and the command "E0h".

The nonvolatile memory 20 transmits the soft bit data SB_L of the data register 214 (latch circuit XDL) to the memory controller 10.

After reading the soft bit data SB_L from the nonvolatile memory 20, the memory controller 10 successively transmits, to the nonvolatile memory 20, the command "02h", the command "00h", the address "ADD", and the command "XXh".

In response to receiving the command "XXh", the nonvolatile memory 20 sets the ready/busy signal RBn to the "L" level and performs the logical operation described in FIG. 12, that is, ((~L&~M&U)|(~L&M&~U)|(L&~M&~U)) &SB, thereby restoring the soft bit data SB_M. Then, the nonvolatile memory 20 transfers the restored soft bit data SB_M to the latch circuit XDL.

In response to the transfer of the soft bit data SB_M is ended, the nonvolatile memory 20 sets the ready/busy signal RBn to the "H" level.

In response to confirming the ready/busy signal RBn at the "H" level, the memory controller 10 successively transmits, to the nonvolatile memory 20, the command "05h", the address "ADD", and the command "E0h".

The nonvolatile memory 20 transmits the soft bit data SB_M of the data register 214 (latch circuit XDL) to the memory controller 10.

After reading the soft bit data SB_M from the nonvolatile memory 20, the memory controller 10 successively transmits, to the nonvolatile memory 20, the command "03h", the command "00h", the address "ADD", and the command "XXh".

In response to receiving the command "XXh", the nonvolatile memory 20 sets the ready/busy signal RBn to the "L" level and performs the logical operation described in FIG. 12, that is, ((~L&~M&~U)|(L&~M&U)) &SB, thereby restoring the soft bit data SB_U. Then, the nonvolatile memory 20 transfers the restored soft bit data SB_U to the latch circuit XDL.

In response to the transfer of the soft bit data SB_U is ended, the nonvolatile memory 20 sets the ready/busy signal RBn to the "H" level.

In response to confirming the ready/busy signal RBn at the "H" level, the memory controller 10 successively transmits, to the nonvolatile memory 20, the command "05h", the address "ADD", and the command "E0h".

The nonvolatile memory 20 transmits the soft bit data SB_U of the data register 214 (latch circuit XDL) to the memory controller 10.

Command Sequence of Third Read Mode (Uncompressed SB Reading)

Figure 23:
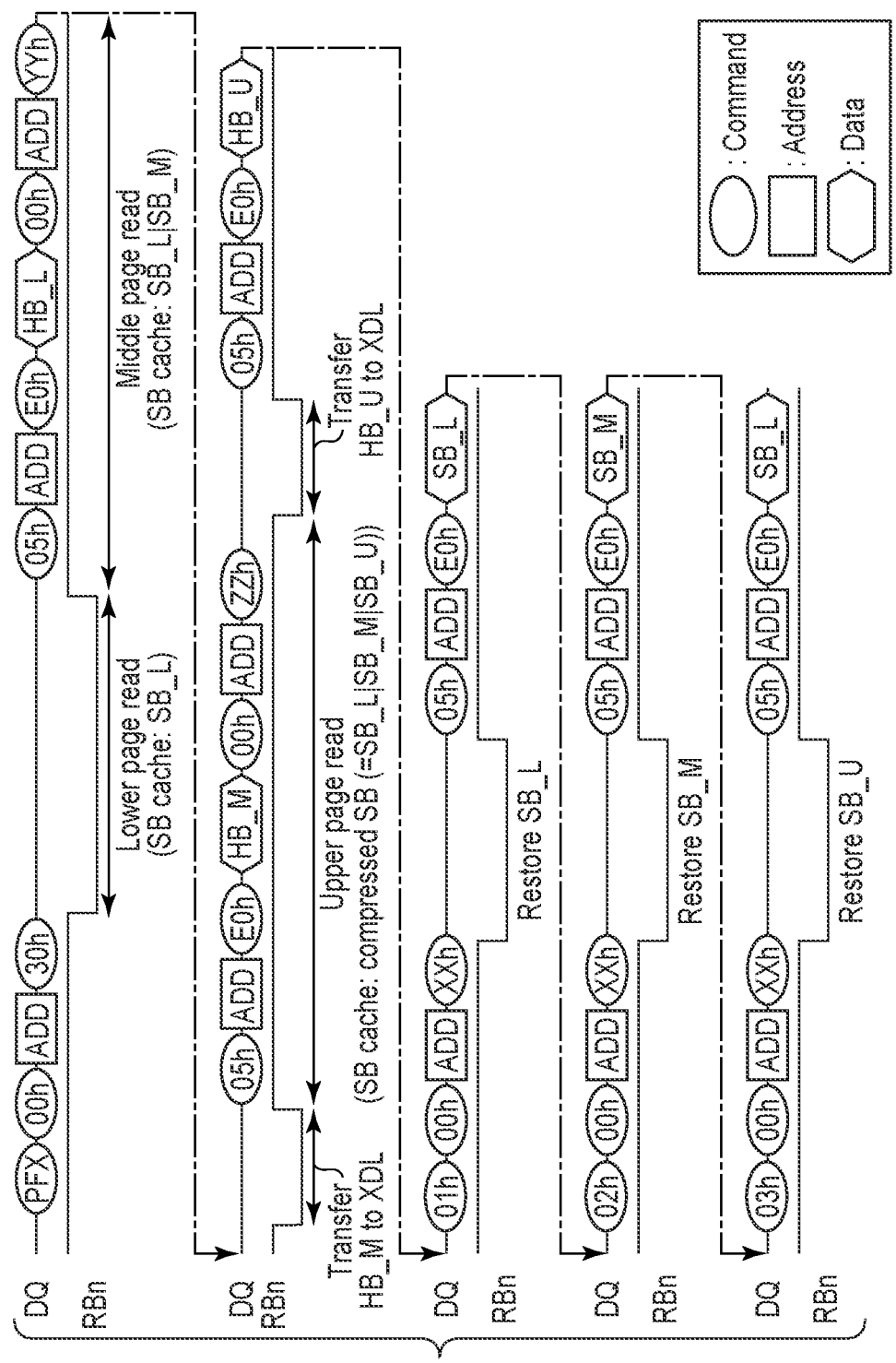
FIG. 23 is a command sequence of a third read mode based on the second command set in the memory system according to the first embodiment.

Next, an example of a command sequence of the third read mode used when uncompressed SB is read is described with reference to FIG. 23. FIG. 23 is a command sequence of the third read mode.

The read operation of the lower page (hard bit data HB_L), the middle page (hard bit data HB_M), and the upper page (hard bit data HB_U) is performed in the same procedure as the read operation of the lower page (hard bit data HB_L), the middle page (hard bit data HB_M), and the upper page (hard bit data HB_U) of the command sequence of the third read mode described with reference to FIG. 20.

At the time when the read operation of the upper page (hard bit data HB_U) is ended, the hard bit data HB_L, the hard bit data HB_M, the hard bit data HB_U, and the compressed soft bit data SB (SB_L|SB_M|SB_U) are stored in the latch circuits ADL, BDL, CDL, and TDL, respectively.

Then, the read operation of the soft bit data SB_L, SB_M, and SB_U is performed in a procedure similar to that in the first operation mode and the second operation mode described with reference to FIGS. 21 and 22.

Note that, in FIGS. 21 to 23, a case where a command set that designates a page to be read, such as "01h"-"00h"-"ADD"-"XXh" (Lower-SB preparation), "02h"-"00h"-"ADD"-"XXh" (Middle-SB preparation), and "03h"-"00h"-"ADD"-"XXh" (Upper-SB preparation), is used as the second command set is described. However, a command set that does not specify a page to be read may be used as the second command set.

For example, after outputting the hard bit data HB_L, the hard bit data HB_M, and the hard bit data HB_U to the memory controller 10, the nonvolatile memory 20 refers to the compression enable/disable switching information stored in the internal register of the sequencer 206 or the like to determine whether the function of outputting the compressed soft bit data is set to valid or invalid. For example, a memory controller that does not have the function of restoring uncompressed soft bit data from compressed soft bit data SB does not switch the function of outputting compressed soft bit data from the invalid state to the valid state. As a result, the compression enable/disable switching information is maintained at the default value indicating the invalid state. In response to the function of outputting the compressed soft bit data is invalid, the nonvolatile memory 20 restores the soft bit data SB_L and transfers the restored soft bit data SB_L to the latch circuit XDL in response to reception of "00h"-"ADD"-"XXh" (first time) from the memory controller 10. In response to reception of "00h"-"ADD"-"XXh" (second time) from the memory controller 10 after outputting the soft bit data SB_L to the memory controller 10, the nonvolatile memory 20 restores the soft bit data SB_M and transfers the restored soft bit data SB_M to the latch circuit XDL. In response to reception of "00h"-"ADD"-"XXh" (third time) from the memory controller 10 after outputting the soft bit data SB_M to the memory controller 10, the nonvolatile memory 20 restores the soft bit data SB_U and transfers the restored soft bit data SB_U to the latch circuit XDL.

In addition, the memory controller 10 having the function of restoring the uncompressed soft bit data from the compressed soft bit data SB may switch the function of outputting the compressed soft bit data from the invalid state to the valid state by issuing a set feature command to the nonvolatile memory 20.

In a case where the function of outputting the compressed soft bit data is valid, the nonvolatile memory 20 outputs the compressed soft bit data SB to the memory controller 10 based on (i) "00h"-"ADD"-"XXh" and outputs the soft bit data SB_L, the soft bit data SB_M, and the soft bit data SB_U to the memory controller 10 based on (ii) "01h"-"00h"-"ADD"-"XXh" (Lower-SB preparation), "02h"-"00h"-"ADD"-"XXh" (Middle-SB preparation), and "03h"-"00h"-"ADD"-"XXh" (Upper-SB preparation).

Read Operation
Flow of Read Operation

Figure 24:
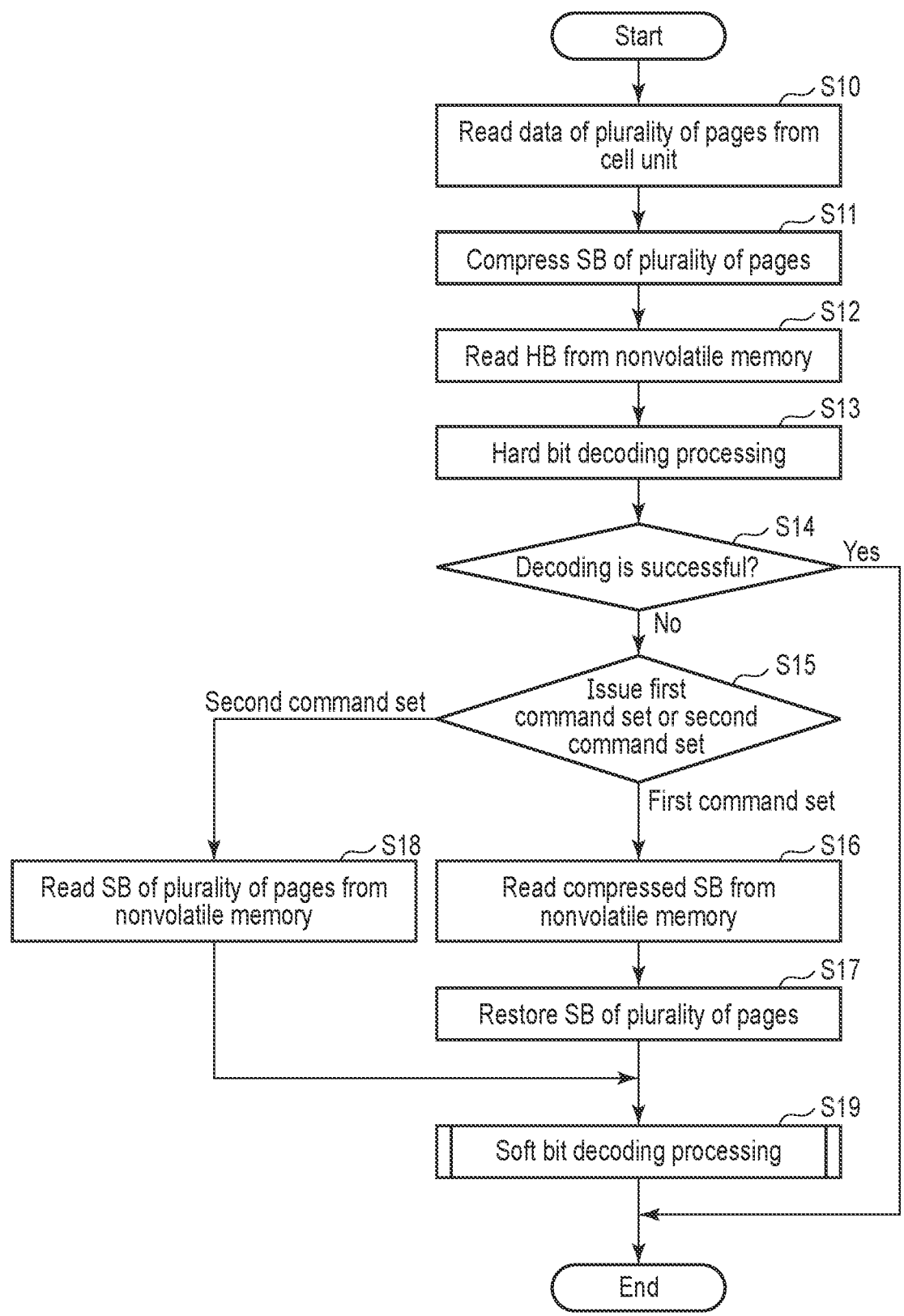
FIG. 24 is a flowchart of a read operation in the memory system according to the first embodiment.

First, a flow of a read operation in the memory system 3 is described with reference to FIG. 24. FIG. 24 is a flowchart of the read operation. Note that the example of FIG. 24 illustrates a case where data of a plurality of pages is read from one cell unit CU.

As illustrated in FIG. 24, in response to receiving a read request from the host device 2, the memory controller 10 starts a read operation. The nonvolatile memory 20 performs a read operation of data of a plurality of pages stored in the cell unit CU based on the control of the memory controller 10 (step S10). For example, in a case where the memory cell transistor MC is the TLC, the read operation of the lower page, the read operation of the middle page, and the read operation of the upper page are performed.

The sense amplifier 213 compresses the soft bit data SB of a plurality of pages to calculate the compressed soft bit data SB (step S11). More specifically, the sense amplifier 213 compresses the soft bit data SB_L, SB_M, and SB_U (OR operation) to calculate the compressed soft bit data SB.

The memory controller 10 reads the hard bit data HB of a plurality of pages from the nonvolatile memory 20 (step S12). More specifically, for example, the memory controller 10 reads the hard bit data HB_L, HB_M, and HB_U from the nonvolatile memory 20. Note that at least a portion of steps S11 and S12 may be performed in parallel, or step S12 may be started before step S11.

The hard bit decoding circuit 161 performs a hard bit decoding process (step S13). More specifically, for example, the hard bit decoding circuit 161 performs, by using the hard bit data HB_L, HB_M, and HB_U, the hard bit decoding process on the lower page, the middle page, and the upper page, respectively.

When the hard bit decoding process is successful (step S14 Yes), the memory controller 10 transmits the decoded user data to the host device 2, and the read operation is ended.

When the hard bit decoding process fails (step S14_No), the memory controller 10 issues the first command set or the second command set to the nonvolatile memory 20 (step S15).

By issuing the first command set to the nonvolatile memory 20 (step S15_first command set), the memory controller 10 reads the compressed soft bit data SB from the nonvolatile memory 20 (step S16). At this time, the soft bit data SB_L, SB_M, and SB_U are not read from the nonvolatile memory 20 to the memory controller 10.

The SB restoration circuit 163 restores the soft bit data SB of each page from the compressed soft bit data SB read in step S16 (step S17). More specifically, for example, the SB restoration circuit 163 restores the soft bit data SB_L, SB_M, and SB_U from the compressed soft bit data SB using the hard bit data HB_L, HB_M, and HB_U.

In addition, the memory controller 10 reads soft bit data SB of a plurality of pages from the nonvolatile memory 20 by issuing a second command set (step S15_second command set) (step S18).

Then, the soft bit decoding circuit 162 performs a soft bit decoding process by using the soft bit data acquired in step S17 or step S18 (step S19). A more specific process of the soft bit decoding process is described below with reference to FIG. 25. The soft bit decoding circuit 162 performs a soft bit decoding process of the lower page data, the middle page data, and the upper page data by using the hard bit data HB_L, HB_M, and HB_U, the soft bit data SB_L, SB_M, and SB_U, and the LLR table.

First Example of Soft Decision Decoding Process

Figure 25:
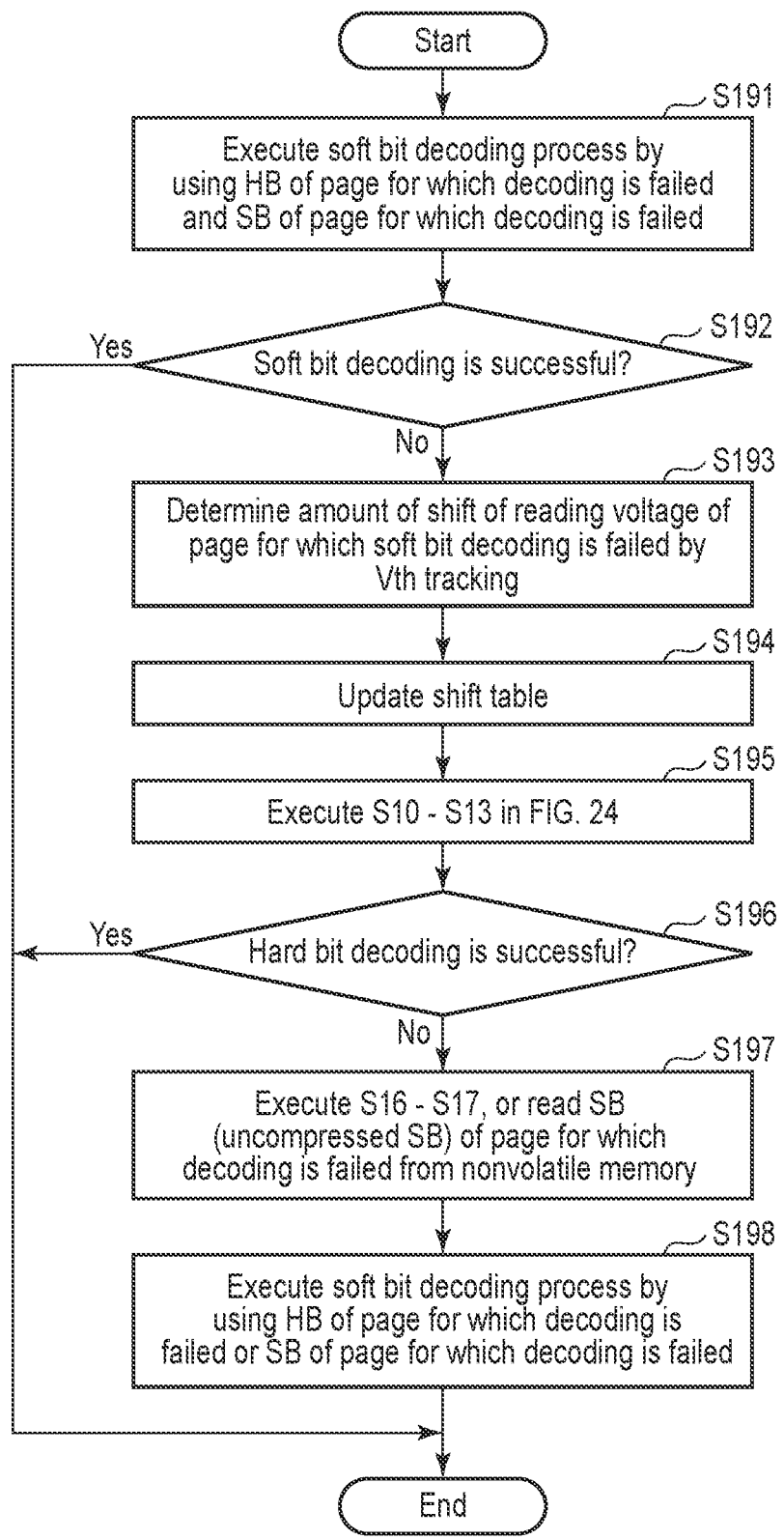
FIG. 25 is a flowchart illustrating a first example of a soft bit decoding process in the memory system according to the first embodiment.

A first example of the soft bit decoding process performed in step S19 in FIG. 24 is described with reference to FIG. 25. FIG. 25 is a flowchart illustrating the first example of the soft bit decoding process in the memory system according to the first embodiment.

The memory controller 10 performs, by using the hard bit data of the page for which the hard bit decoding process is failed in step S13 of FIG. 24 and the soft bit data of the page for which the hard bit decoding process is failed, soft bit decoding for correcting an error in the hard bit data of the page for which the hard bit decoding process is failed (step S191).

The memory controller 10 determines whether the soft bit decoding performed in step S191 is successful (step S192).

When the soft bit decoding is successful (Yes in step S192), the memory controller 10 ends the process.

When soft bit decoding is failed (No in step S192), the memory controller 10 determines a shift amount to be applied to the read voltage of the page for which soft bit decoding is failed by performing a tracking operation (Vth tracking) (step S193). In the Vth tracking, the memory controller 10 measures the number of ON-cells while finely changing the read voltage applied to the word line to search for the voltage corresponding to the intersection (valley position) of the overlapping threshold distributions. The number of ON-cells is the number of memory cell transistors turned on by applying a read voltage. For example, in a case where the page for which soft bit decoding is failed is the lower page, the memory controller 10 performs the tracking operation with respect to the read voltages VA and VE. As a result, the shift amount to be applied to the read voltage VA and the shift amount to be applied to the read voltage VE are determined. For example, in the tracking operation with respect to the read voltage VA, the voltage corresponding to the intersection between the threshold voltage distribution of the "Er" state and the threshold voltage distribution of the "A" state is searched, and the difference between the searched voltage and the current read voltage VA is determined as the shift amount to be applied to the read voltage VA. Similarly, in the tracking operation with respect to the read voltage VE, the voltage corresponding to the intersection between the threshold voltage distribution of the "D" state and the threshold voltage distribution of the "E" state is searched, and the difference between the searched voltage and the current read voltage VE is determined as the shift amount to be applied to the read voltage VE.

The memory controller 10 updates the shift table based on the shift amount determined in step S193 (step S194). The shift table is a table that stores the shift amount of the read voltage for each word line of the plurality of blocks of each of the plurality of blocks of the nonvolatile memory 20.

FIG. 26 illustrates an example of the shift table. For example, when reading data from the lower page of the word line WL0 of the block BLK0, the memory controller 10 instructs the nonvolatile memory 20 to change the read voltage VA by a shift amount ΔVA1 and change the read voltage VE by a shift amount ΔVE1. In the nonvolatile memory 20, the read operation corresponding to the "A" state is performed by two read operations including a read operation using the read voltage VAL and a read operation using the read voltage VAH. Since the read voltage VAL and the read voltage VAH are determined from the read voltage VA, in response to the read voltage VA is changed by the shift amount ΔVA1, each of the read voltage VAL and the read voltage VAH is also changed by the shift amount ΔVA1. In the nonvolatile memory 20, the read operation corresponding to the "E" state is performed by two read operations including a read operation using the read voltage VEL and a read operation using the read voltage VEH. Since the read voltage VEL and the read voltage VEH are determined from the read voltage VE, in response to the read voltage VE is changed by the shift amount ΔVE1, each of the read voltage VEL and the read voltage VEH is also changed by the shift amount ΔVE1.

The description refers back to FIG. 25. Using the shift amount of each read voltage recorded in the shift table updated in step S194, the memory controller 10 performs the processes from steps S10 to S13 in FIG. 24 again (step S195). For example, when reading the hard bit data of the lower page, the memory controller 10 performs a shift reading process. In the shift reading process, the memory controller 10 instructs the nonvolatile memory 20 to change the read voltage VA by the shift amount ΔVA1 and change the read voltage VE by the shift amount ΔVE1 and further instructs the nonvolatile memory 20 to read the hard bit data of the lower page. As a result, the memory controller 10 causes the nonvolatile memory 20 to perform two read operations using the voltage VAL and the voltage VAH each shifted by ΔVA1, and two read operations using the voltage VEL and the voltage VEH each shifted by ΔVE1. In this manner, the memory controller 10 reads the hard bit data HB_L, HB_M, and HB_U from the nonvolatile memory 20 and performs hard bit decoding of the lower page, the middle page, and the upper page using the hard bit data HB_L, HB_M, and HB_U, respectively. In a case where only the soft bit decoding of the hard bit data of the lower page fails in step S191, the memory controller 10 only needs to perform hard bit decoding of the hard bit data HB_L.

The memory controller 10 determines whether the hard bit decoding is successful (step S196).

In a case where the hard bit decoding is successful (Yes in step S196), the memory controller 10 ends the process.

In a case where the hard bit decoding fails (No in step S196), the memory controller 10 performs the processing of steps S16 and S17 in FIG. 24 or reads the soft bit data SB (uncompressed SB) of the page for which the hard bit decoding fails from the nonvolatile memory 20 (step S197). By the process of step S197, soft bit data of a page for which hard bit decoding is failed is acquired.

The memory controller 10 performs soft bit decoding for correcting an error in the hard bit data HB acquired in step S195 by using the soft bit data SB acquired in step S197 and the hard bit data HB acquired in step S195 (step S198).

Second Example of Soft Decision Decoding Process

Figure 27:
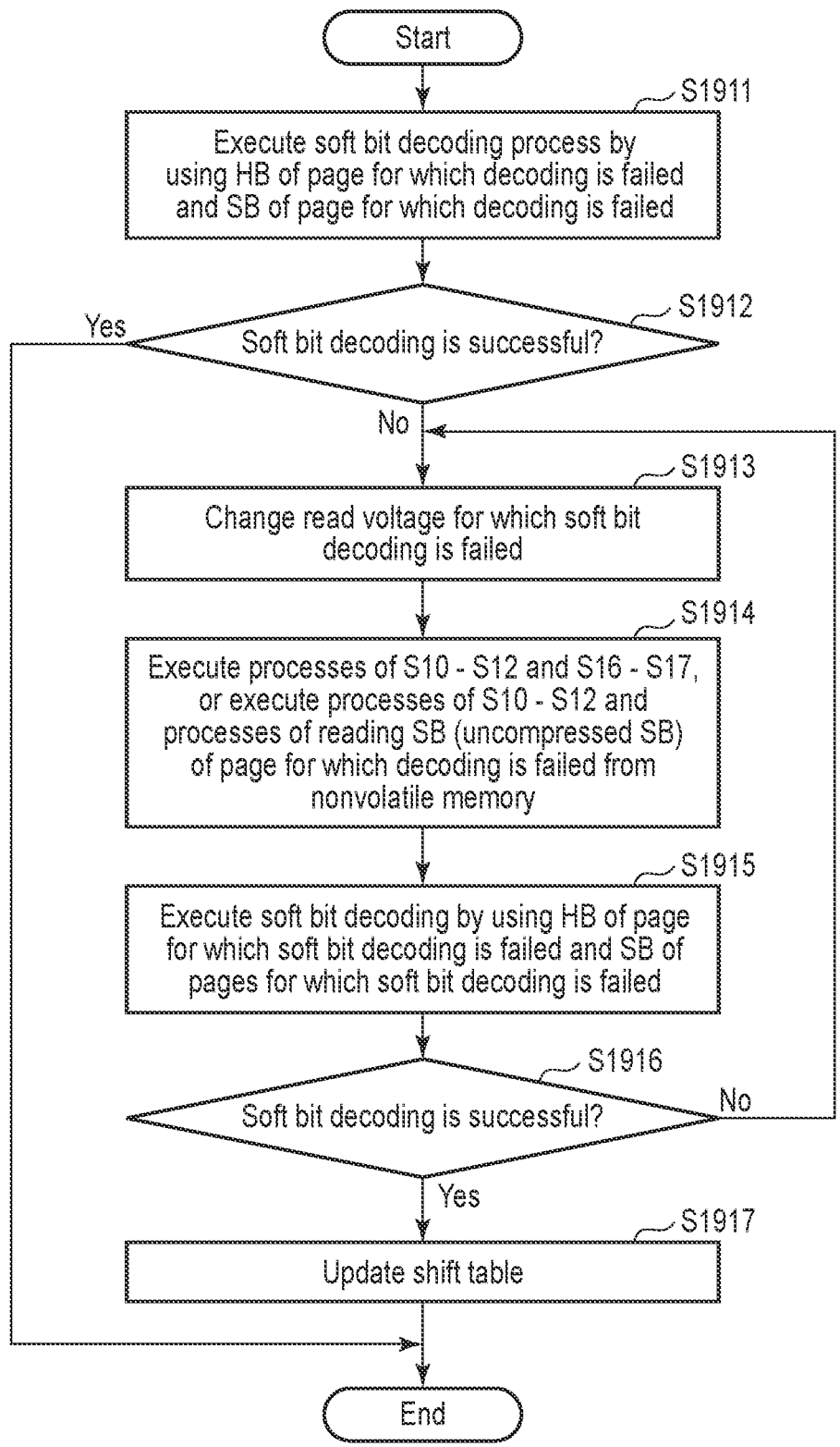
FIG. 27 is a flowchart illustrating a second example of a soft bit decoding process in the memory system according to the first embodiment.

A procedure of a second example of the soft bit decoding process performed in step S19 in FIG. 24 is described with reference to FIG. 27. FIG. 27 is a flowchart illustrating the second example of the soft bit decoding process in the memory system according to the first embodiment.

The memory controller 10 performs, by using the hard bit data of the page for which the hard bit decoding process is failed in step S13 of FIG. 24 and the soft bit data of the page for which the hard bit decoding process is failed, soft bit decoding for correcting an error in the hard bit data of the page for which the hard bit decoding process is failed (step S1911).

The memory controller 10 determines whether the soft bit decoding performed in step S1911 is successful (step S1912).

When the soft bit decoding is successful (Yes in step S1912), the memory controller 10 ends the process.

When soft bit decoding is failed (No in step S1912), the memory controller 10 changes the read voltage of the page for which soft bit decoding is failed (step S1913). For example, the memory controller 10 updates the shift amount so that the absolute value of the shift amount recorded in the shift table increases. That is, when the shift amount is a positive value, the shift amount is updated so that the read voltage further shifts in the positive direction, and when the shift amount is a negative value, the shift amount is updated so that the read voltage further shifts in the negative direction. For example, in a case where the page for which soft bit decoding is failed is the lower page, the memory controller 10 changes the read voltage VA and the read voltage VE by updating ΔVA and ΔVE recorded in the shift table. In a case where the shift amount recorded in the shift table is 0, the memory controller 10 updates the shift amount so that the read voltage is shifted in either the positive direction or the negative direction.

The memory controller 10 performs the process from step S10 to step S12 in FIG. 24 and the process of steps S16 and S17 in FIG. 24 by using the shift amount updated in step S1913 (step S1914). For example, when reading the hard bit data of the lower page, the memory controller 10 performs a shift reading process. In the shift reading process, the memory controller 10 instructs the nonvolatile memory 20 to change the read voltage VA by the updated shift amount ΔVA1 and change the read voltage VE by the updated shift amount ΔVE1 and further instructs the nonvolatile memory 20 to read the hard bit data of the lower page.

Alternatively, in step S1914, the memory controller 10 may perform the process from step S10 to step S12 in FIG. 24 and the process of reading the soft bit data SB (uncompressed SB) of the page for which soft bit decoding is failed from the nonvolatile memory 20 by using the shift amount updated in step S1913 (step S1914).

By the process in step S1914, hard bit data of a page for which soft bit decoding is failed and soft bit data of a page for which soft bit decoding is failed are acquired.

The memory controller 10 performs, by using the hard bit data of the page for which soft bit decoding is failed and the soft bit data of the page for which soft bit decoding is failed, soft bit decoding for correcting an error in the hard bit data of the page for which soft bit decoding is failed again (step S1915).

The memory controller 10 determines whether the soft bit decoding in step S1915 is successful (step S1916).

When the soft bit decoding is failed (No in step S1916), the memory controller 10 returns to step S1913 and updates the shift amount of the read voltage so that the absolute value of the shift amount of the read voltage becomes larger, thereby changing the read voltage again. Then, the memory controller 10 performs the process of step S1914 and the process of step S1915 again.

The memory controller 10 repeatedly performs the processes of steps S1913 to S1915 until soft bit decoding is successful.

When the soft bit decoding is successful (Yes in step S1916), the memory controller 10 updates the shift table so that the shift amount after the change in step S1913 is registered in the shift table (step S1917).

Effects According to Present Embodiment

Effects obtained by the configuration according to the present embodiment is described in detail.

For example, when soft bit decoding process is performed, at least one item of soft bit data is required for one page. Therefore, soft bit data for a plurality of pages is read from the nonvolatile memory to the memory controller according to the number of pages of the cell unit CU. For example, in the case of the TLC, at least page data of a total of six pages including three pages of hard bit data and three pages of soft bit data corresponding to the lower page, the middle page, and the upper page is read. Therefore, as the multi-value of the memory cell transistor progresses, the amount of data transfer from the nonvolatile memory to the memory controller increases. For this reason, the data transfer time increases, and the processing capacity of the memory system decreases.

Meanwhile, when the first command set in the configuration according to the present embodiment is used, the nonvolatile memory 20 can compress (logical sum operation) the soft bit data SB of a plurality of pages of the cell unit CU, calculate the compressed soft bit data SB of 1-page data, and output the compressed soft bit data SB together with the hard bit data HB. Therefore, an increase in the amount of data transfer can be suppressed as compared with the case of outputting the uncompressed soft bit data for three pages. Therefore, the data transfer time can be shortened, and the processing capability of the memory system 3 can be improved.

Furthermore, with the configuration according to the present embodiment, the memory controller 10 can restore the soft bit data SB corresponding to each page from the hard bit data HB and the compressed soft bit data SB.

In addition, there may be a case where a memory controller that does not support the function of restoring uncompressed soft bit data from compressed soft bit data SB is mounted as the memory controller 10 in the memory system 3. In addition, even when the memory controller 10 supporting the function of restoring uncompressed soft bit data is mounted in the memory system 3, there may be a case where the memory controller 10 desires to use uncompressed soft bit data. In such a case, the memory controller 10 can request the nonvolatile memory 20 to output uncompressed soft bit data by issuing the second command set to the nonvolatile memory 20. Based on the second command set, the nonvolatile memory 20 can output, to the memory controller 10, the hard bit data for three pages corresponding to the lower page, the middle page, and the upper page, and the soft bit data for three pages corresponding to the lower page, the middle page, and the upper page.

When outputting soft bit data for three pages, the nonvolatile memory 20 can restore the soft bit data SB_L, SB_M, and SB_U based on the hard bit data HB_L, HB_M, and HB_U stored in the latch circuits ADL, BDL, and CDL and the compressed soft bit data SB stored in the latch circuit TDL. As a result, the soft bit data SB_L, SB_M, and SB_U for three pages can be output to the memory controller 10 using the stored hard bit data for three pages and the stored compressed soft bit data for one page without storing the soft bit data SB_L, SB_M, and SB_U for three pages in different latch circuits. Therefore, the memory controller 10 can perform the error correction process by using the hard bit data HB_L, HB_M, and HB_U and the soft bit data SB_L, SB_M, and SB_U without performing the process of restoring the uncompressed soft bit data from the compressed soft bit data SB.

Furthermore, in the present embodiment, each of the hard bit data HB_L, HB_M, and HB_U is determined by a read operation using one of two voltages obtained by shifting a read voltage corresponding to at least one sensing target state in mutually different directions of the negative direction and the positive direction. For example, for the lower page, the hard bit data HB_L is determined by a read operation using one voltage (for example, VAL) out of two voltages (VAL, VAH) obtained by shifting the read voltage VA corresponding to at least one sensing target state (for example, "A" state) in mutually different directions of the negative direction and the positive direction. Furthermore, each item of soft bit data is data generated by a logical operation (EXOR or the like) between the corresponding hard bit data and data determined by a read operation using the other voltage out of the two voltages of the corresponding sensing target state. For example, the soft bit data SB_L is generated by a logical operation (EXOR or the like) between the hard bit data HB_L determined by a read operation using one voltage (for example, VAL) of two voltages (VAL, VAH) of a sensing target state (for example, "A" state) and data determined by a read operation using the other voltage (for example, VAH) of the two voltages (VAL, VAH). In this manner, the data determined by the read operation using one of the two voltages corresponding to the sensing target state is generated as the hard bit data that is the data used for hard bit decoding, and each item of soft bit data is generated by the logical operation between the corresponding hard bit data and the data determined by the read operation using the other of the two voltages of the corresponding sensing target state, whereby the compression and the restoration of the soft bit data SB_L, SB_M, and SB_U can be efficiently performed.

Second Embodiment

Next, a second embodiment is described. In the second embodiment, a flow of a read operation different from that of the first embodiment is described. Hereinafter, differences from the first embodiment are mainly described.

Flow of Read Operation

Figure 28:
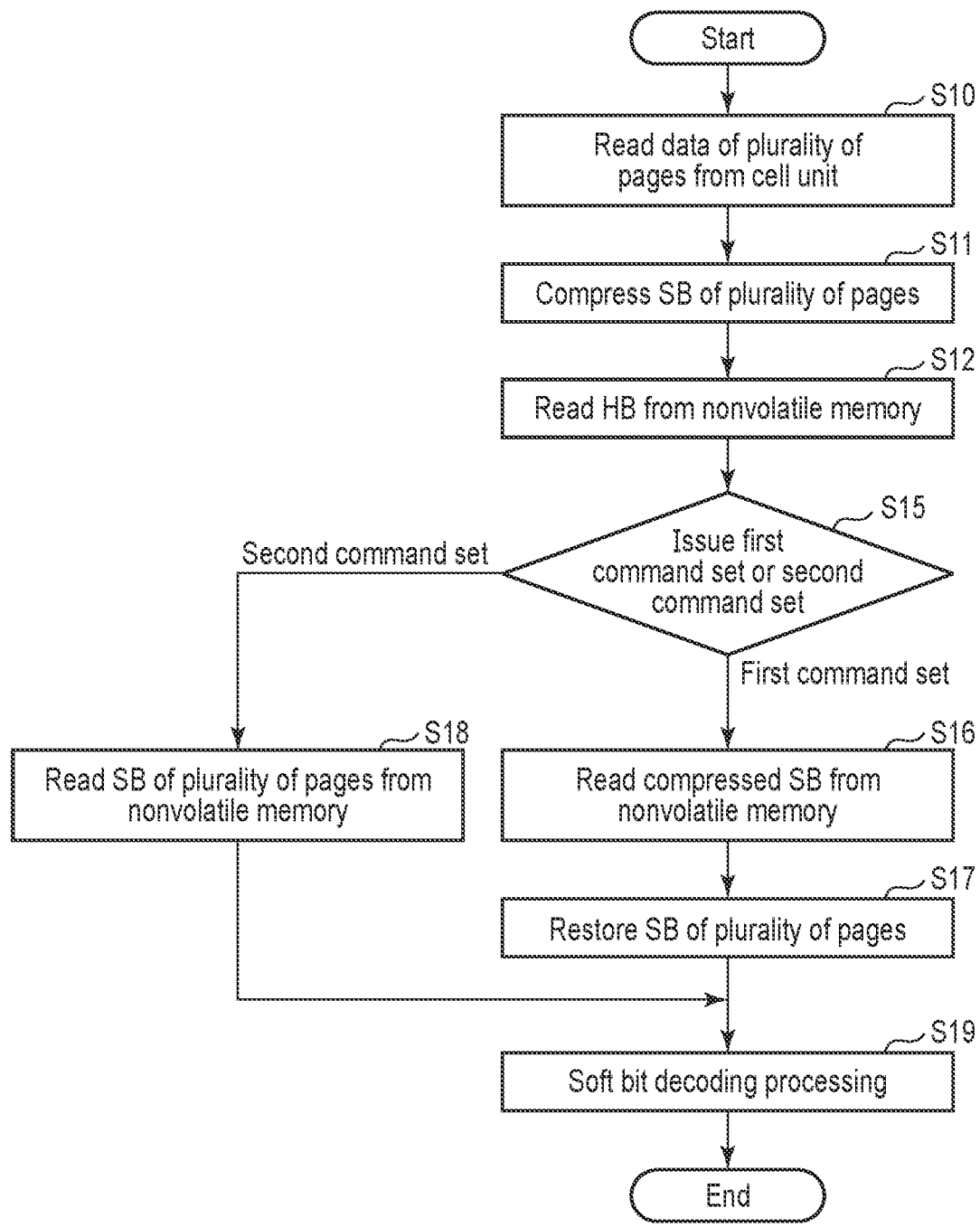
FIG. 28 is a flowchart of a read operation in a memory system according to a second embodiment.

First, a flow of a read operation in the memory system 3 is described with reference to FIG. 28. FIG. 28 is a flowchart of the read operation. Note that the example of FIG. 28 illustrates a case where data of a plurality of pages is read from one cell unit CU.

As illustrated in FIG. 28, unlike FIG. 24 of the first embodiment, the steps of the hard bit decoding process (steps S13 and S14) are omitted.

After reading the hard bit data HB of a plurality of pages from the nonvolatile memory 20 (step S12), the memory controller 10 successively issues a first command set (first command set in step S15) and reads the compressed soft bit data SB from the nonvolatile memory 20 (step S16).

Alternatively, after reading a plurality of pieces of hard bit data from the nonvolatile memory 20 (step S12), the memory controller 10 successively issues a second command set (second command set in step S15) and reads soft bit data SB (uncompressed SB) of a plurality of pages from the nonvolatile memory 20 (step S18).

The processes of steps S17 and S19 are similar to those of the first embodiment.

Effects According to Present Embodiment

With the configuration according to the present embodiment, the same effects as those of the first embodiment can be obtained.

Third Embodiment

Next, a third embodiment is described. In the third embodiment, a read operation different from that of the first embodiment and the second embodiment is described. Hereinafter, differences from the first and second embodiments are mainly described.

Configuration of Data Register and Sense Amplifier

Figure 29:
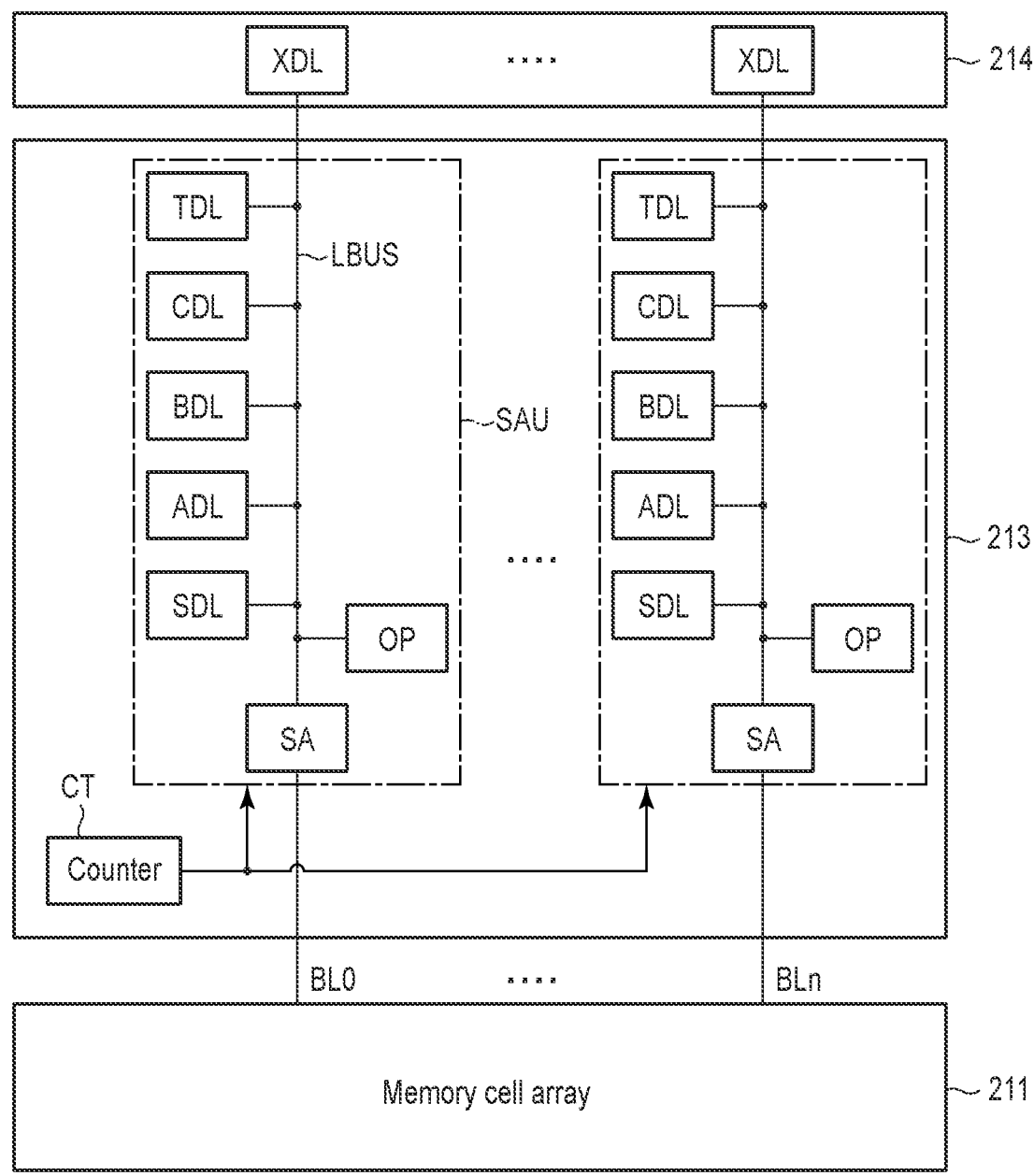
FIG. 29 is a block diagram of a data register and a sense amplifier included in the nonvolatile memory according to a third embodiment.

First, examples of configurations of the data register 214 and the sense amplifier 213 are described with reference to FIG. 29. FIG. 29 is a block diagram of the data register 214 and the sense amplifier 213.

As illustrated in FIG. 29, the sense amplifier 213 of the present embodiment includes a counter CT. Other configurations are similar to those in FIG. 6 of the first embodiment.

The counter CT is a counter that counts the number of items of data of "1" (the number of bits) in the 1-page data of the compressed soft bit data SB. The counter CT transfers the count result to the sequencer 206. For example, the sequencer 206 transfers the count result as the status information STS to the status register 205. Note that the data for which the counter CT counts the number of items of data of "1" is not limited to the compressed soft bit data SB. For example, the counter CT may count the number of items of data of "1" of the soft bit data SB_L, SB_M, and SB_U. In addition, the counter CT may count the number of items of data of "0". The counter CT counts the number of items of data (the number of bits) of any logic level in the latch circuit to be counted.

Figure 30:
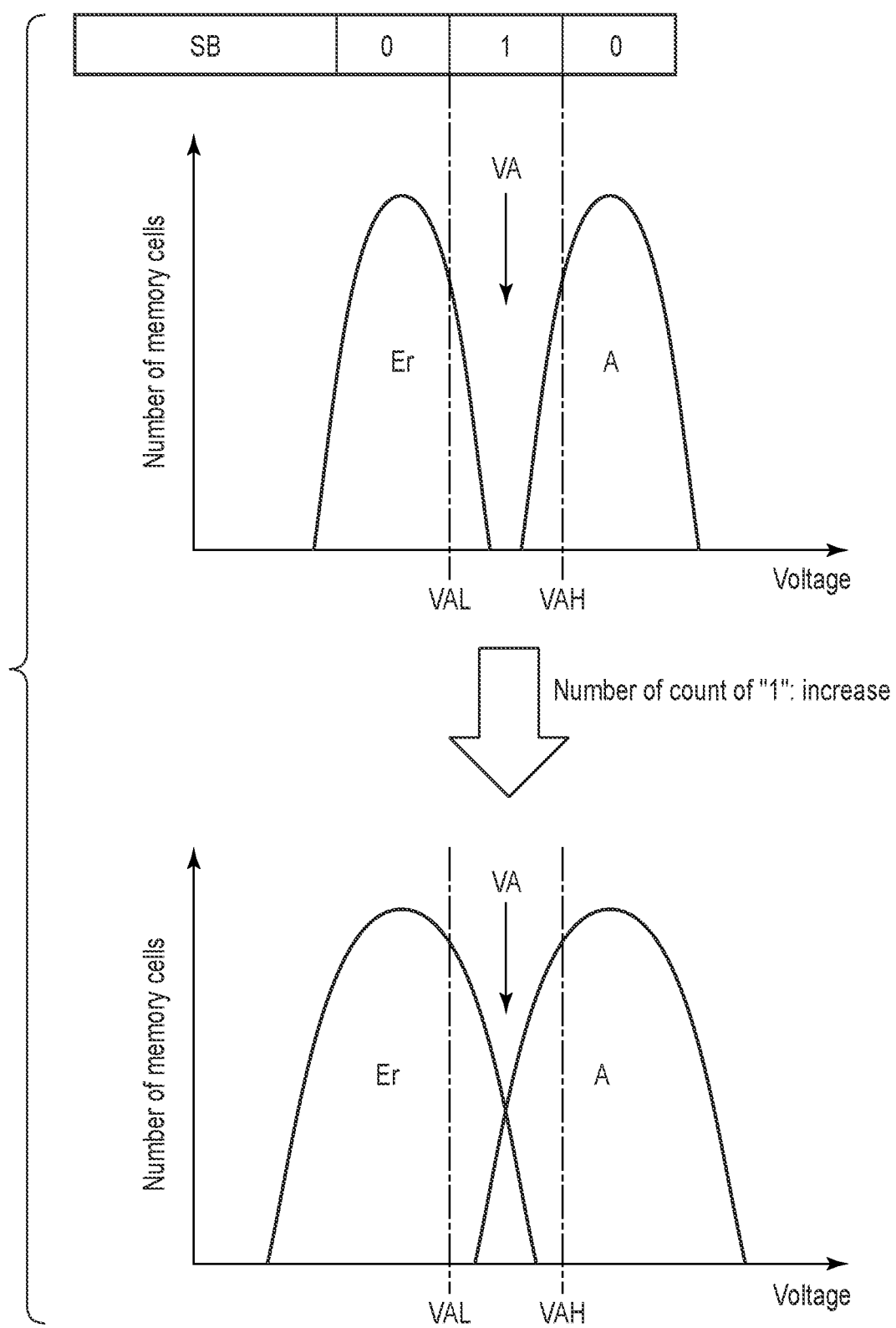
FIG. 30 is a diagram illustrating relationships between threshold voltage distributions of an "Er" state and an "A" state and the number of counts in a memory system according to the third embodiment.

Specific Example of Relationship Between Number of Counts and Threshold Voltage Distribution Next, a specific example of the relationship between the number of counts by the counter CT and the threshold voltage distribution is described with reference to FIG. 30. FIG. 30 is a diagram illustrating a relationship between the threshold voltage distributions of the "Er" state and the "A" state and the number of counts.

As shown in FIG. 30, for example, when there is no overlap between the threshold voltage distribution of the "Er" state and the threshold voltage distribution of the "A" state, the number of memory cell transistors MC of which the threshold voltages are between the voltage VAL and the voltage VAH is relatively small. In other words, the number of memory cell transistors MC of which the soft bit data SB is data of "1" is relatively small. In such a case, the number of counts of data of "1" by the counter CT is relatively small. On the other hand, when the overlapping region of the tails of the threshold voltage distributions becomes large, the number of memory cell transistors MC of which the threshold voltage is between the voltage VAL and the voltage VAH increases. In other words, the number of the memory cell transistors MC of which the soft bit data SB is data of "1" increases. When the region where the tails of the threshold voltage distributions overlap becomes large, the number of fail bits increases, and the likeliness that the hard bit decoding process fails increases. Therefore, the difficulty level of the hard bit decoding process can be estimated by the number of counts of data of "1" of the compressed soft bit data SB.

Flow of Read Operation

Figure 31:
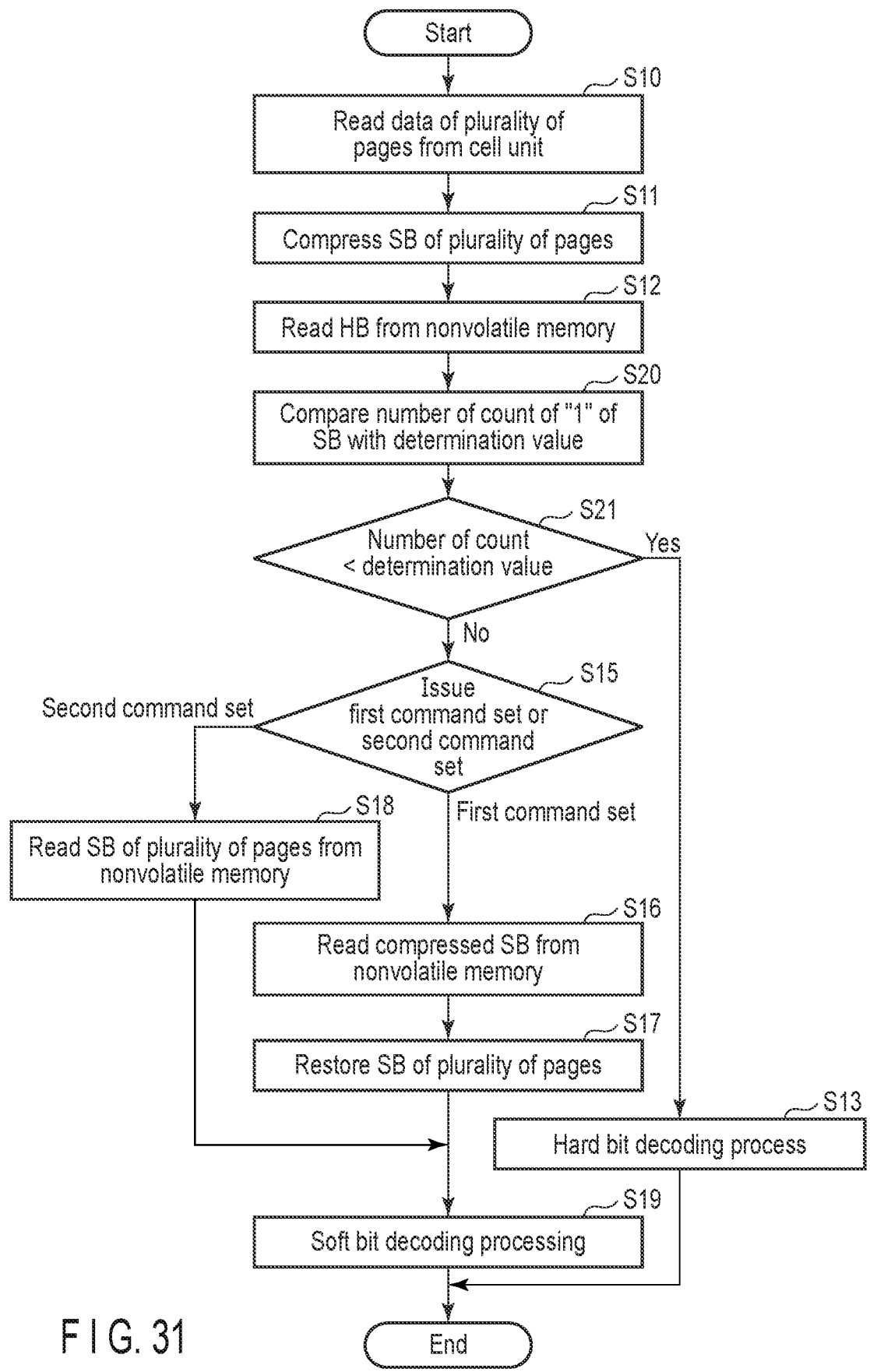
FIG. 31 is a flowchart of a read operation in the memory system according to the third embodiment.

Next, a flow of a read operation in the memory system 3 is described with reference to FIG. 31. FIG. 31 is a flowchart of the read operation. Note that the example of FIG. 31 illustrates a case where data of a plurality of pages is read from one cell unit CU.

As illustrated in FIG. 31, the processes from steps S10 to S12 are the same as those in the first embodiment.

After step S12, the memory controller 10 reads the number of counts of data of "1" of the compressed soft bit data SB from the nonvolatile memory 20. Then, the memory controller 10 compares the number of counts with a preset determination value (Step S20, Step S21). The nonvolatile memory 20 may compare the number of counts with the determination value. In this case, the memory controller 10 reads the comparison result from the nonvolatile memory 20. Further, the nonvolatile memory 20 may count the number of items of data of "1" in each of the soft bit data SB_L, SB_M, and SB_U. In this case, the memory controller 10 may compare each number of counts with the determination value.

If the number of counts is less than the determination value (step S21_Yes), the memory controller 10 performs the hard bit decoding process (step S13). In this case, since it is highly likely that the hard bit decoding process succeeds, the memory controller 10 performs the hard bit decoding process as it is without performing the reading of the compressed soft bit data SB.

When the number of counts is greater than or equal to the determination value (step S21_No), the memory controller 10 performs the operations of steps S15 to S19 as in the first embodiment.

Command Sequence of Read Operation

Figure 32:
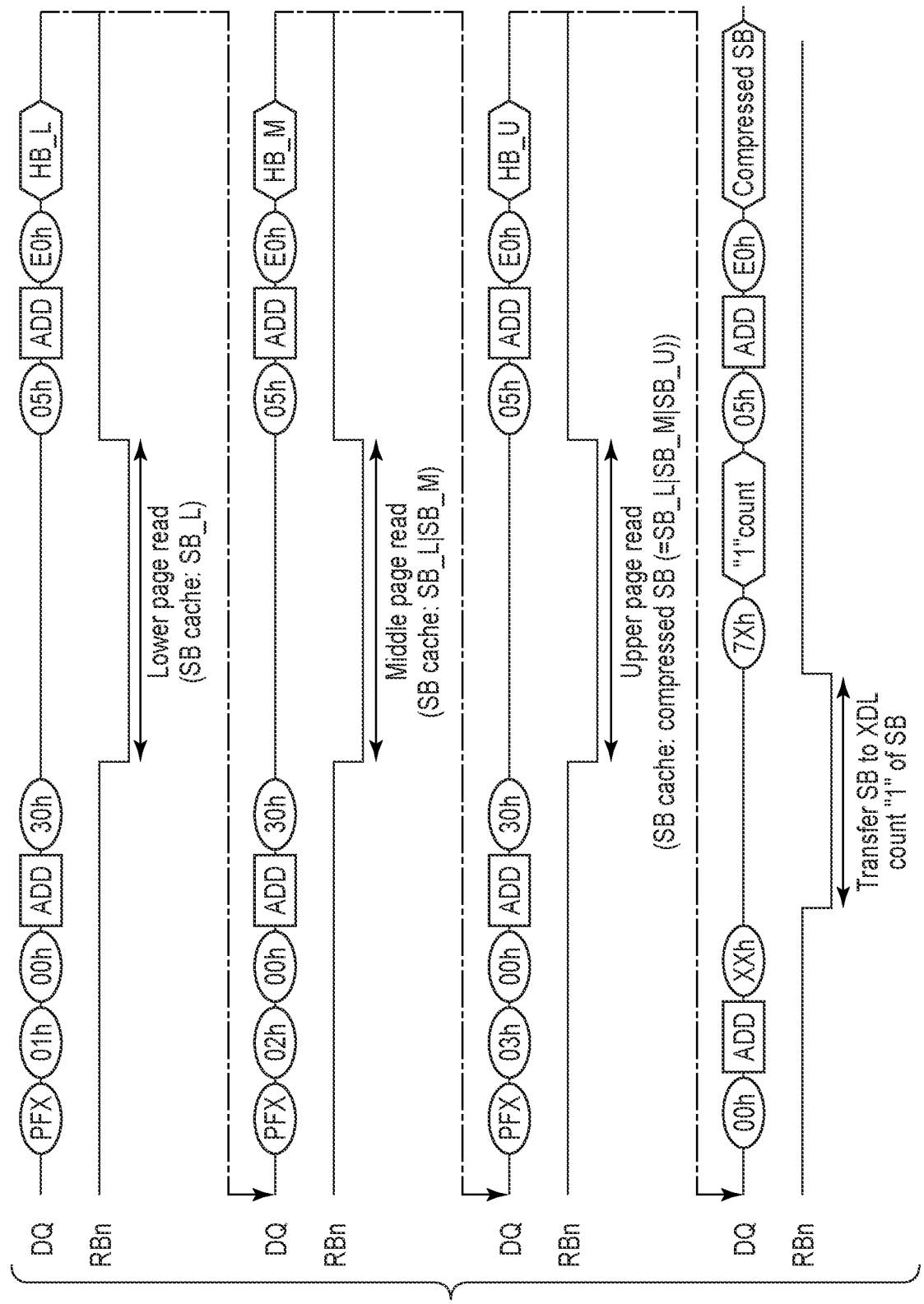
FIG. 32 is an example of a command sequence of the read operation in the memory system according to the third embodiment.

Next, an example of a command sequence of the read operation is described with reference to FIG. 32. FIG. 32 is a command sequence of the read operation. In the example of FIG. 32, in order to simplify the description, the signals CEn, CLE, ALE, WEn, REn, DQS, and DOSn are omitted, and the signal DQ and the ready/busy signal RBn are illustrated. In the signal DQ, the command is written in a round frame, the address is written in a square frame, and the data is written in a hexagonal frame.

Although the example of FIG. 32 illustrates a case where the first read mode is performed, the present embodiment can also be applied to the second read mode or the third read mode. Hereinafter, a case where the first command set is used is described, but the second command set may be used instead of the first command set.

As illustrated in FIG. 32, the command set up to the cache read operation of the hard bit data HB_U is similar to that in FIG. 18 of the first embodiment.

After reading the hard bit data HB_U from the nonvolatile memory 20, the memory controller 10 transmits, to the nonvolatile memory 20, a command set for reading (transferring) the compressed soft bit data SB to the latch circuit XDL. More specifically, the memory controller 10 successively transmits the command "00h", the address "ADD", and a command "XXh" to the nonvolatile memory 20.

In response to receiving the command "XXh", the nonvolatile memory 20 sets the ready/busy signal RBn to the "L" level and transfers the compressed soft bit data SB, for example, from the latch circuit TDL to the latch circuit XDL. At this time, the counter CT counts the number of data of "1" of the compressed soft bit data SB. The number of counts is stored in the status register 205.

When the transfer of the compressed soft bit data SB and the counting of the number of items of data of "1" are ended, the nonvolatile memory 20 sets the ready/busy signal RBn to the "H" level.

In response to confirming the ready/busy signal RBn at the "H" level, the memory controller 10 transmits a command set for reading the number of counts. The memory controller 10 reads the information of the number of counts as the status information STS from the status register 205. More specifically, the memory controller 10 transmits a command "7Xh" to the nonvolatile memory 20. The command "7Xh" is a command for performing reading of the status information STS.

When receiving the command "7Xh", the nonvolatile memory 20 transmits information of the number of counts (the count of "1" in FIG. 21) as the status information STS to the memory controller 10.

After receiving the information of the number of counts, the memory controller 10 transmits a command set of the cache read operation of the compressed soft bit data SB to the nonvolatile memory 20. More specifically, the memory controller 10 successively transmits a command "05h", the address "ADD", and a command "E0h" to the nonvolatile memory 20.

The nonvolatile memory 20 transmits the compressed soft bit data SB of the data register 214 to the memory controller 10.

Effects According to Present Embodiment

With the configuration according to the present embodiment, the same effects as those of the first embodiment can be obtained.

Further, with the configuration according to the present embodiment, the nonvolatile memory 20 includes the counter CT that counts the number of items of data of "1" of the compressed soft bit data SB. By counting the number of items of data of "1", the difficulty level of the hard bit decoding process can be determined. In a case where the number of counts is less than the preset determination value, the memory controller 10 determines that the hard bit decoding process is highly likely to be successful and can omit reading (data transfer) of the compressed soft bit data SB from the nonvolatile memory 20. Therefore, in a case where the hard bit decoding process is highly likely to succeed, it is possible to avoid data transfer of the compressed soft bit data SB that is highly likely not to be used. Therefore, an increase in the data transfer amount can be suppressed.

Fourth Embodiment

Next, a fourth embodiment is described. In the fourth embodiment, a case where the memory cell transistor MC is a quad level cell (QLC) that stores 4-bit data including a lower bit, a middle bit, an upper bit, and a top bit is described. Hereinafter, differences from the first to third embodiments are mainly described.

Relationship Between Threshold Voltage Distribution of Memory Cell Transistor and Data Allocation First, an example of the relationship between the data allocation and the threshold voltage distribution of the memory cell transistor MC is described with reference to FIG. 33. FIG. 33 is a diagram illustrating a relationship between data allocation and a threshold voltage distribution of QLC.

As illustrated in FIG. 33, the threshold voltage of each memory cell transistor MC takes a value included, for example, in any of 16 discrete distributions. Hereinafter, the 16 distributions are referred to as a "S0" state, a "S1" state, a "S2" state, a "S3" state, a "S4" state, a "S5" state, a "S6" state, a "S7" state, a "S8" state, a "S9" state, a "S10" state, a "S11" state, a "S12" state, a "S13" state, a "S14" state, and a "S15" state, respectively, in ascending order of threshold voltages.

The "S0" state corresponds, for example, to a data erase state. Then, the "S1" to "S15" states correspond to a state in which charges are injected into the charge storage layer and data is written. In the write operation, verification voltages corresponding to the threshold voltage distributions are V1 to V15. Then, these voltage values have a relationship of $V1<V2<V3<V4<V5<V6<V7<V8<V9<V10<V11<V12<V13<V14<V15<Vread$.

More specifically, the threshold voltage included in the "S0" state is less than the voltage V1. The threshold voltage included in the "S1" state is the voltage V1 or more and less than the voltage V2. The threshold voltage included in the "S2" state is the voltage V2 or more and less than the voltage V3. The threshold voltage included in the "S3" state is the voltage V3 or more and less than the voltage V4. The threshold voltage included in the "S4" state is the voltage V4 or more and less than the voltage V5. The threshold voltage included in the "S5" state is the voltage V5 or more and less than the voltage V6. The threshold voltage included in the "S6" state is the voltage V6 or more and less than the voltage V7. The threshold voltage included in the "S7" state is the voltage V7 or more and less than the voltage V8. The threshold voltage included in the "S8" state is the voltage V8 or more and less than the voltage V9. The threshold voltage included in the "S9" state is the voltage V9 or more and less than the voltage V10. The threshold voltage included in the "S10" state is the voltage V10 or more and less than the voltage V11. The threshold voltage included in the "S11" state is the voltage V11 or more and less than the voltage V12. The threshold voltage included in the "S12" state is the voltage V12 or more and less than the voltage V13. The threshold voltage included in the "S13" state is the voltage V13 or more and less than the voltage V14. The threshold voltage included in the "S14" state is the voltage V14 or more and less than the voltage V15. The threshold voltage included in the "S15" state is the voltage V15 or more and less than the voltage VREAD.

As described above, each memory cell transistor MC has any one of the 16 threshold voltage distributions and thus can take 16 types of states. By allocating these states to "0000" to "1111" in binary notation, each memory cell transistor MC can store 4-bit data. Hereinafter, 4-bit data are referred to as a lower bit, a middle bit, an upper bit, and a top bit, respectively. Further, a set of lower bits collectively written to (or read from) the cell unit CU is referred to as a lower page. A set of middle bits is referred to as a middle page. A set of upper bits is referred to as an upper page. A set of top bits is referred to as a top page.

In the example of FIG. 33, data is allocated to the memory cell transistors MC included in each threshold voltage distribution as follows in "top bit/upper bit/middle bit/lower bit".

"S0" State: data of "1111"
"S1" State: data of "0111"
"S2" State: data of "0011"
"S3" State: data of "1011"
"S4" State: data of "1001"
"S5" State: data of "1000"
"S6" State: data of "0000"
"S7" State: data of "0001"
"S8" State: data of "0101"
"S9" State: data of "0100"
"S10" State: data of "0110"
"S11" State: data of "0010"
"S12" State: data of "1010"
"S13" State: data of "1110"
"S14" State: data of "1100"
"S15" State: data of "1101"

In a case where the data allocated in this manner is read, the lower bit is determined by the read operation corresponding to the "S5" state, the "S7" state, the "S9" state, and the "S15" state. The middle bit is determined by the read operation corresponding to the "S4" state, the "S10" state, and the "S14" state. The upper bit is determined by the read operation corresponding to the "S2" state, the "S8" state, the "S11" state, and the "S13" state. The top bit is determined by the read operation corresponding to the "S1" state, the "S3" state, the "S6" state, and the "S12" state. That is, the values of the lower bit, the middle bit, the upper bit, and the top bit are determined by read operations corresponding to four states, three states, four states, and four states, respectively. Hereinafter, such data allocation is referred to as a "4-3-4-4 code". Note that the data allocation is not limited to the 4-3-4-4 code.

Hard Bit Data and Compressed Soft Bit Data of Each State

Figure 34:
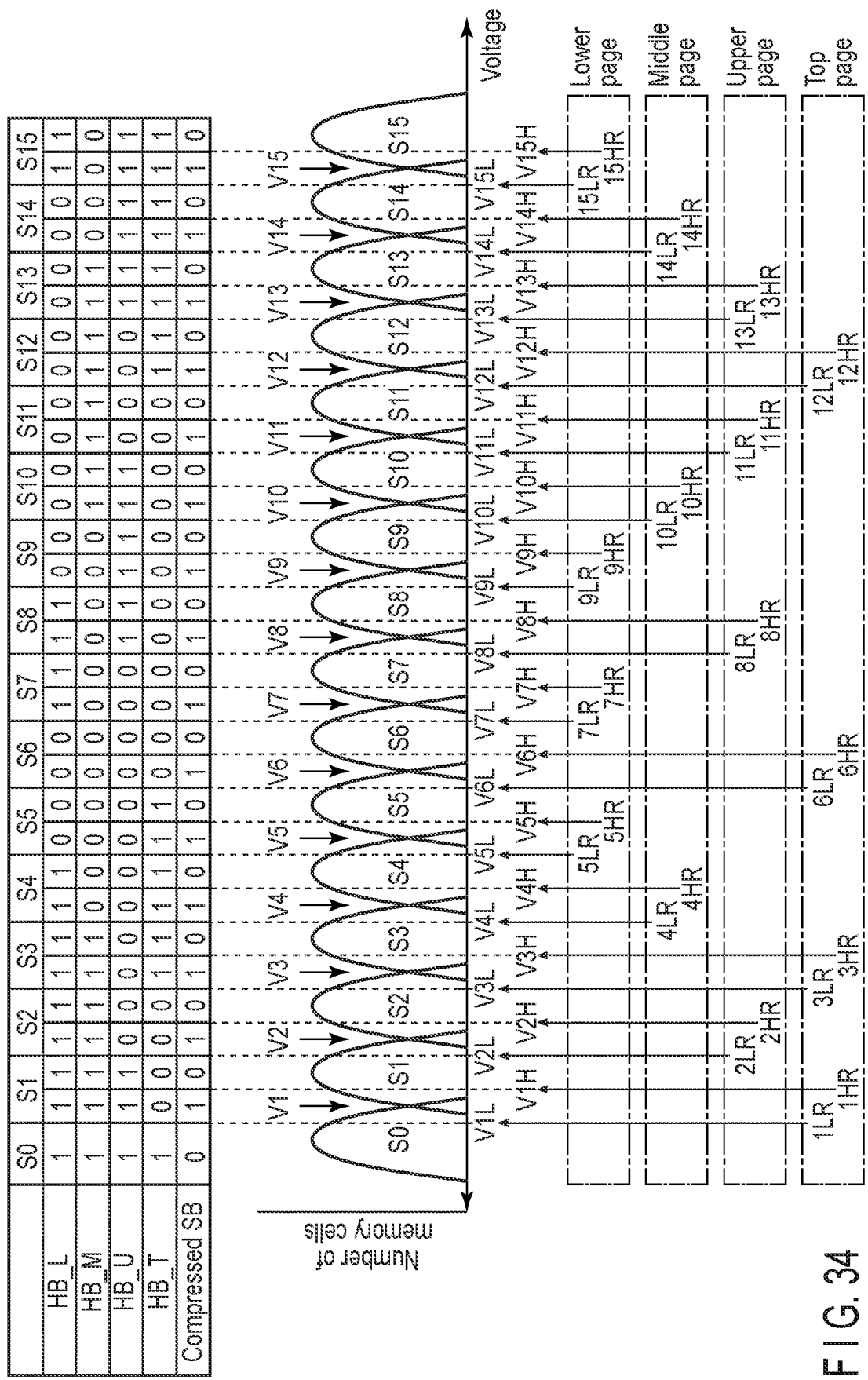
FIG. 34 is a diagram illustrating relationships between the threshold voltage distributions of the QLC and hard bit data and compressed soft bit data in the memory system according to the fourth embodiment.

Next, the hard bit data HB and the soft bit data SB of each state are described with reference to FIG. 34. FIG. 34 is a diagram illustrating a relationship between the threshold voltage distribution of the QLC and the hard bit data HB and the compressed soft bit data SB.

As illustrated in FIG. 34, the two read voltages corresponding to the "S1" state are a voltage V1L and a voltage V1H. Two read voltages corresponding to the "S2" state are set as a voltage V2L and a voltage V2H. Two read voltages corresponding to the "S3" state are set as a voltage V3L and a voltage V3H. Two read voltages corresponding to the "S4" state are set as a voltage V4L and a voltage V4H. Two read voltages corresponding to the "S5" state are set as a voltage V5L and a voltage V5H. Two read voltages corresponding to the "S6" state are set as a voltage V6L and a voltage V6H. Two read voltages corresponding to the "S7" state are set as a voltage V7L and a voltage V7H. Two read voltages corresponding to the "S8" state are set as a voltage V8L and a voltage V8H. Two read voltages corresponding to the "S9" state are set as a voltage V9L and a voltage V9H. Two read voltages corresponding to the "S10" state are set as a voltage V10L and a voltage V10H. Two read voltages corresponding to the "S11" state are set as a voltage V11L and a voltage V11H. Two read voltages corresponding to the "S12" state are set as a voltage V12L and a voltage V12H. Two read voltages corresponding to the "S13" state are set as a voltage V13L and a voltage V13H. Two read voltages corresponding to the "S14" state are set as a voltage V14L and a voltage V14H. Two read voltages corresponding to the "S15" state are set as a voltage V15L and a voltage V15H.

These voltages have a relationship of V1L<V1<V1H<V2L<V2<V2H<V3L<V3<V3H<V4L<V4<V4H<V5L<V5<V5H<V6L<V6<V6H<V7L<V7<V7H<V8L<V8<V8H<V9L<V9<V9H<V10L<V10<V10H<V11L<V11<V11H<V12L<V12<V12H<V13L<V13<V13H<V14L<V14<V14H<V15L<V15<V15H<VREAD.

Read operations using the voltage V1L, the voltage V1H, the voltage V2L, the voltage V2H, the voltage V3L, the voltage V3H, the voltage V4L, the voltage V4H, the voltage V5L, the voltage V5H, the voltage V6L, the voltage V6H, the voltage V7L, the voltage V7H, the voltage V8L, the voltage V8H, the voltage V9L, the voltage V9H, the voltage V10L, the voltage V10H, the voltage V11L, the voltage V11H, the voltage V12L, the voltage V12H, the voltage V13L, the voltage V13H, the voltage V14L, the voltage V14H, the voltage V15L, and the voltage V15H are performed by 1LR reading, 1 HR reading, 2LR reading, 2 HR reading, 3LR reading, 3 HR reading, 4LR reading, 4 HR reading, 5LR reading, 5 HR reading, 6LR reading, 6 HR reading, 7LR reading, 7 HR reading, 8LR reading, 8 HR reading, 9LR reading, 9 HR reading, 10LR reading, 10 HR reading, 11LR reading, 11 HR reading, 12LR reading, 12 HR reading, 13LR reading, 13 HR reading, 14LR reading, 14 HR reading, 15LR reading, and 15 HR reading, respectively.

In the read operation of the lower page, eight read operation of the 5LR reading, the 5 HR reading, the 7LR reading, the 7 HR reading, the 9LR reading, the 9 HR reading, the 15LR reading, and the 15 HR reading are performed. The hard bit data HB_L is data determined by the 5LR reading, the 7LR reading, the 9LR reading, and the 15LR reading. The soft bit data SB_L is based on an XOR operation of the hard bit data HB_L and data determined by the 5 HR reading, the 7 HR reading, the 9 HR reading, and the 15 HR reading.

In the read operation of the middle page, six read operations of the 4LR reading, the 4 HR reading, the 10LR reading, the 10 HR reading, the 14LR reading, and the 14 HR reading are performed. The hard bit data HB_M is data determined by the 5LR reading, the 10LR reading, and the 14LR reading. The soft bit data SB_M is based on an XOR operation of the hard bit data HB_M and data determined by the 4 HR reading, the 10 HR reading, and the 14 HR reading.

In the read operation of the upper page, eight read operation of the 2LR reading, the 2 HR reading, the 8LR reading, the 8 HR reading, the 11LR reading, the 11 HR reading, the 13LR reading, and the 13 HR reading are performed. The hard bit data HB_U is data determined by the 2LR reading, the 8LR reading, the 11LR reading, and the 13LR reading. The soft bit data SB_U is based on an XOR operation of the hard bit data HB_U and data determined by the 2 HR reading, the 8 HR reading, the 11 HR reading, and the 13 HR reading.

In the read operation of the top page, eight read operations of the 1LR reading, the 1 HR reading, the 3LR reading, the 3 HR reading, the 6LR reading, the 6 HR reading, the 12LR reading, and the 12 HR reading are performed. The hard bit data HB_T is data determined by the 1LR reading, the 3LR reading, the 6LR reading, and the 12LR reading. The soft bit data SB_T is based on an XOR operation of the hard bit data HB_T and data determined by the 1 HR reading, the 3 HR reading, the 6 HR reading, and the 12 HR reading.

The compressed soft bit data SB is data calculated by performing an OR operation on the soft bit data SB_L, SB_M, SB_U, and SB_T. Therefore, the data size of the hard bit data HB_L, the data size of the hard bit data HB_M, the data size of the hard bit data HB_U, the data size of the hard bit data HB_T, the data size of the soft bit data SB_L, the data size of the soft bit data SB_M, the data size of the soft bit data SB_U, the data size of the soft bit data SB_T, and the data size of the compressed soft bit data SB are the same.

In the example of FIG. 34, the threshold voltage of the memory cell transistor MC is divided into 31 sections corresponding to 30 read voltages. The combination of the "hard bit data HB_T/HB_U/HB_M/HB_L" and the "compressed soft bit data SB" in each section of each state is as follows.

"S0" State (less than voltage V1L): "1111", "0"
"S1" State (voltage V1L or more and less than voltage V1H): "0111", "1"
"S1" State (voltage V1H or more and less than voltage V2L): "0111", "0"
"S2" State (voltage V2L or more and less than voltage V2H): "0011", "1"
"S2" State (voltage V2H or more and less than voltage V3L): "0011", "0"
"S3" State (voltage V3L or more and less than voltage V3H): "1011", "1"
"S3" State (voltage V3H or more and less than voltage V4L): "1011", "0"
"S4" State (voltage V4L or more and less than voltage V4H): "1001", "1"
"S4" State (voltage V4H or more and less than voltage V5L): "1001", "0"
"S5" State (voltage V5L or more and less than voltage V5H): "1000", "1"
"S5" State (voltage V5H or more and less than voltage V6L): "1000", "0"
"S6" State (voltage V6L or more and less than voltage V6H): "0000", "1"
"S6" State (voltage V6H or more and less than voltage V7L): "0000", "0"

"S7" State (voltage V7L or more and less than voltage V7H): "0001", "1"
"S7" State (voltage V7H or more and less than voltage V8L): "0001", "0"
"S8" State (voltage V8L or more and less than voltage V8H): "0101", "1"
"S8" State (voltage V8H or more and less than voltage V9L): "0101", "0"
"S9" State (voltage V9L or more and less than voltage V9H): "0100", "1"
"S9" State (voltage V9H or more and less than voltage V10L): "0100", "0"
"S10" State (voltage V10L or more and less than voltage V10H): "0110", "1"
"S10" State (voltage V10H or more and less than voltage V11L): "0110", "0"
"S11" State (voltage V11L or more and less than voltage V11H): "0010", "1"
"S11" State (voltage V11H or more and less than voltage V12L): "0010", "0"
"S12" State (voltage V12L or more and less than voltage V12H): "1010", "1"
"S12" State (voltage V12H or more and less than voltage V13L): "1010", "0"
"S13" State (voltage V13L or more and less than voltage V13H): "1110", "1"
"S13" State (voltage V13H or more and less than voltage V14L): "1110", "0"
"S14" State (voltage V14L or more and less than voltage V14H): "1100", "1"
"S14" State (voltage V14H or more and less than voltage V15L): "1100", "0"
"S15" State (voltage V15L or more and less than voltage V15H): "1101", "1"
"S15" State (voltage V15H or more and less than voltage VREAD): "1101", "0"

Method of Restoring Compressed Soft Bit

Figure 35:
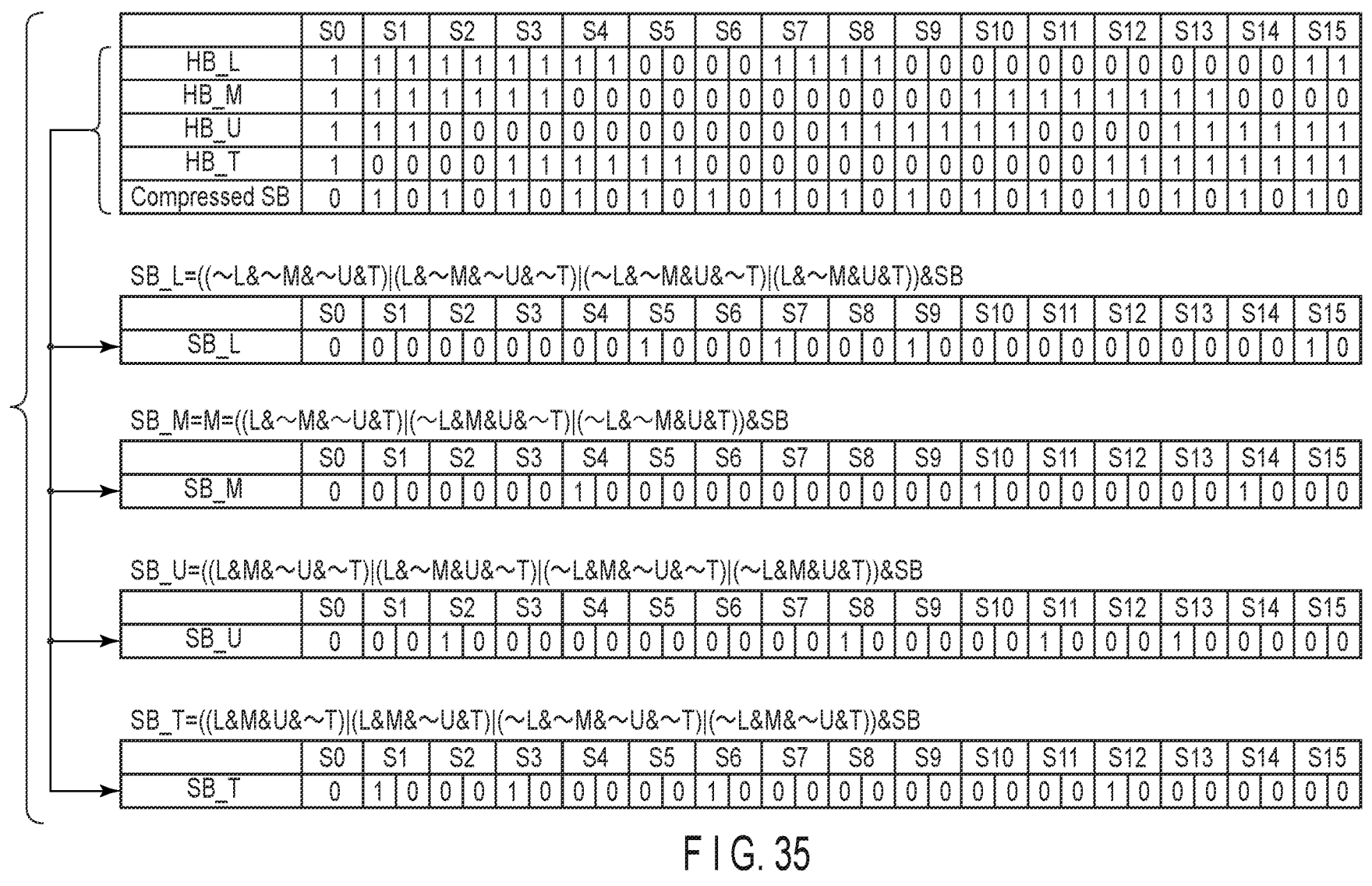

Next, a method of restoring the compressed soft bit data SB is described with reference to FIG. 35. FIG. 35 is a diagram illustrating a restoration process of the soft bit data SB_L, SB_M, SB_U, and SB_T.

Locations (states) at which the data of "1" of the soft bit data SB_L, SB_M, SB_U and SB_T can be generated are mutually exclusive. In addition, a combination of the hard bit data HB_L, HB_M, HB_U, and HB_T and a combination of the soft bit data SB_L, SB_M, SB_U, and SB_T can be defined on a one-to-one basis. By using these, the soft bit data SB of each page is restored from the hard bit data HB_L, HB_M, HB_U, and HB_T and the compressed soft bit data SB.

As illustrated in FIG. 35, the SB restoration circuit 163 receives the hard bit data HB_L, HB_M, HB_U, and HB_T and the compressed soft bit data SB from the nonvolatile memory 20. In a case of restoring the soft bit data SB_L, SB_M, SB_U, and SB_T, the SB decoder 1006 performs the following operation. In the following arithmetic expression, "|" represents an OR operation, and "~" represents inverted data. In the following arithmetic expression, the hard bit data HB_L, HB_M, HB_U, and HB_T are simply expressed as "L", "M", "U", and "T".

$$SB\_L = ((\sim L \& \sim M \& \sim U \& T) | (L \& \sim M \& \sim U \& \sim T)$$
$$| (\sim L \& \sim M \& U \& \sim T) | (L \& \sim M \& U \& T)) \& SB$$

-continued $$SB\_M = $$
$$((L \& \sim M \& \sim U \& T) | (\sim L \& M \& U \& \sim T) | (\sim L \& \sim M \& U \& T)) \& SB$$
$$SB\_U = ((L \& M \& \sim U \& \sim T)$$
$$| (L \& \sim M \& U \& \sim T) | (\sim L \& M \& \sim U \& \sim T) | (\sim L \& M \& U \& T)) \& SB$$
$$SB\_T = ((L \& M \& U \& \sim T) | (L \& M \& \sim U \& T)$$
$$| (\sim L \& \sim M \& \sim U \& \sim T) | (\sim L \& M \& \sim U \& T)) \& SB$$

The soft bit data SB_L, SB_M, SB_U, and SB_T described with reference to FIG. 35 are restored by the above arithmetic expression. Note that the arithmetic expression can be appropriately changed based on data allocation in the memory cell transistor MC.

When the nonvolatile memory 20 outputs the hard bit data HB_L, HB_M, HB_U, and HB_T and the soft bit data SB_L, SB_M, SB_U, and SB_T to the memory controller 10, the operation for restoring the soft bit data SB_L, SB_M, SB_U, and SB_T is performed by the sense amplifier 213 of the nonvolatile memory 20.

Effects According to Present Embodiment

With the configuration according to the present embodiment, the same effects as those of the first embodiment can be obtained.

The present embodiment can be combined with the second embodiment or the third embodiment.

Others

According to the above embodiment, the memory system includes a nonvolatile memory 20 including a plurality of memory cells MC each capable of storing at least a first bit (lower bit), a second bit (middle bit), and a third bit (upper bit), and a memory controller 10 that controls the nonvolatile memory. The nonvolatile memory outputs first hard bit data HB_L of the first bit, second hard bit data HB_M of the second bit, third hard bit data HB_U of the third bit, and fourth soft bit data (compressed SB) related to the first bit, the second bit, and the third bit to the memory controller with respect to the first command set received from the memory controller. The nonvolatile memory outputs the first hard bit data HB_L, the second hard bit data HB_M, the third hard bit data HB_U, the first soft bit data SB_L related to the first bit, the second soft bit data SB_M related to the second bit, and the third soft bit data SB_U related to the third bit to the memory controller with respect to the second command set received from the memory controller. In a case where transmitting the first command set to the nonvolatile memory, the memory controller performs the error correction process by using the first hard bit data, the second hard bit data, the third hard bit data, and the fourth soft bit data. In a case where transmitting the second command set to the nonvolatile memory, the memory controller performs the error correction process by using the first hard bit data, the second hard bit data, the third hard bit data, the first soft bit data, the second soft bit data, and the third soft bit data.

By applying the above embodiment, it is possible to provide a memory system capable of efficiently performing data transfer between a memory controller and a nonvolatile memory.

Note that the embodiment is not limited to the above-described embodiment, and various modifications are possible.

For example, in the third embodiment, the case where either the hard bit decoding process or the soft bit decoding process is performed based on the determination result of the number of counts is described, but the operation based on the determination result of the number of counts is not limited thereto. For example, the number of counts may be determined when the hard bit decoding process is failed. In this case, whether to perform soft bit decoding process may be determined based on the determination result.

For example, in the above embodiment, the case where the soft bit data SB of a plurality of pages of one cell unit CU is compressed into one page data is described, but the present invention is not limited thereto. For example, a plurality of items of soft bit data SB of a plurality of cell units CU may be compressed into one item of page data.

Furthermore, the "connection" in the above embodiment also includes a state in which the connection is indirectly made with, for example, a transistor or a resistor interposed therebetween.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A memory system comprising:
   a nonvolatile memory that includes a plurality of memory cells each capable of storing at least a first bit, a second bit, and a third bit; and
   a memory controller configured to control the nonvolatile memory, wherein
   the nonvolatile memory is configured to:
   output, to the memory controller, first hard bit data of the first bit, second hard bit data of the second bit, third hard bit data of the third bit, and fourth soft bit data related to the first bit, the second bit, and the third bit, in response to a first command set received from the memory controller; and
   output, to the memory controller, the first hard bit data, the second hard bit data, the third hard bit data, first soft bit data related to the first bit, second soft bit data related to the second bit, and third soft bit data related to the third bit, in response to a second command set received from the memory controller, and
   the memory controller is configured to:
   in a case where the first command set is transmitted to the nonvolatile memory, perform an error correction process by using the first hard bit data, the second hard bit data, the third hard bit data, and the fourth soft bit data; and
   in a case where the second command set is transmitted to the nonvolatile memory, perform the error correction process by using the first hard bit data, the second hard bit data, the third hard bit data, the first soft bit data, the second soft bit data, and the third soft bit data.

2. The memory system according to claim 1, wherein
   the nonvolatile memory is configured to:
   calculate the fourth soft bit data, based on a logical operation which uses the first soft bit data, the second soft bit data, and the third soft bit data;
   when outputting the first soft bit data, the second soft bit data, and the third soft bit data to the memory controller,
   restore the first soft bit data, based on the first hard bit data, the second hard bit data, the third hard bit data, and the fourth soft bit data;
   restore the second soft bit data, based on the first hard bit data, the second hard bit data, the third hard bit data, and the fourth soft bit data; and
   restore the third soft bit data, based on the first hard bit data, the second hard bit data, the third hard bit data, and the fourth soft bit data.

3. The memory system according to claim 2, wherein
   the nonvolatile memory includes a first latch circuit, a second latch circuit, a third latch circuit, and a fourth latch circuit, and
   the nonvolatile memory is configured to:
   store the first hard bit data, the second hard bit data, the third hard bit data, and the fourth soft bit data in the first latch circuit, the second latch circuit, the third latch circuit, and the fourth latch circuit, respectively;
   output the first hard bit data, the second hard bit data, and the third hard bit data to the memory controller while leaving the first hard bit data, the second hard bit data, the third hard bit data, and the fourth soft bit data in the first latch circuit, the second latch circuit, the third latch circuit, and the fourth latch circuit, respectively;
   restore the first soft bit data, based on the first hard bit data, the second hard bit data, the third hard bit data, and the fourth soft bit data stored in the first latch circuit, the second latch circuit, the third latch circuit, and the fourth latch circuit, respectively;
   restore the second soft bit data, based on the first hard bit data, the second hard bit data, the third hard bit data, and the fourth soft bit data stored in the first latch circuit, the second latch circuit, the third latch circuit, and the fourth latch circuit, respectively; and
   restore the third soft bit data, based on the first hard bit data, the second hard bit data, the third hard bit data, and the fourth soft bit data stored in the first latch circuit, the second latch circuit, the third latch circuit, and the fourth latch circuit, respectively.

4. The memory system according to claim 1, wherein
   the nonvolatile memory is configured to:
   in a case where the first command set is received from the memory controller after the first hard bit data, the second hard bit data, and the third hard bit data are output to the memory controller, output the fourth soft bit data to the memory controller; and
   in a case where the second command set is received from the memory controller after the first hard bit data, the second hard bit data, and the third hard bit data are output to the memory controller, output the first soft bit data, the second soft bit data, and the third soft bit data to the memory controller.

5. The memory system according to claim 1, wherein
   a data size of the first hard bit data, a data size of the second hard bit data, a data size of the third hard bit data, a data size of the first soft bit data, a data size of the second soft bit data, a data size of the third soft bit data, and a data size of the fourth soft bit data are a same size.

6. The memory system according to claim 1, wherein
   the nonvolatile memory is configured to:
   calculate the fourth soft bit data, based on a logical operation which uses the first soft bit data, the second soft bit data, and the third soft bit data, and
   the memory controller is configured to:
   in a case where the first command set is transmitted to the nonvolatile memory, restore the first soft bit data, based on the first hard bit data, the second hard bit data, the third hard bit data, and the fourth soft bit data;

restore the second soft bit data, based on the first hard bit data, the second hard bit data, the third hard bit data, and the fourth soft bit data; and restore the third soft bit data, based on the first hard bit data, the second hard bit data, the third hard bit data, and the fourth soft bit data.

7. The memory system according to claim 1, wherein the first bit is determined by a first read operation based on at least a first state, the first read operation includes: a second read operation using a first voltage corresponding to the first state; and a third read operation using a second voltage corresponding to the first state and higher than the first voltage, the first hard bit data is determined based on at least the second read operation, and the first soft bit data is calculated based on an operation of the first hard bit data and a result of the third read operation.

8. The memory system according to claim 7, wherein the memory controller is configured to:

in a case where the error correction process for the first hard bit data is failed, determine a shift amount with respect to each of the first voltage and the second voltage;

cause the nonvolatile memory to perform: the second read operation using the first voltage shifted by the determined shift amount; and the third read operation using the second voltage shifted by the determined shift amount.

9. The memory system according to claim 1, wherein the nonvolatile memory further includes a counter that counts the number of items of first logic level data of any one of the first soft bit data, the second soft bit data, the third soft bit data, and the fourth soft bit data, and the memory controller is configured to read the number, and read, in a case where the read number is a preset determination value or more, (i) the fourth soft bit data or (ii) the first soft bit data, the second soft bit data, and the third soft bit data from the nonvolatile memory.

10. A nonvolatile memory comprising:

a plurality of memory cells each capable of storing at least a first bit, a second bit, and a third bit;

a word line commonly connected to the plurality of memory cells;

a plurality of bit lines respectively connected to the plurality of memory cells; and a sense amplifier connected to the plurality of bit lines, wherein the sense amplifier is configured to:

generate, in response to a first command set received from a memory controller, first hard bit data of the first bit, second hard bit data of the second bit, third hard bit data of the third bit, and fourth soft bit data related to the first bit, the second bit, and the third bit; and generate, in response to a second command set received from the memory controller, the first hard bit data, the second hard bit data, the third hard bit data, first soft bit data related to the first bit, second soft bit data related to the second bit, and third soft bit data related to the third bit.

11. The nonvolatile memory according to claim 10, wherein the nonvolatile memory is configured to:

calculate the fourth soft bit data, based on an OR operation which uses the first soft bit data, the second soft bit data, and the third soft bit data;

when generating the first soft bit data, the second soft bit data, and the third soft bit data, restore the first soft bit data, based on the first hard bit data, the second hard bit data, the third hard bit data, and the fourth soft bit data;

restore the second soft bit data, based on the first hard bit data, the second hard bit data, the third hard bit data, and the fourth soft bit data; and restore the third soft bit data, based on the first hard bit data, the second hard bit data, the third hard bit data, and the fourth soft bit data.

12. The nonvolatile memory according to claim 11, wherein the sense amplifier includes a first latch circuit, a second latch circuit, a third latch circuit, and a fourth latch circuit, and the sense amplifier is configured to:

store the first hard bit data, the second hard bit data, the third hard bit data, and the fourth soft bit data in the first latch circuit, the second latch circuit, the third latch circuit, and the fourth latch circuit, respectively;

output, to the memory controller, the first hard bit data, the second hard bit data, and the third hard bit data while leaving the first hard bit data, the second hard bit data, the third hard bit data, and the fourth soft bit data in the first latch circuit, the second latch circuit, the third latch circuit, and the fourth latch circuit, respectively;

restore the first soft bit data, based on the first hard bit data, the second hard bit data, the third hard bit data, and the fourth soft bit data stored in the first latch circuit, the second latch circuit, the third latch circuit, and the fourth latch circuit, respectively;

restore the second soft bit data, based on the first hard bit data, the second hard bit data, the third hard bit data, and the fourth soft bit data stored in the first latch circuit, the second latch circuit, the third latch circuit, and the fourth latch circuit, respectively; and restore the third soft bit data, based on the first hard bit data, the second hard bit data, the third hard bit data, and the fourth soft bit data stored in the first latch circuit, the second latch circuit, the third latch circuit, and the fourth latch circuit, respectively.

13. The nonvolatile memory according to claim 10, wherein the nonvolatile memory is configured to:

in a case where the first command set is received from the memory controller after the first hard bit data, the second hard bit data, and the third hard bit data are output to the memory controller, output the fourth soft bit data to the memory controller; and in a case where the second command set is received from the memory controller after the first hard bit data, the second hard bit data, and the third hard bit data are output to the memory controller, output the first soft bit data, the second soft bit data, and the third soft bit data to the memory controller.

14. The nonvolatile memory according to claim 10, wherein a data size of the first hard bit data, a data size of the second hard bit data, a data size of the third hard bit data, a data size of the first soft bit data, a data size of the second soft bit data, a data size of the third soft bit data, and a data size of the fourth soft bit data are a same size.

15. The nonvolatile memory according to claim 10, wherein
   the first bit is determined by a first read operation based on at least a first state,
   the first read operation includes: a second read operation using a first voltage corresponding to the first state; and a third read operation using a second voltage corresponding to the first state and higher than the first voltage,
   the first hard bit data is determined based on at least the second read operation, and
   the first soft bit data is calculated based on an operation of the first hard bit data and a result of the third read operation.

* * * * *